United States Patent
Manfrini et al.

(10) Patent No.: US 12,402,355 B2
(45) Date of Patent: Aug. 26, 2025

(54) ACCESS TRANSISTOR INCLUDING A METAL OXIDE BARRIER LAYER AND METHODS FOR FORMING THE SAME

(71) Applicant: Taiwan Semiconductor Manufacturing Company Limited, Hsinchu (TW)

(72) Inventors: Mauricio Manfrini, Zhubei (TW); Marcus Johannes Henricus Van Dal, Linden (BE); Georgios Vellianitis, Heverlee (BE); Gerben Doornbos, Kessel-Lo (BE)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 108 days.

(21) Appl. No.: 18/359,960

(22) Filed: Jul. 27, 2023

(65) Prior Publication Data
US 2023/0369440 A1 Nov. 16, 2023

Related U.S. Application Data

(62) Division of application No. 17/485,848, filed on Sep. 27, 2021.
(Continued)

(51) Int. Cl.
*H10D 30/67* (2025.01)
*H01L 21/02* (2006.01)
(Continued)

(52) U.S. Cl.
CPC ... *H10D 30/6739* (2025.01); *H01L 21/02565* (2013.01); *H01L 21/443* (2013.01);
(Continued)

(58) Field of Classification Search
CPC ............... H10D 99/00; H10D 30/6739; H10D 30/6713; H10D 30/6755; H10D 30/673
See application file for complete search history.

(56) References Cited

U.S. PATENT DOCUMENTS

2015/0187814 A1* 7/2015 Miyairi ............. H10D 30/6704
257/43
2018/0076238 A1* 3/2018 Lim ....................... H10D 30/68
(Continued)

FOREIGN PATENT DOCUMENTS

CN 105206677 A 12/2015
JP 201987713 A 11/2020
(Continued)

OTHER PUBLICATIONS

Korean Patent and Trademark Office; KR Application No. 10-2022-0021358; second Office Action dated Jan. 21, 2025; 8 pages.
(Continued)

*Primary Examiner* — Vincent Wall
(74) *Attorney, Agent, or Firm* — The Marbury Law Group, PLLC

(57) ABSTRACT

A transistor may be provided by forming, in a forward order or in a reverse order, a gate electrode, a metal oxide liner, a gate dielectric, and an active layer over a substrate, and by forming a source electrode and a drain electrode on end portions of the active layer. The metal oxide liner comprises a thin semiconducting metal oxide material that functions as a hydrogen barrier material.

20 Claims, 49 Drawing Sheets

Related U.S. Application Data

(60) Provisional application No. 63/189,945, filed on May 18, 2021.

(51) Int. Cl.
  *H01L 21/443* (2006.01)
  *H10B 53/30* (2023.01)
  *H10B 61/00* (2023.01)
  *H10B 63/00* (2023.01)
  *H10D 99/00* (2025.01)

(52) U.S. Cl.
  CPC .............. *H10B 53/30* (2023.02); *H10B 61/22* (2023.02); *H10B 63/30* (2023.02); *H10D 30/6755* (2025.01); *H10D 99/00* (2025.01)

(56) References Cited

U.S. PATENT DOCUMENTS

| | | | |
|---|---|---|---|
| 2018/0212062 A1* | 7/2018 | Xie | H10D 30/6723 |
| 2020/0212185 A1 | 7/2020 | Yamazaki et al. | |
| 2023/0369440 A1* | 11/2023 | Manfrini | H10D 99/00 |

FOREIGN PATENT DOCUMENTS

| | | |
|---|---|---|
| KR | 20160102295 A | 8/2016 |
| TW | I677015 B2 | 11/2019 |
| TW | 202013503 A | 4/2020 |
| TW | 202029457 A | 8/2020 |
| TW | 202114064 A | 4/2021 |
| WO | 2017151148 A1 | 9/2017 |

OTHER PUBLICATIONS

Korean Patent and Trademark Office; KR Application No. 10-2022-0021358; Office Action dated May 29, 2024; 14 pages.

Taiwan Patent Office—Jianq Chyun Intellectual Property Office; Application No. 111102299; Office Action dated Apr. 27, 2023; 6 pages.

German Patent and Trademark Office; DE Application No. 102022100084.2; First Examination Report dated Aug. 21, 2024; 10 pages.

* cited by examiner

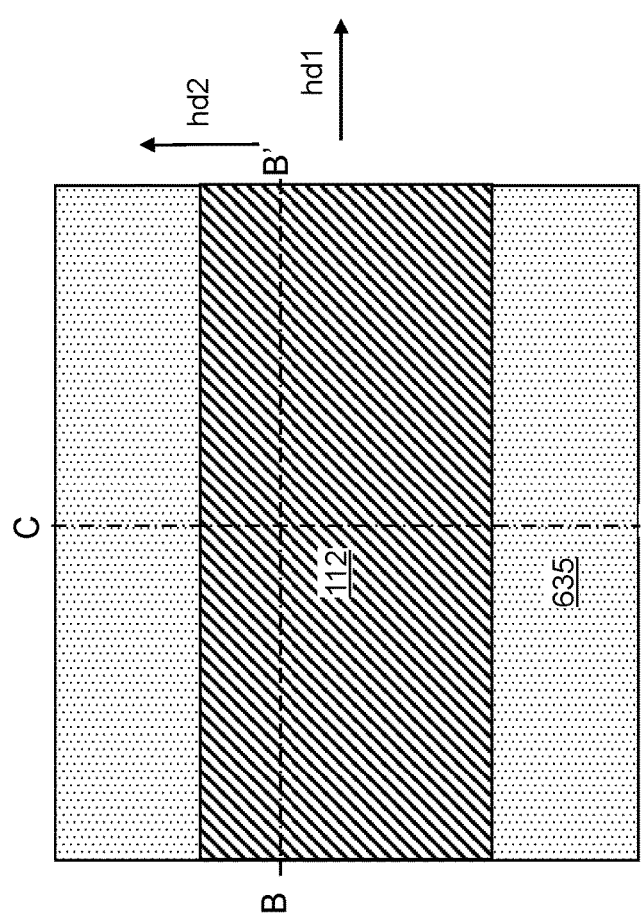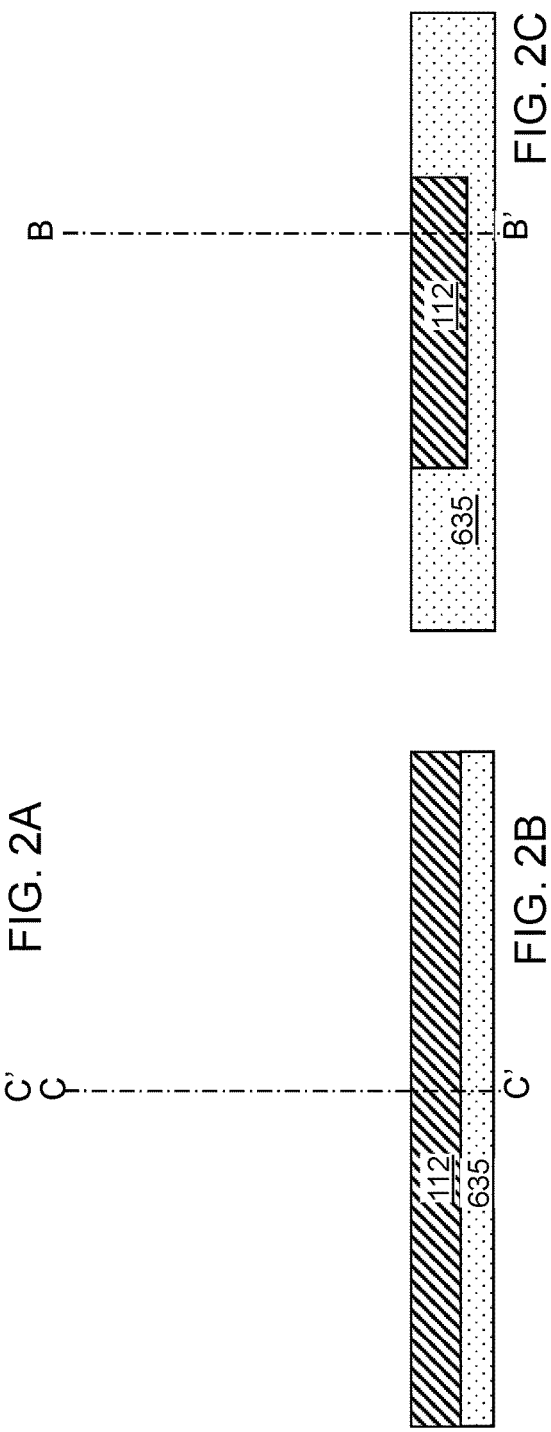

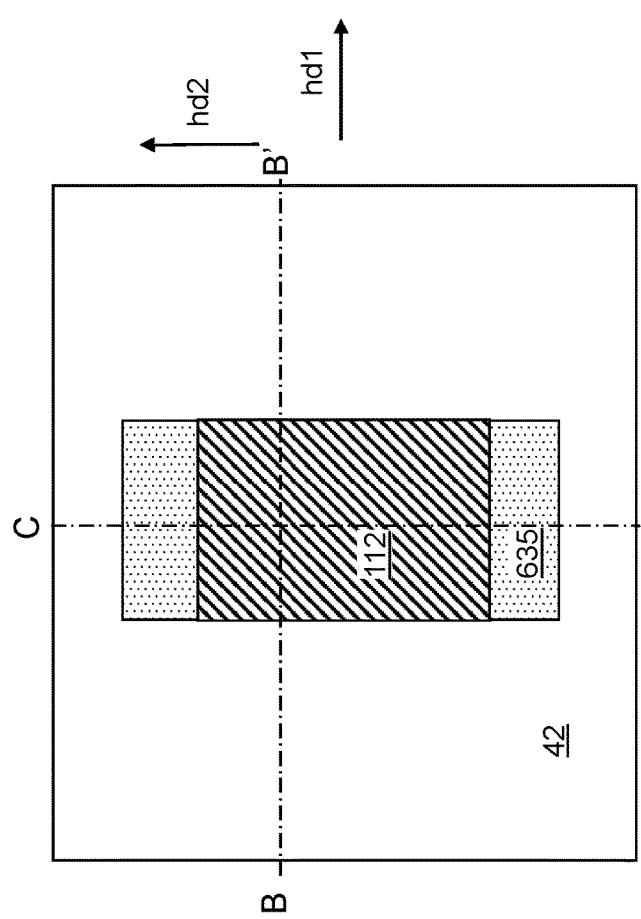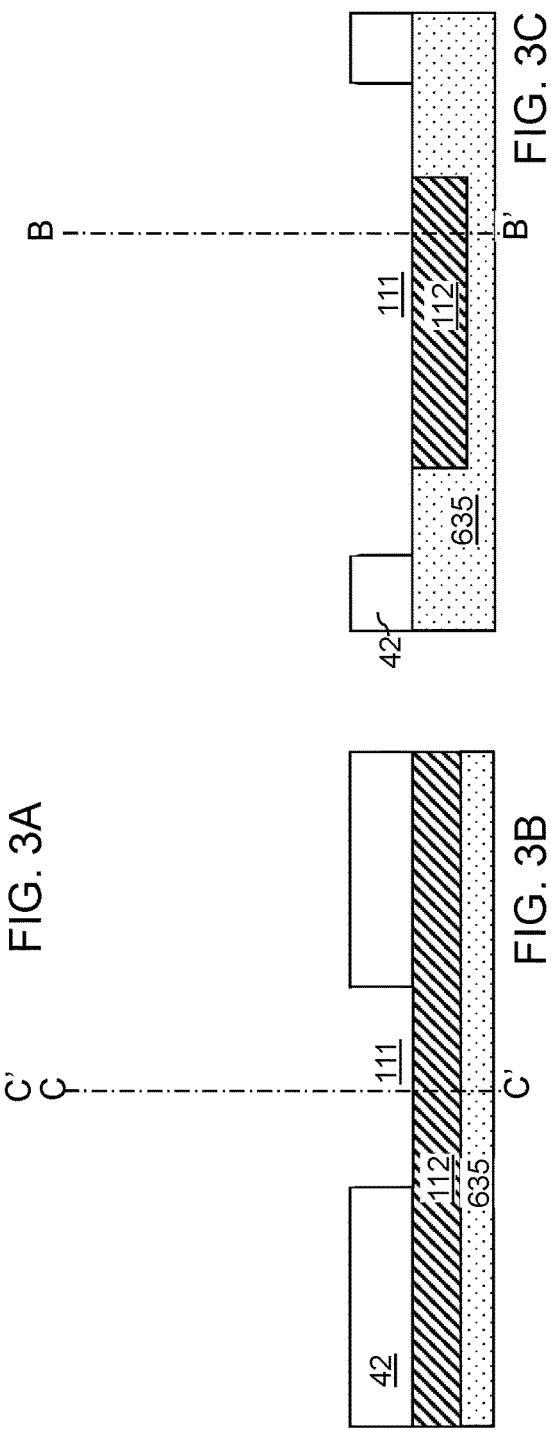

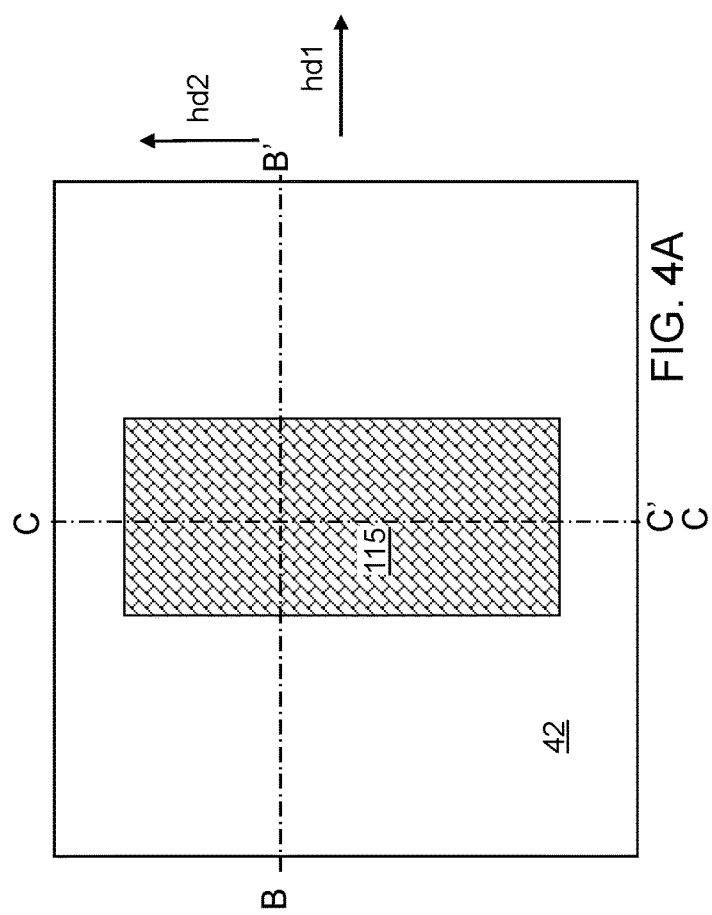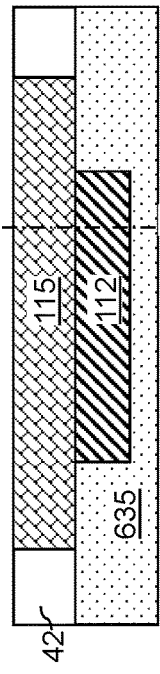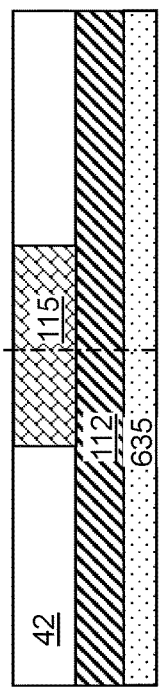

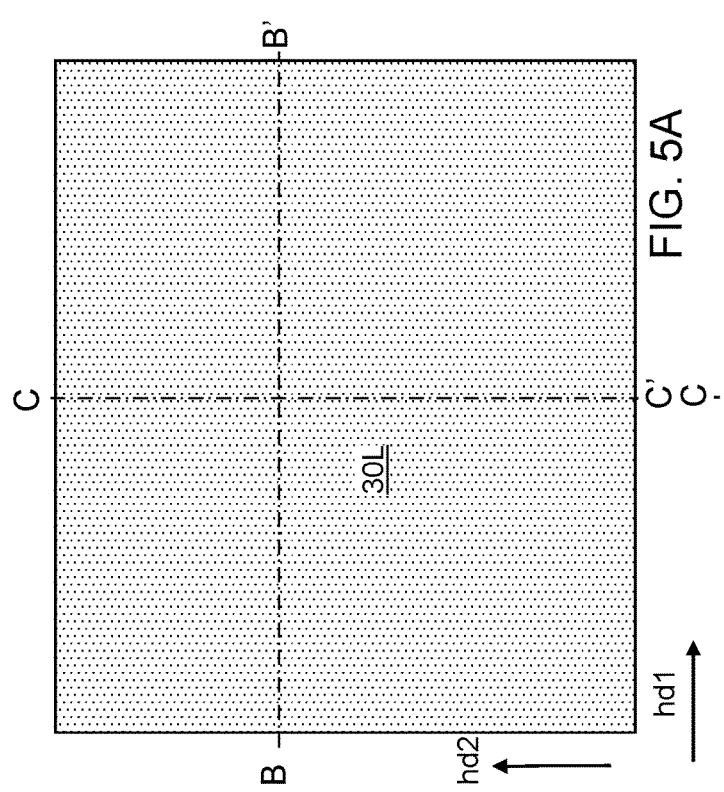
FIG. 5A
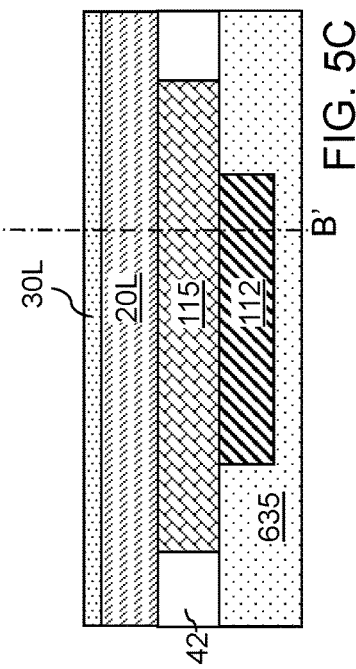
FIG. 5B
FIG. 5C

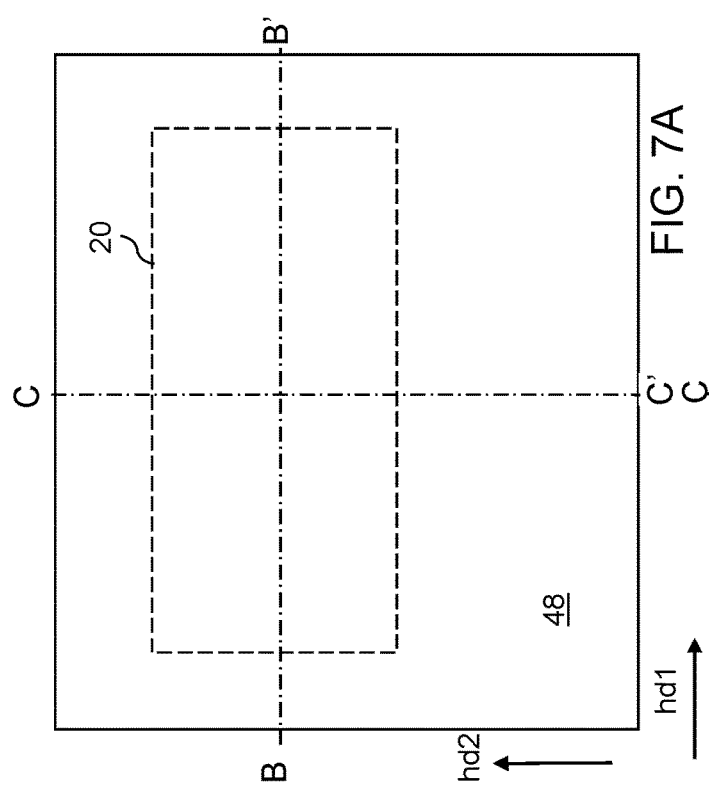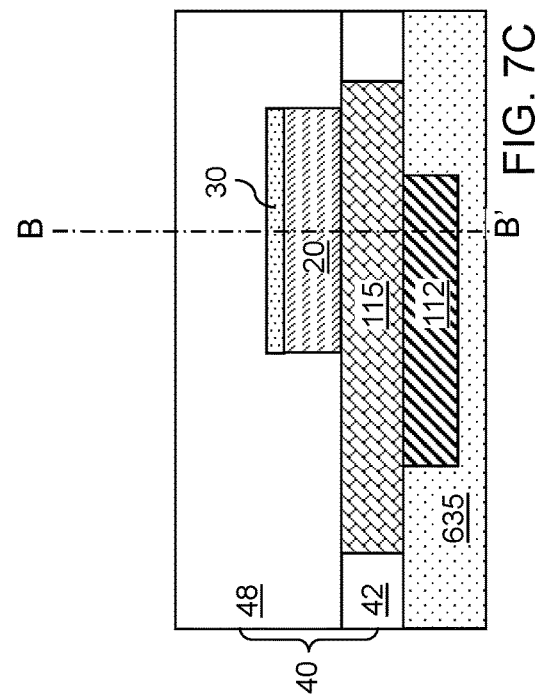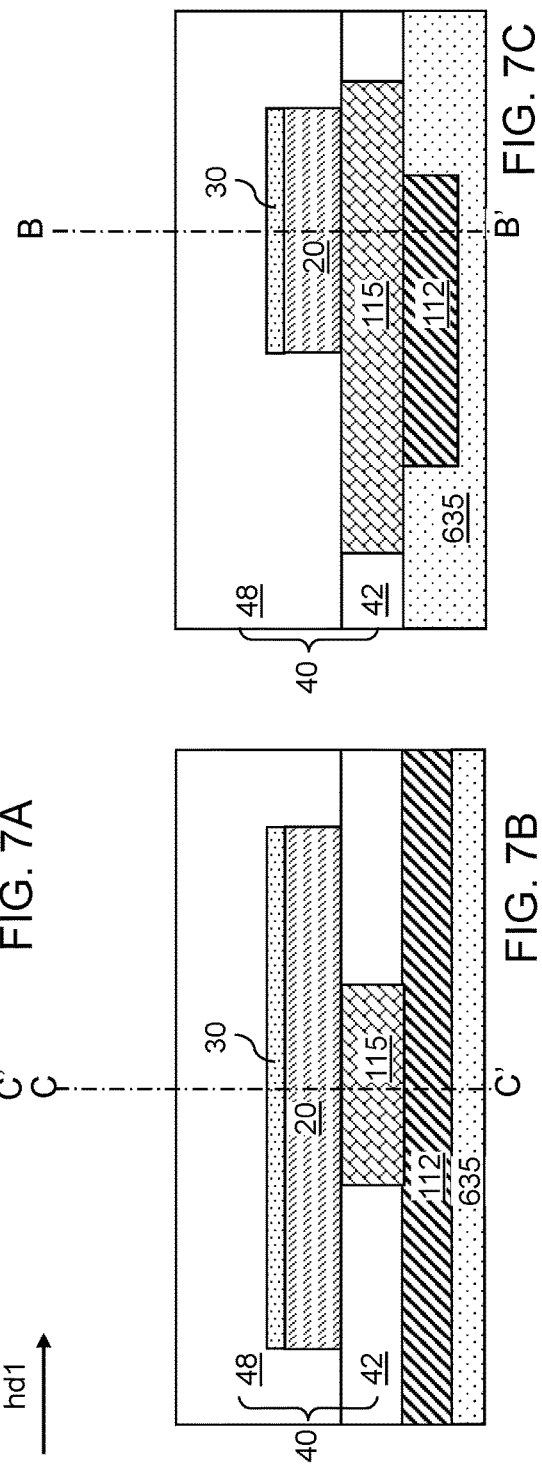

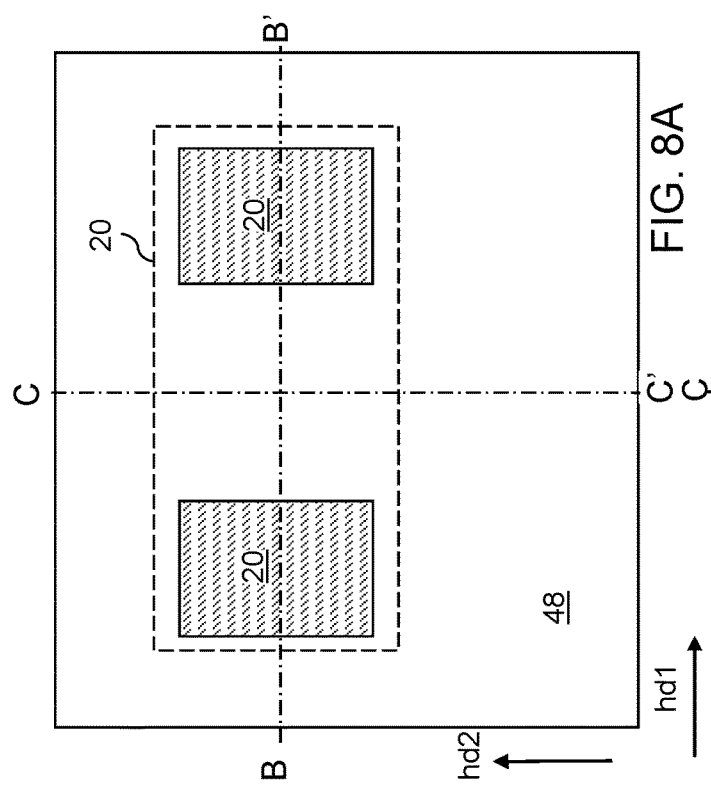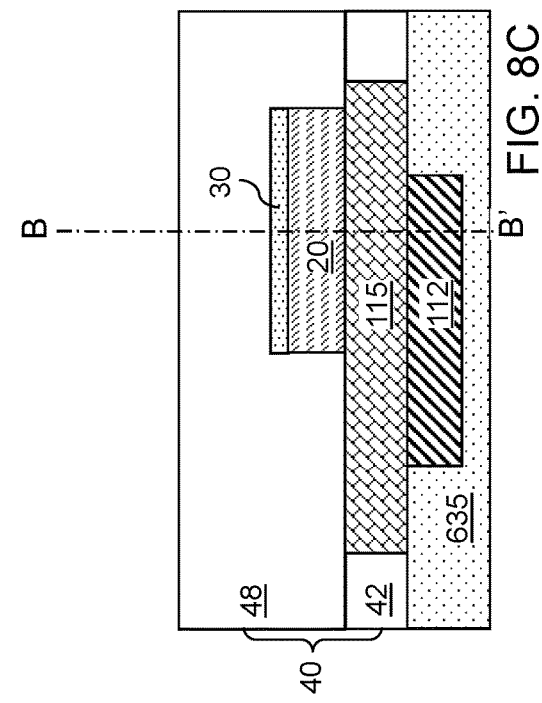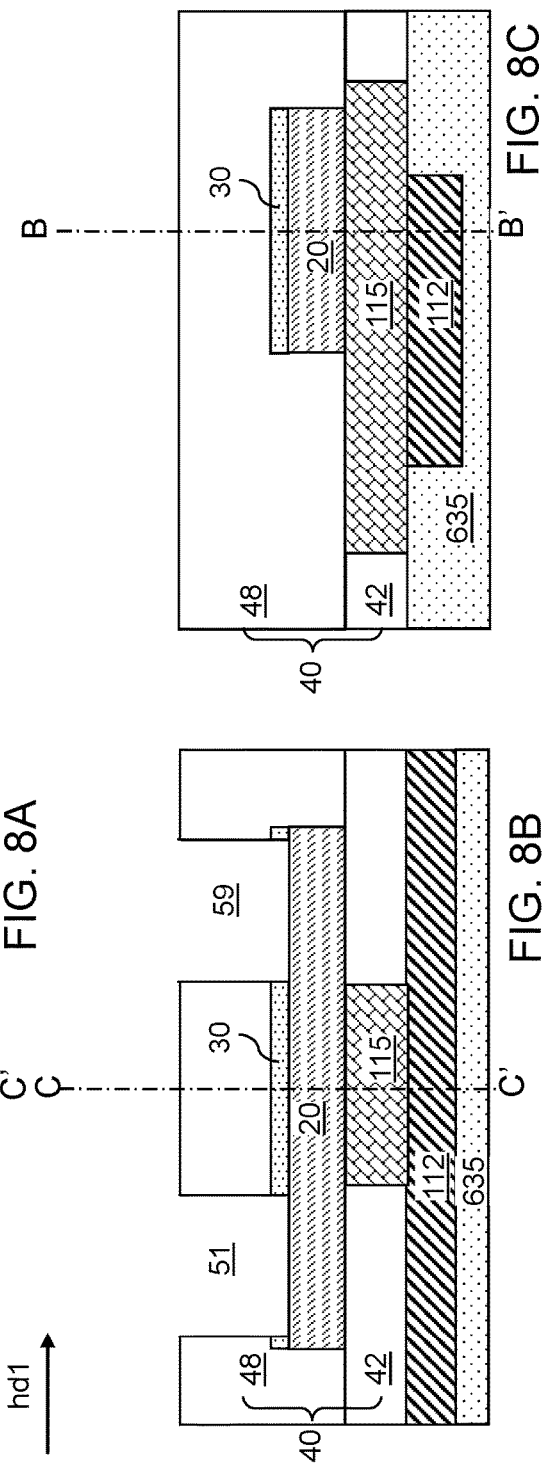

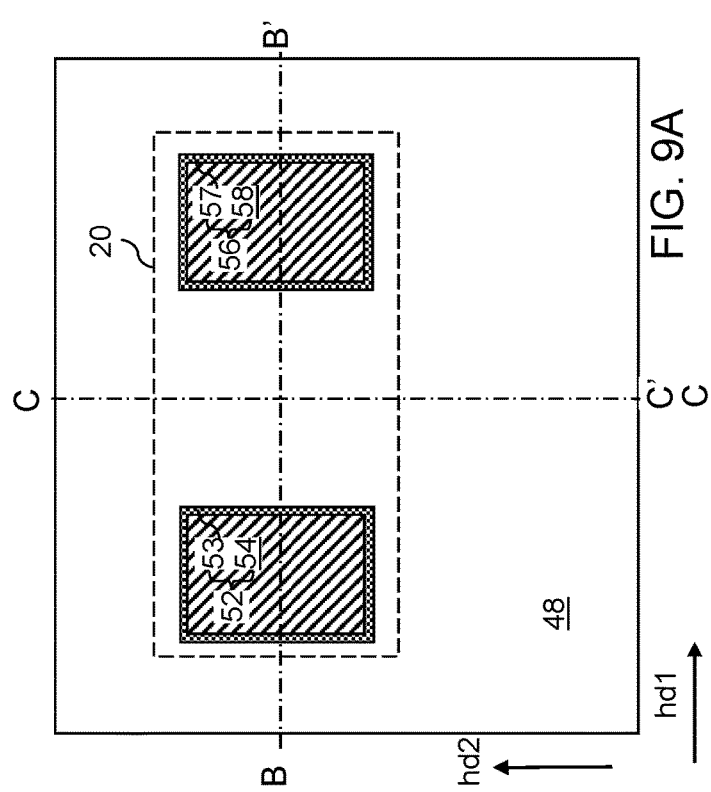
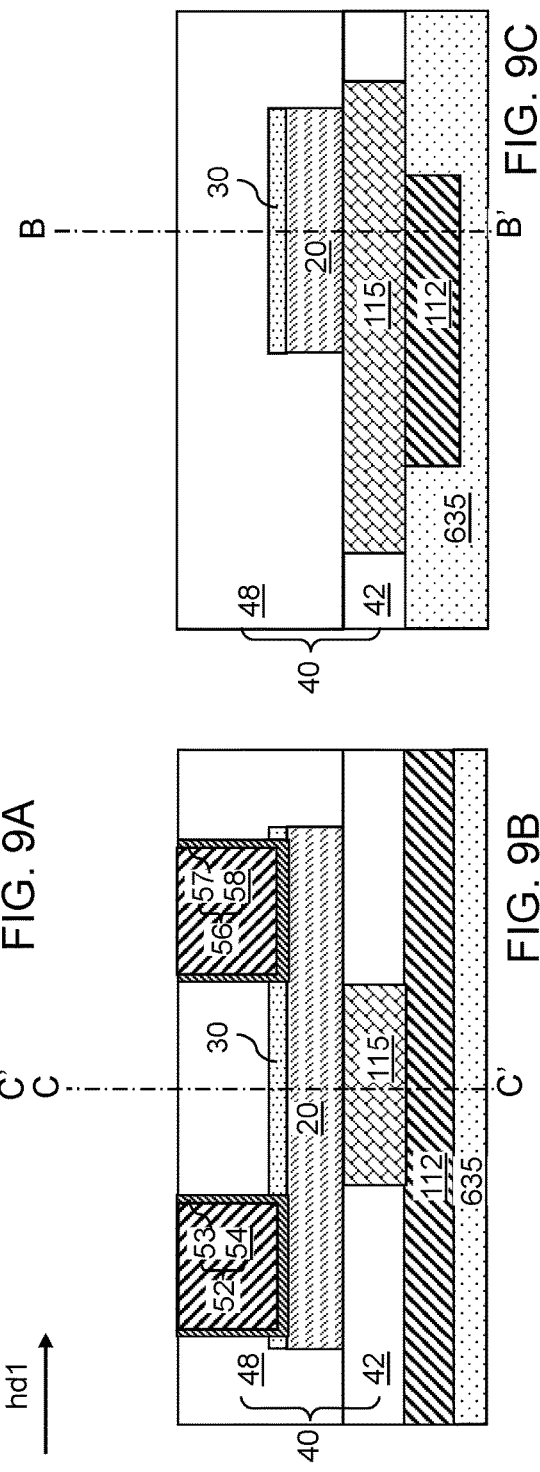
FIG. 9A
FIG. 9B
FIG. 9C

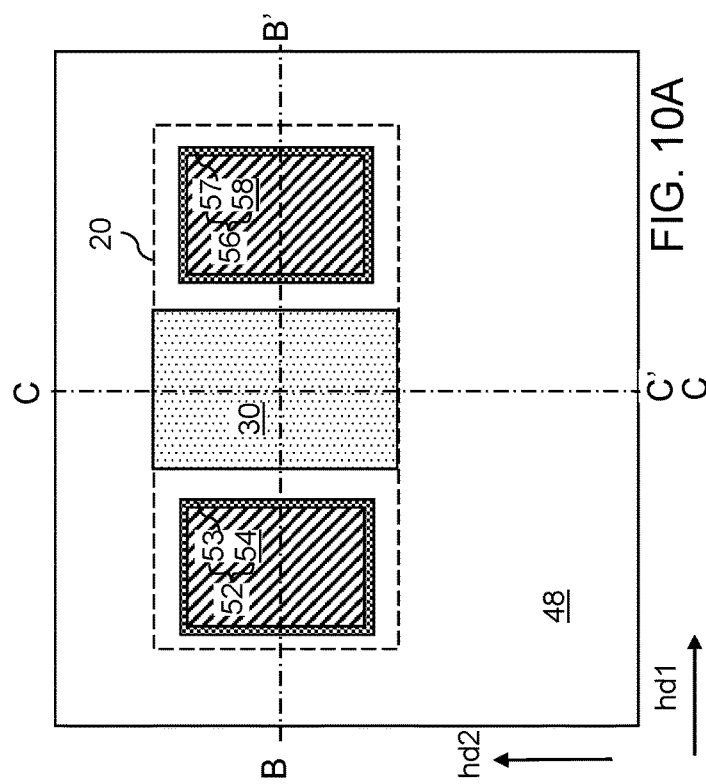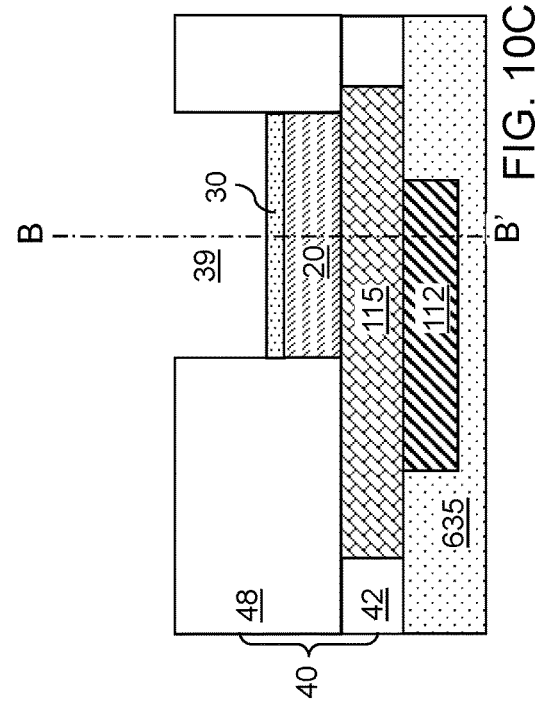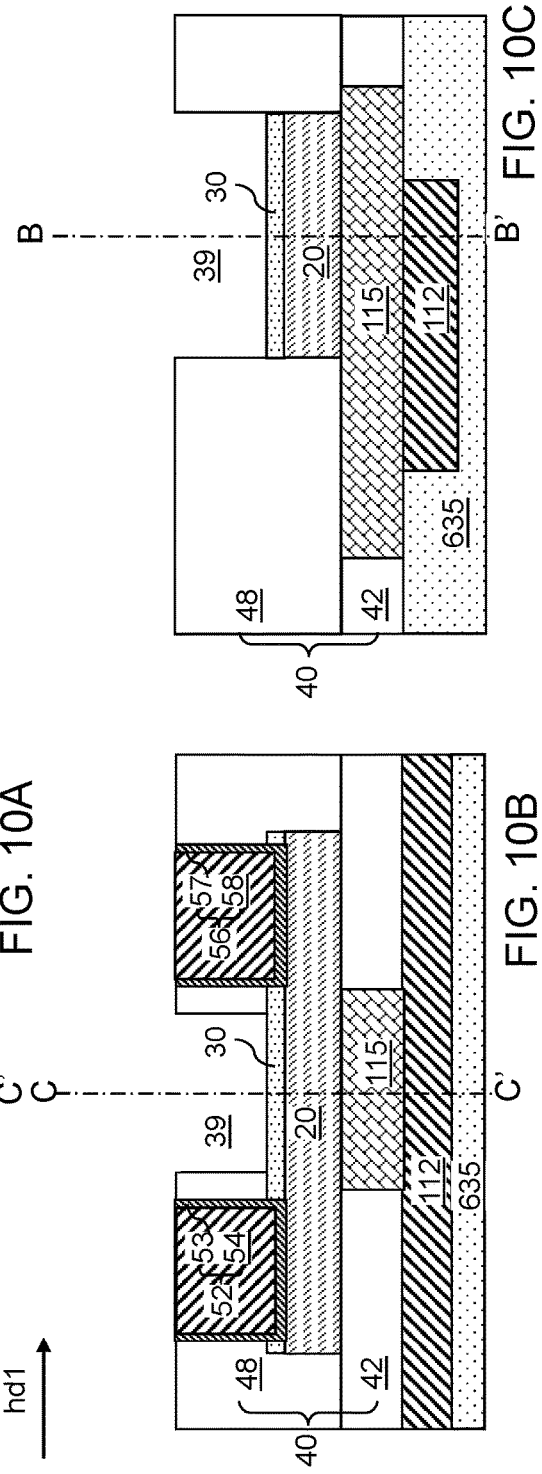

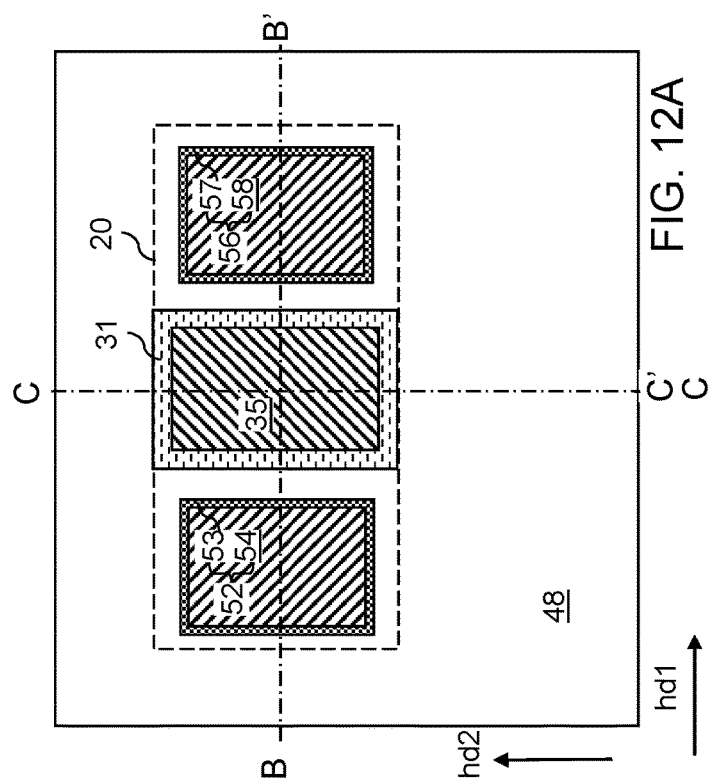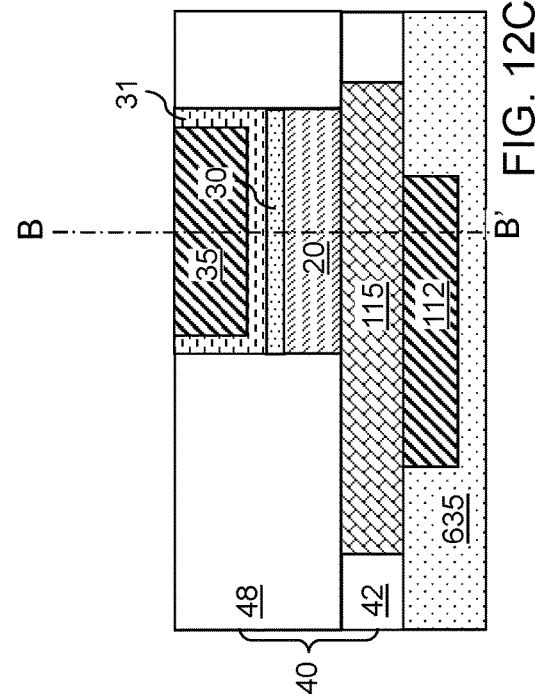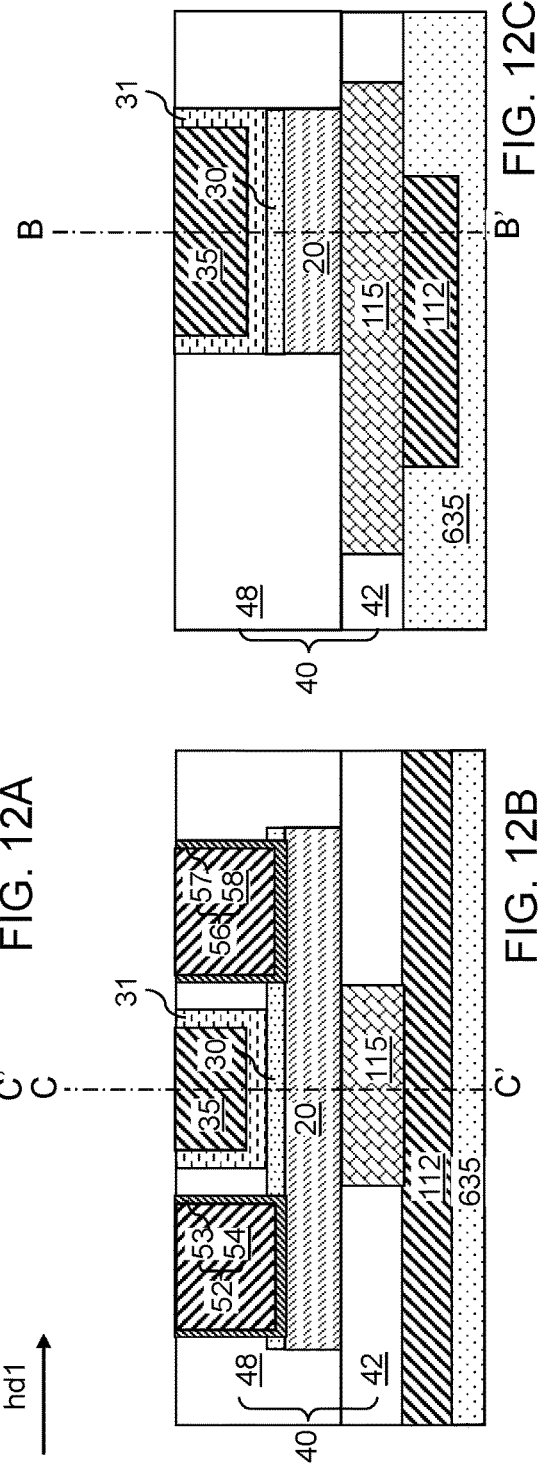

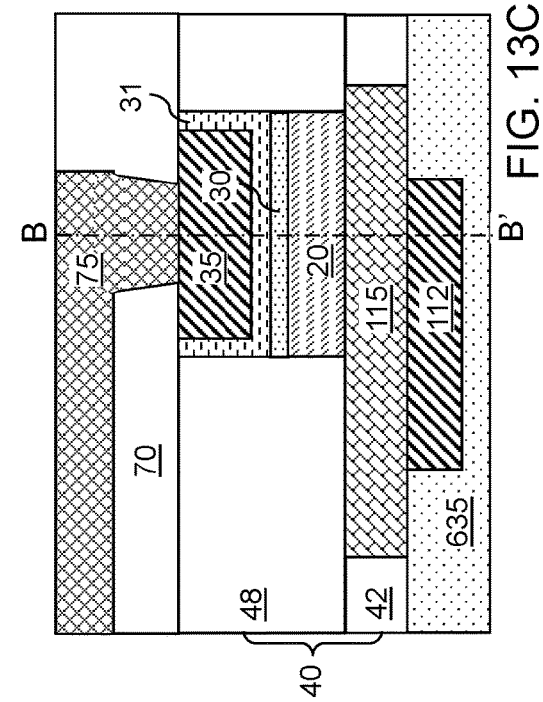
FIG. 13C
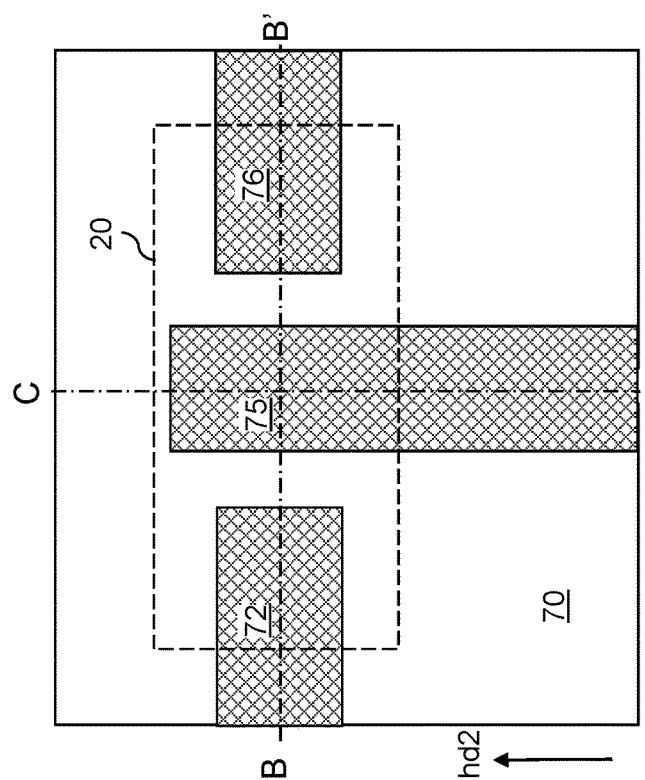
FIG. 13A
FIG. 13B

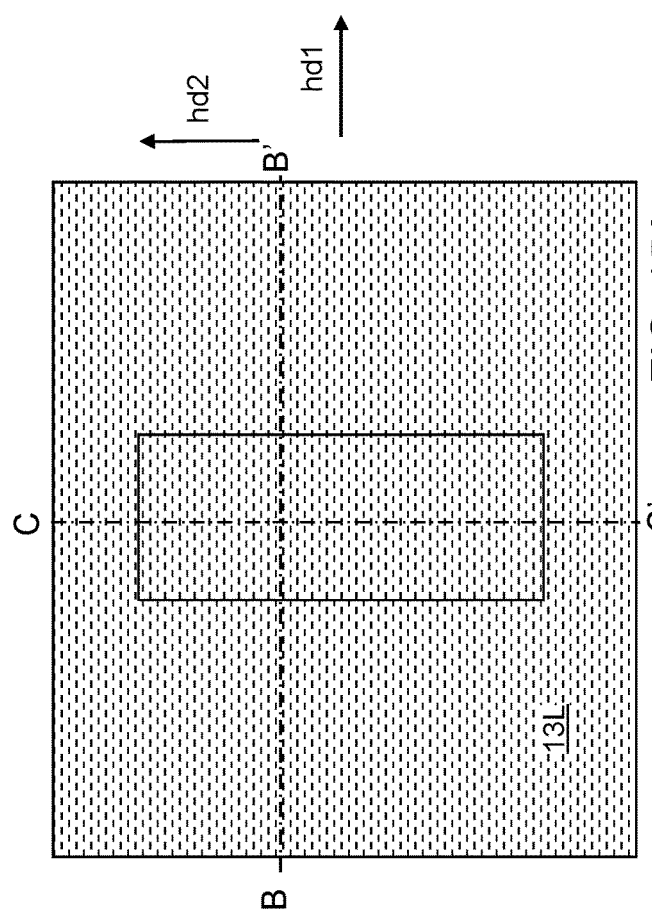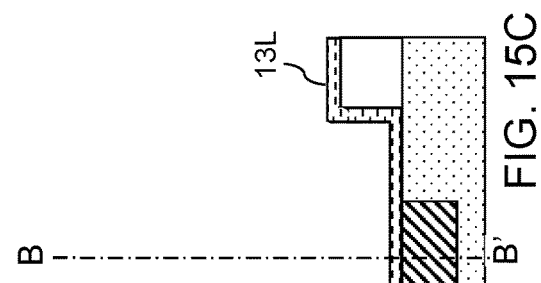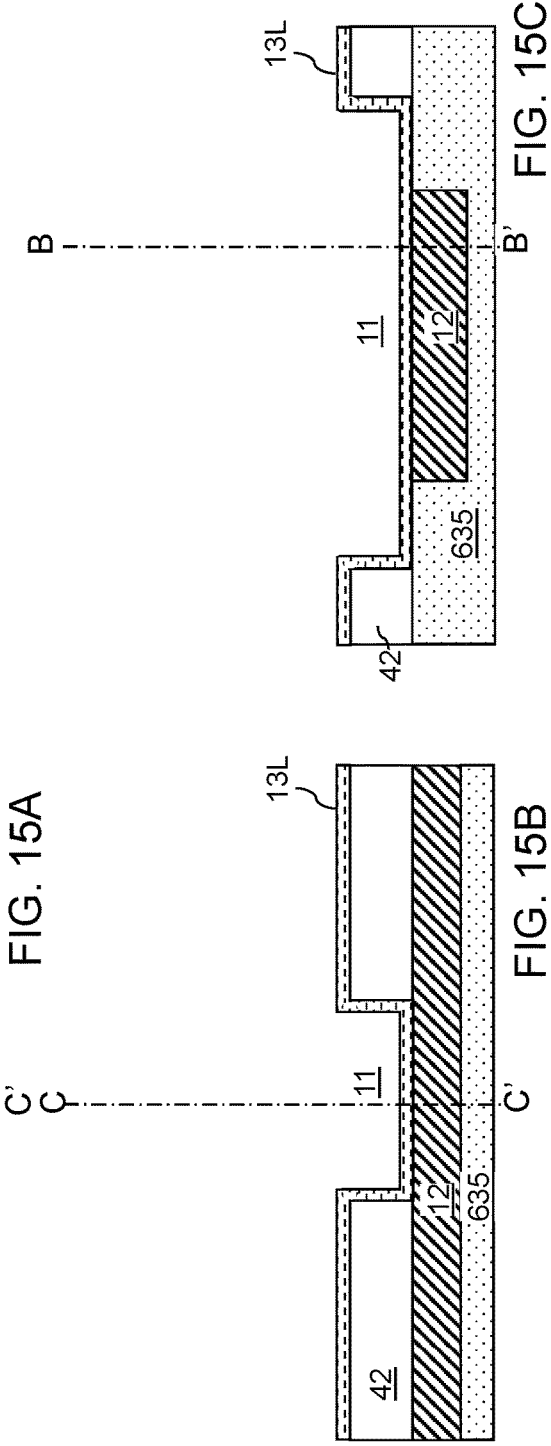

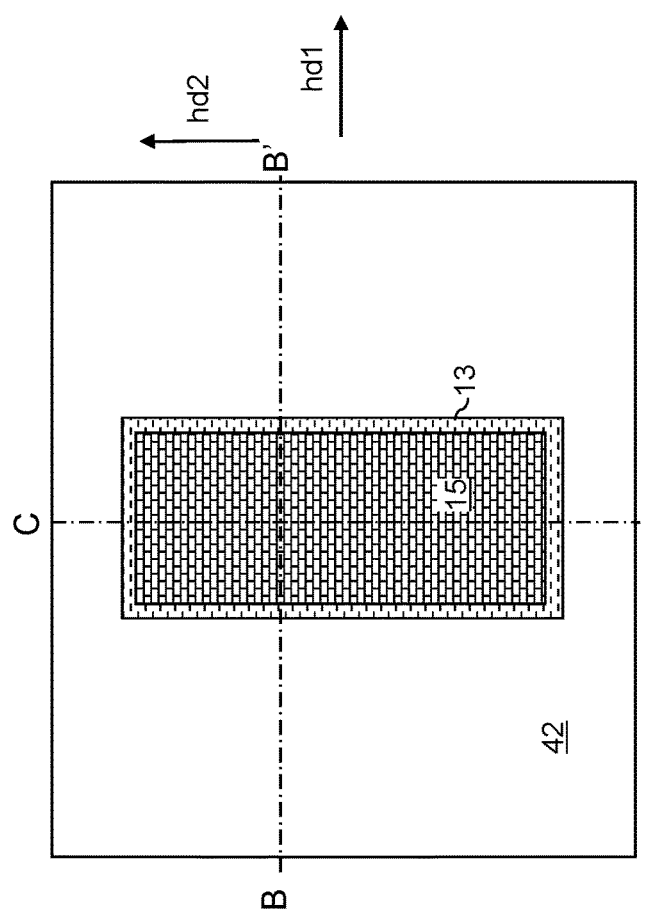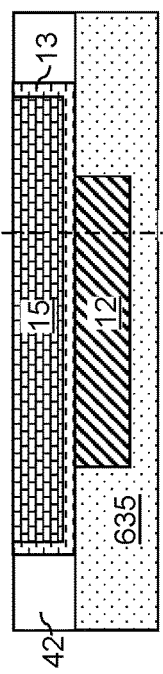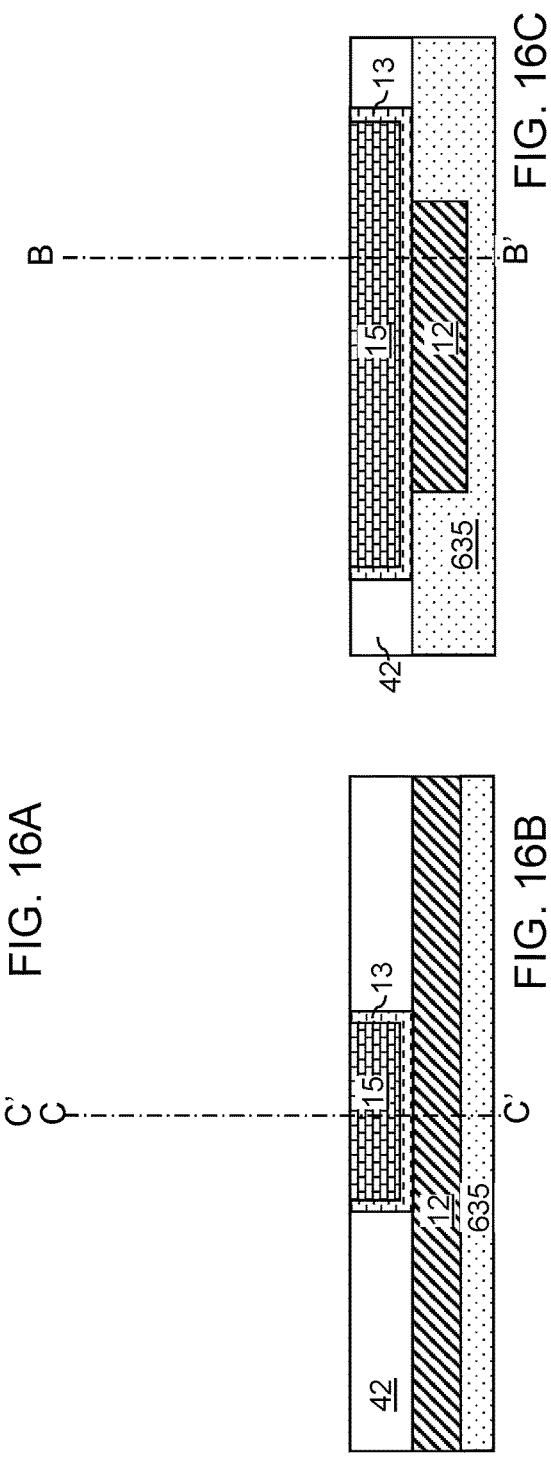

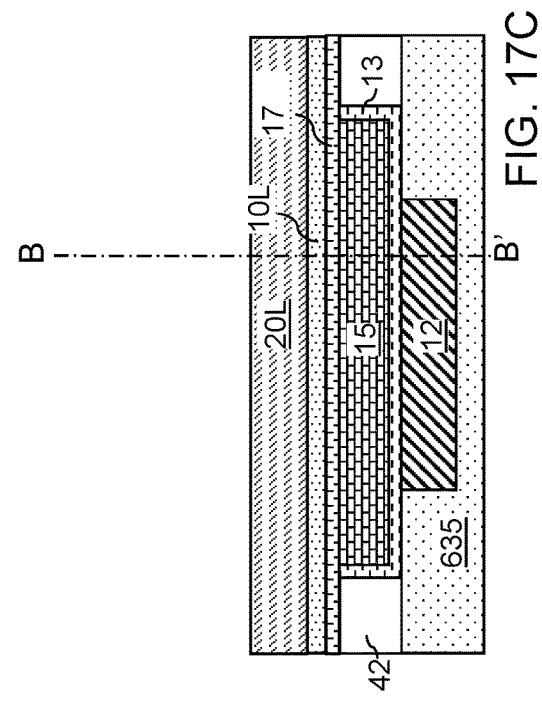
FIG. 17C
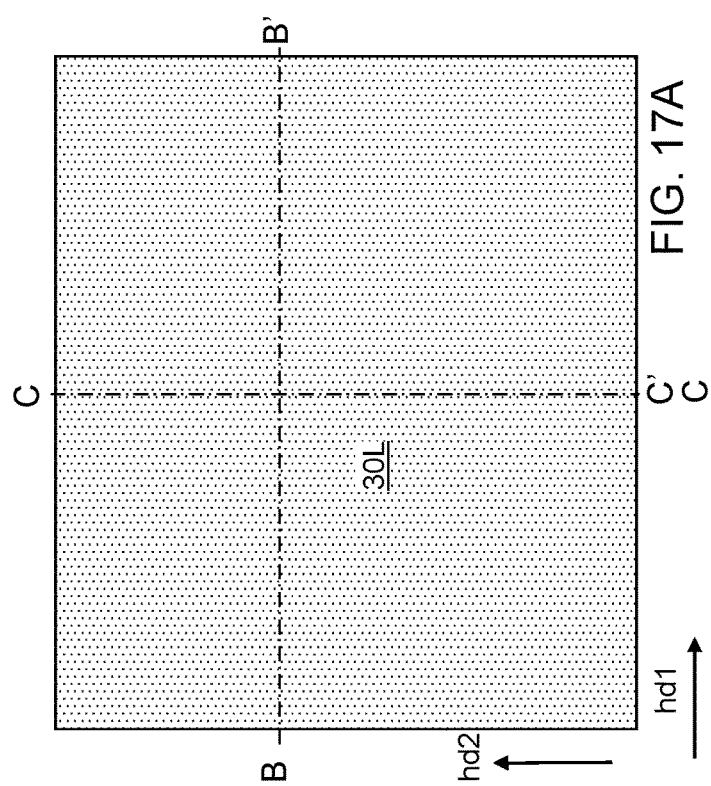
FIG. 17A
FIG. 17B

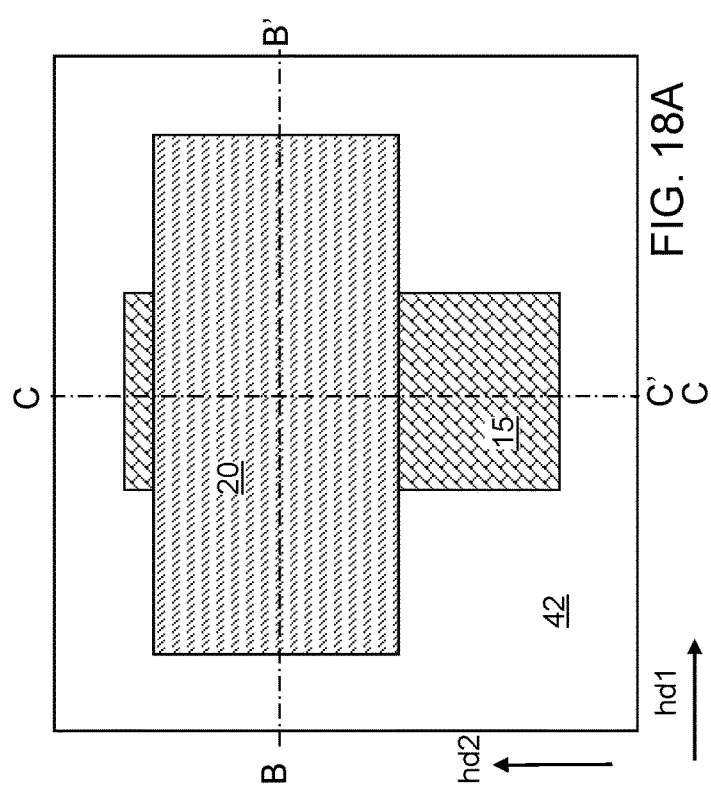
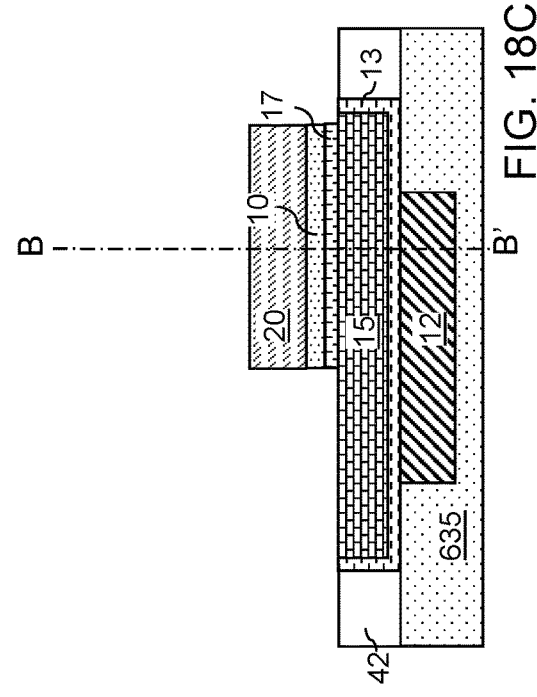
FIG. 18A  FIG. 18B  FIG. 18C

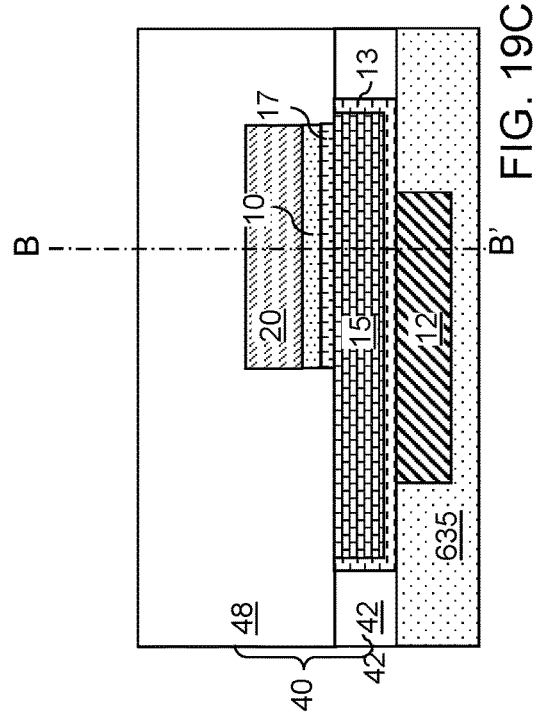
FIG. 19C
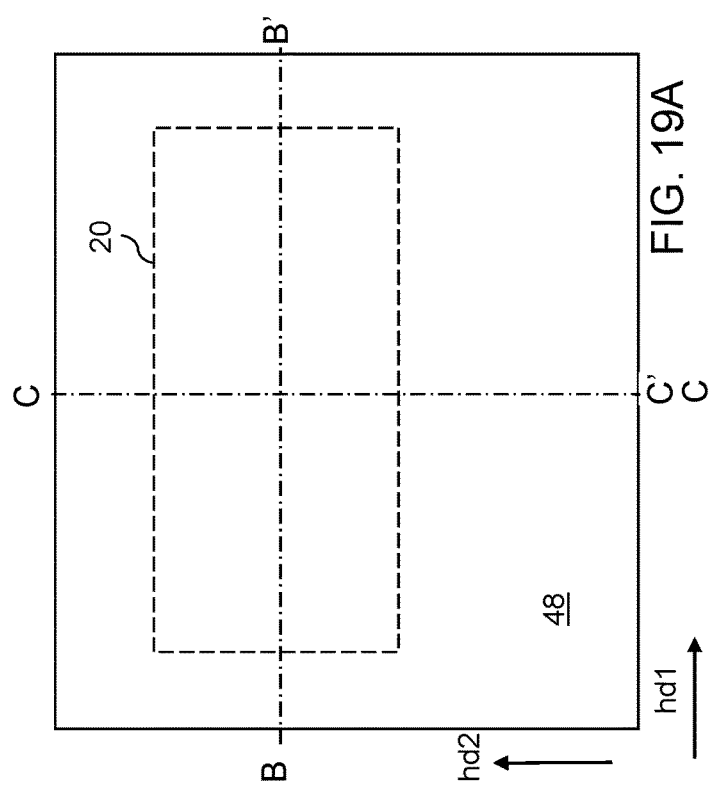
FIG. 19A
FIG. 19B

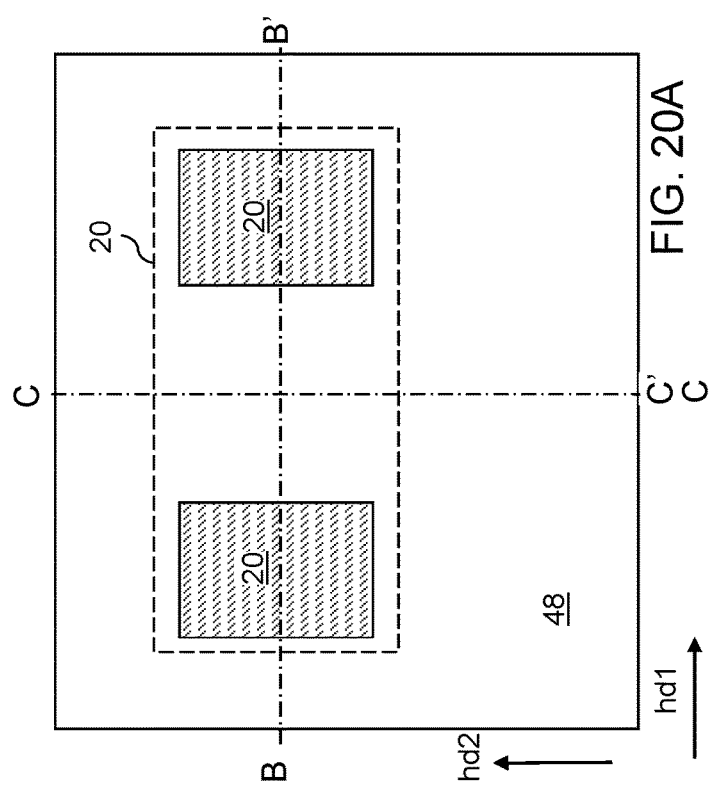
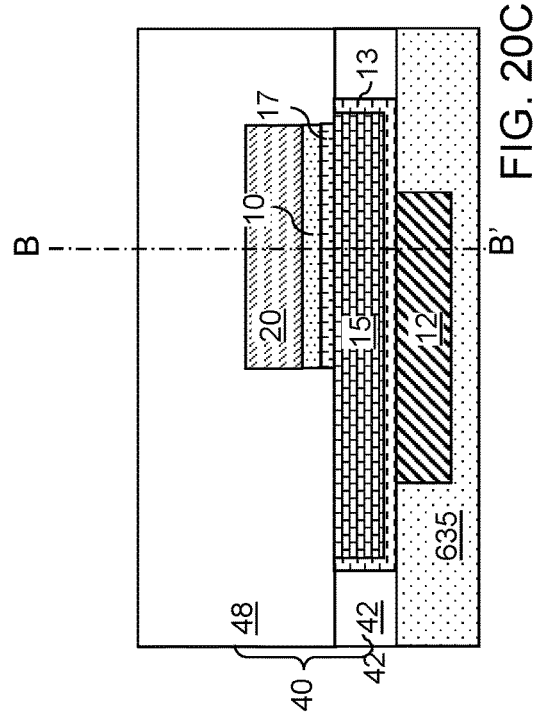
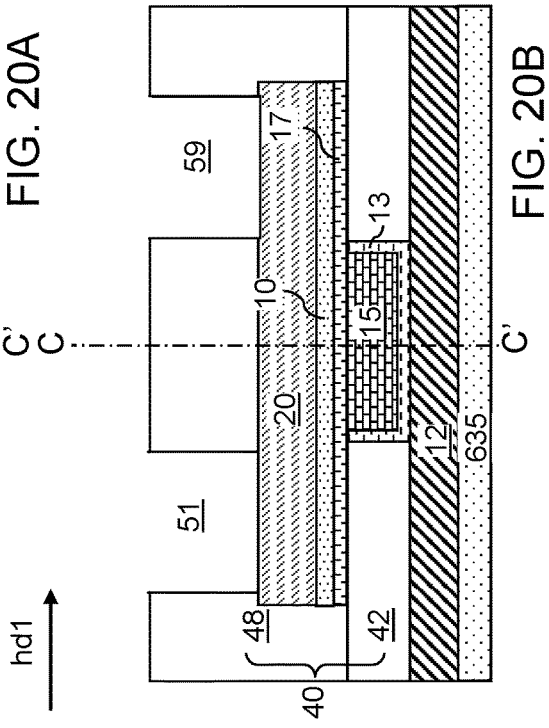
FIG. 20A
FIG. 20B
FIG. 20C

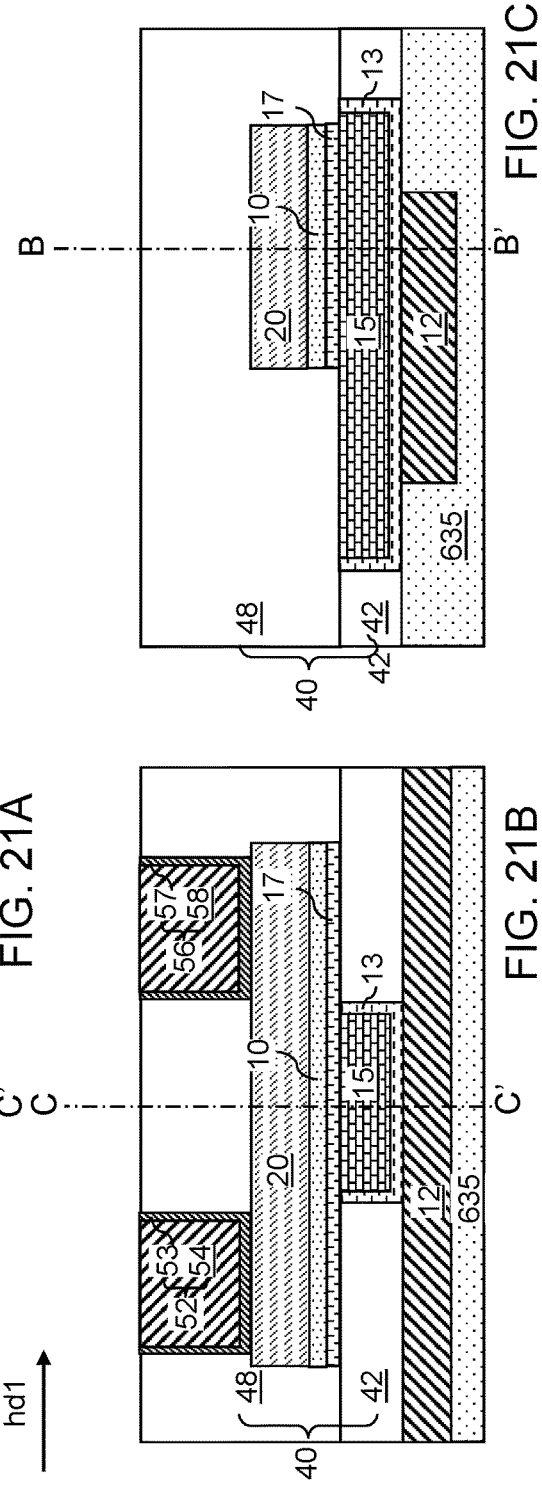
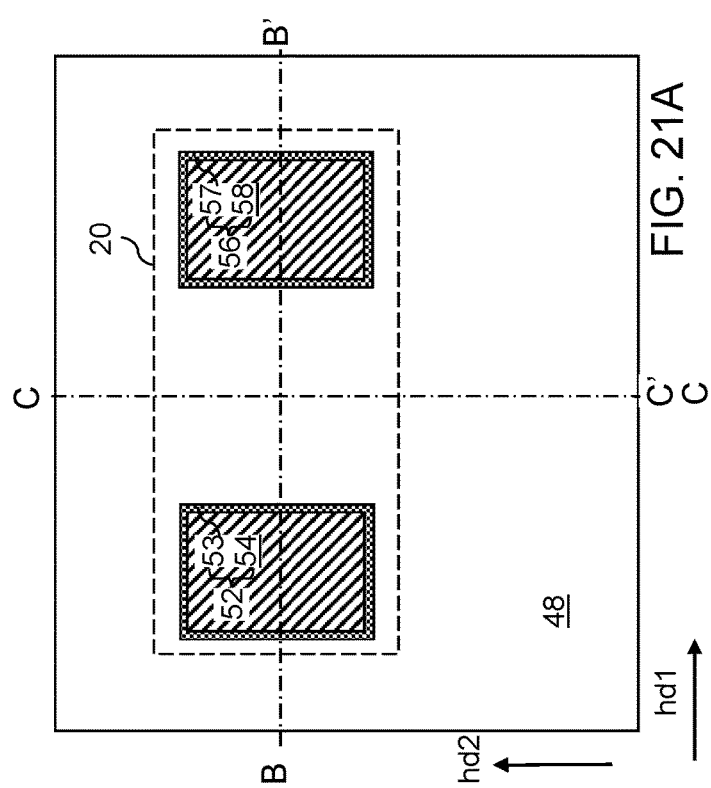

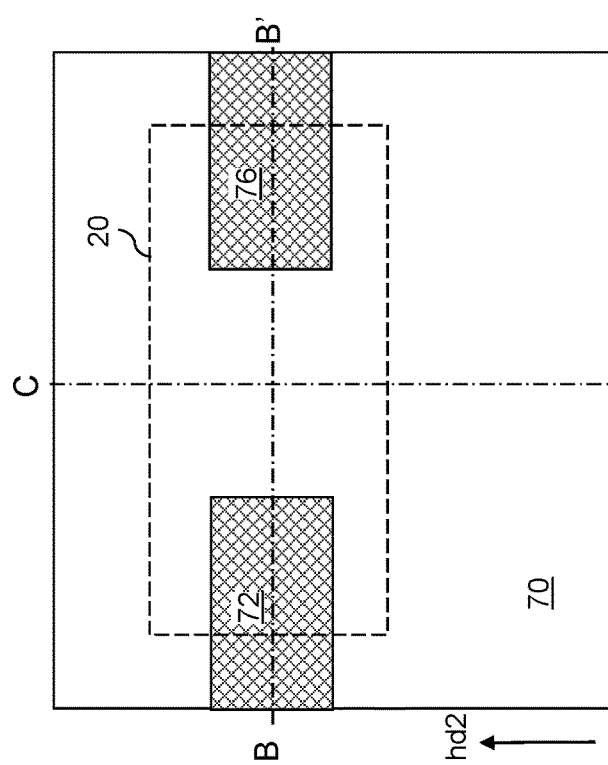
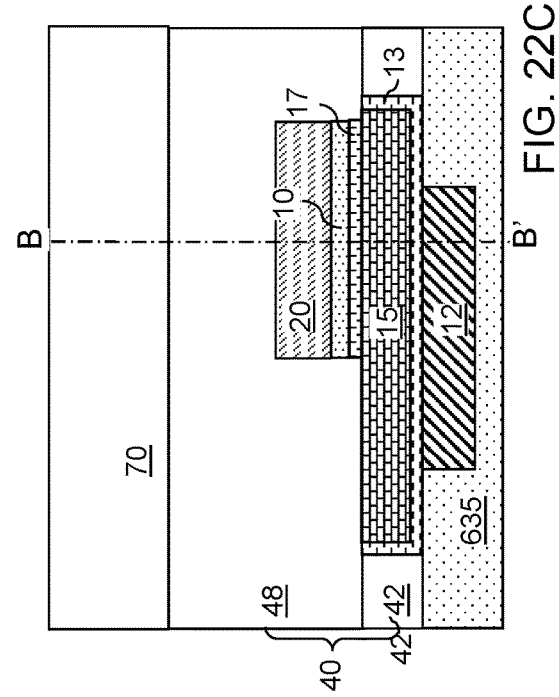
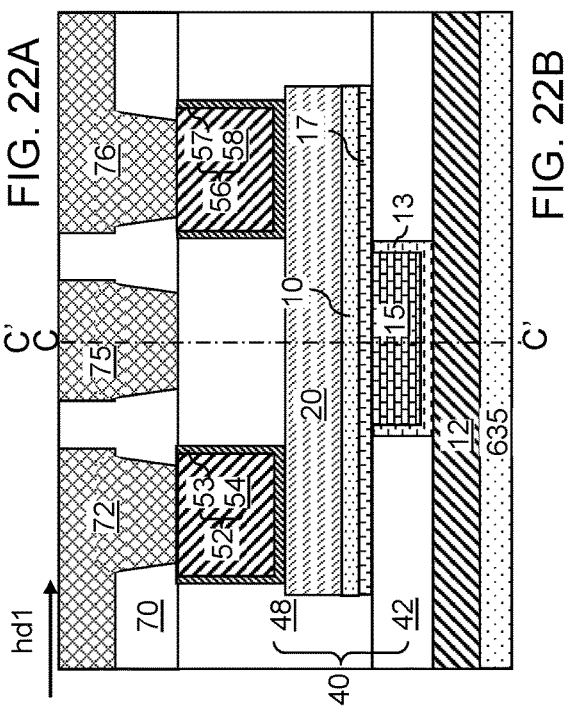
FIG. 22A
FIG. 22B
FIG. 22C

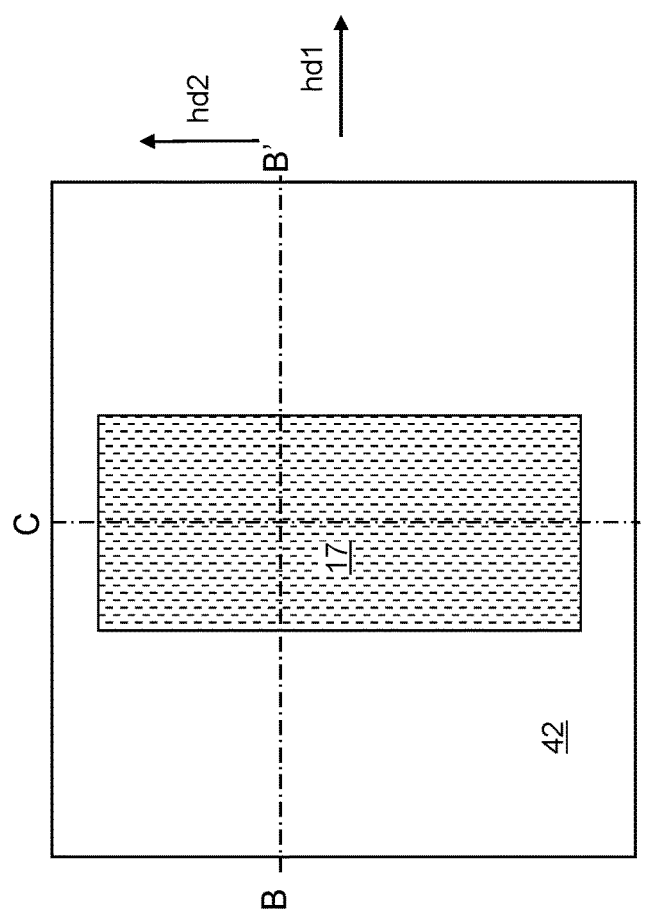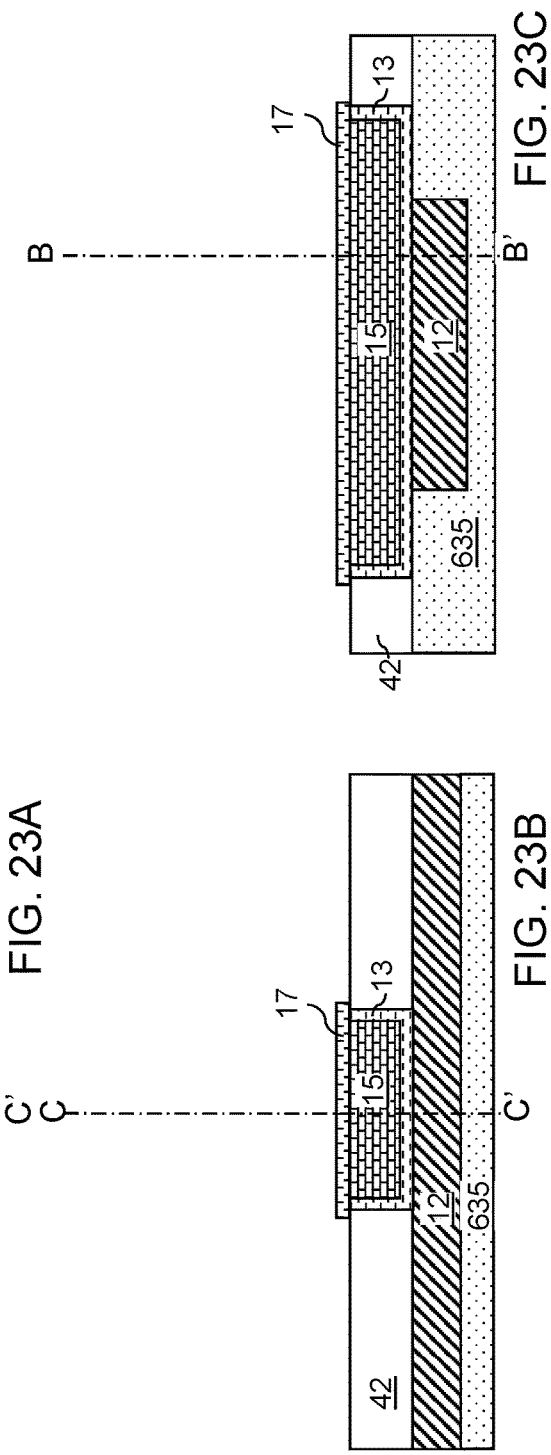

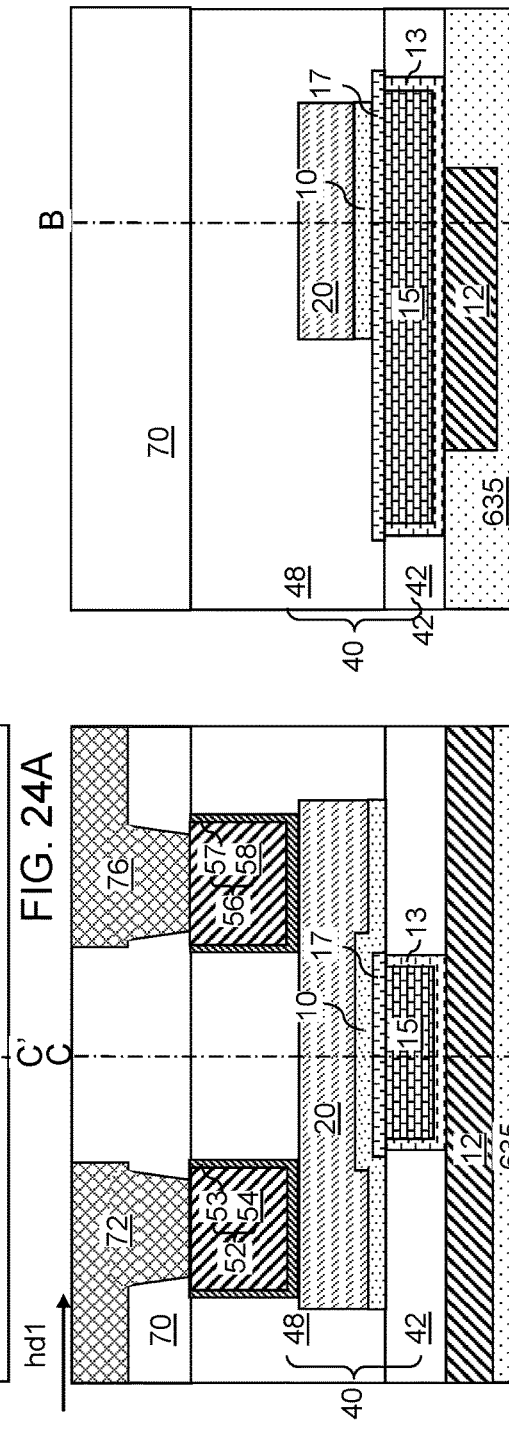
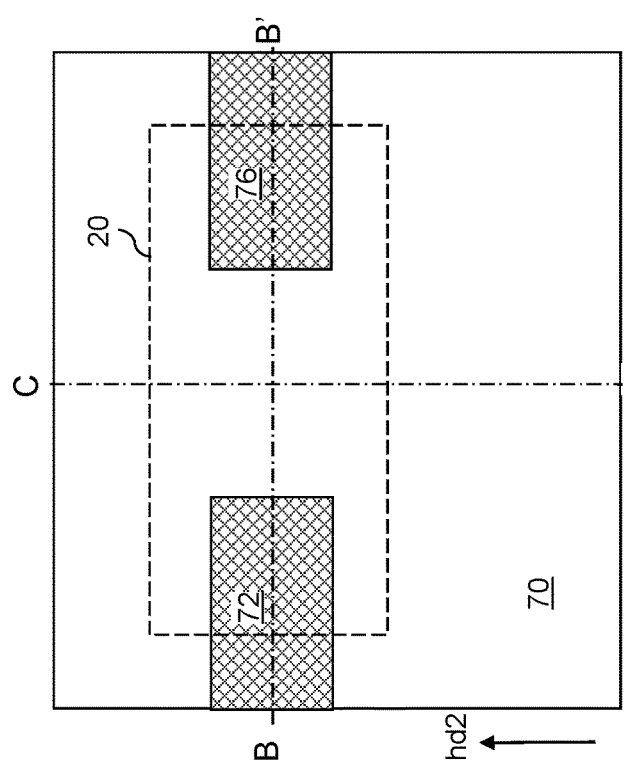

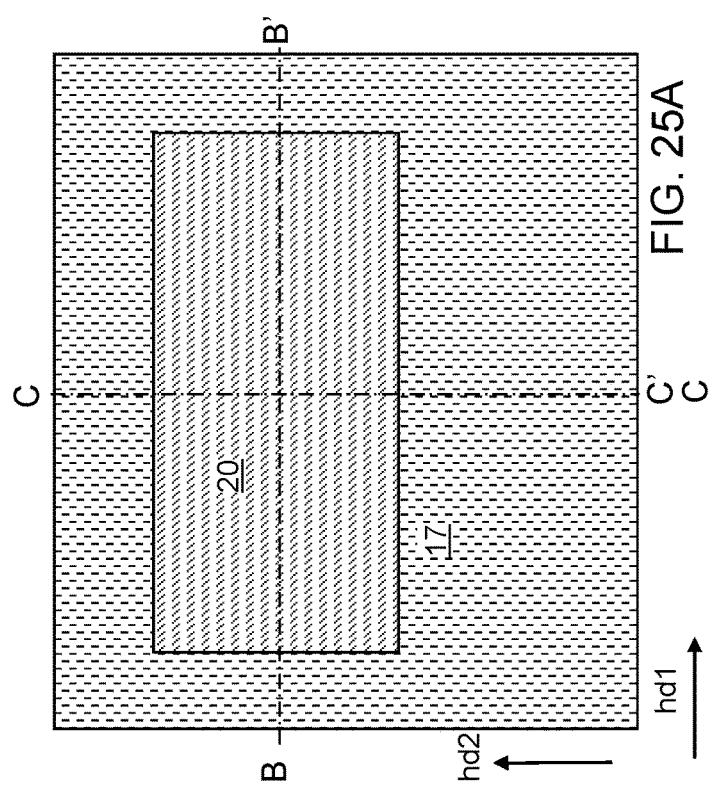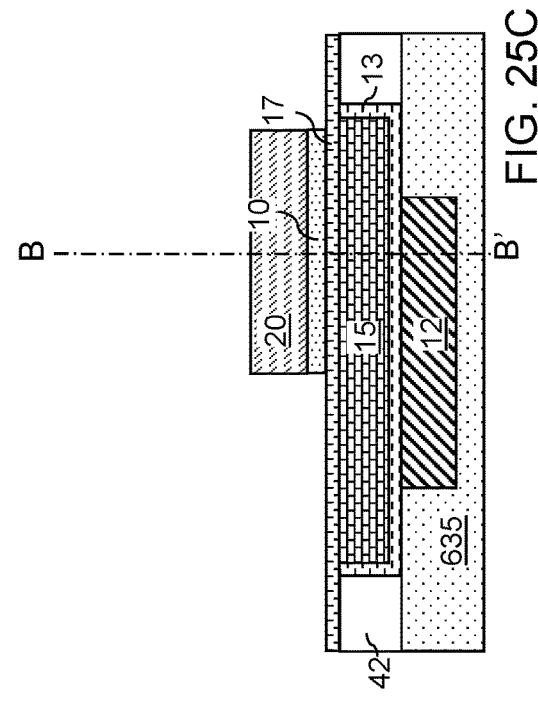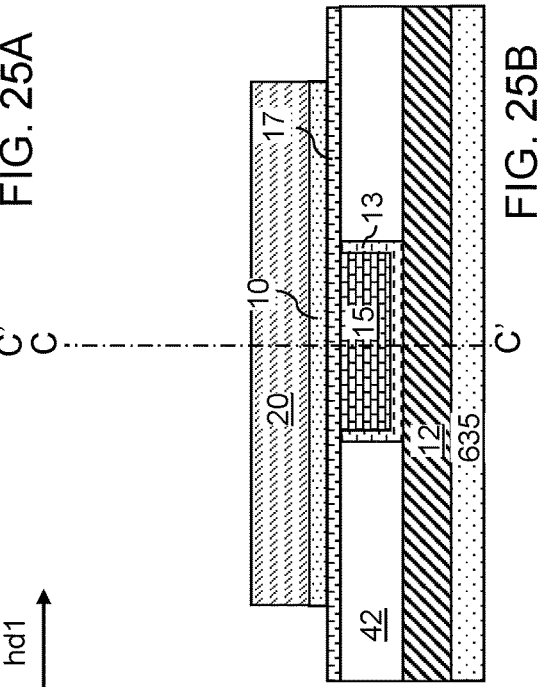

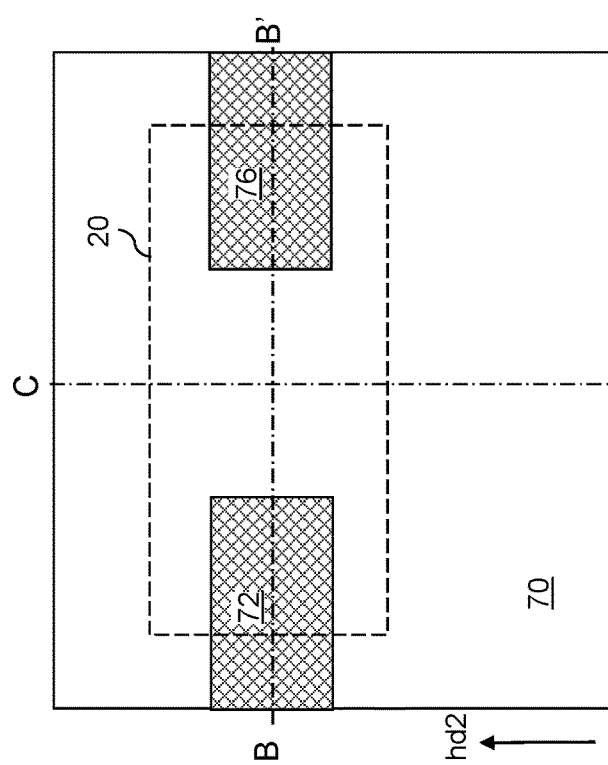
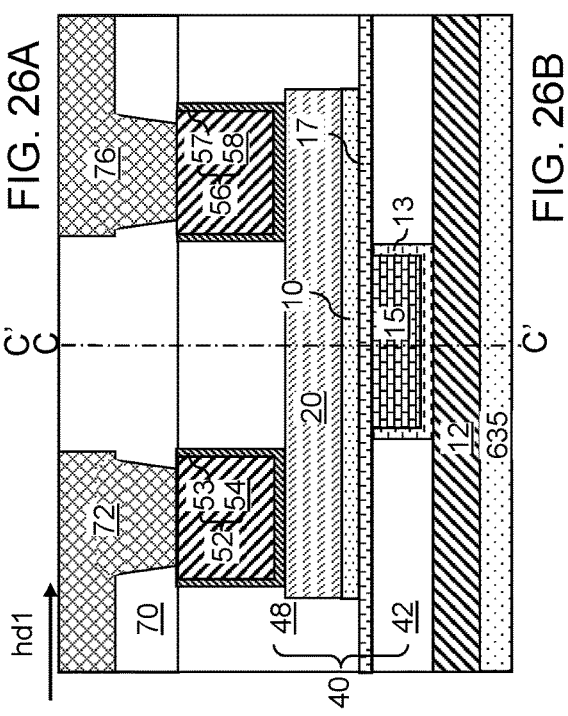
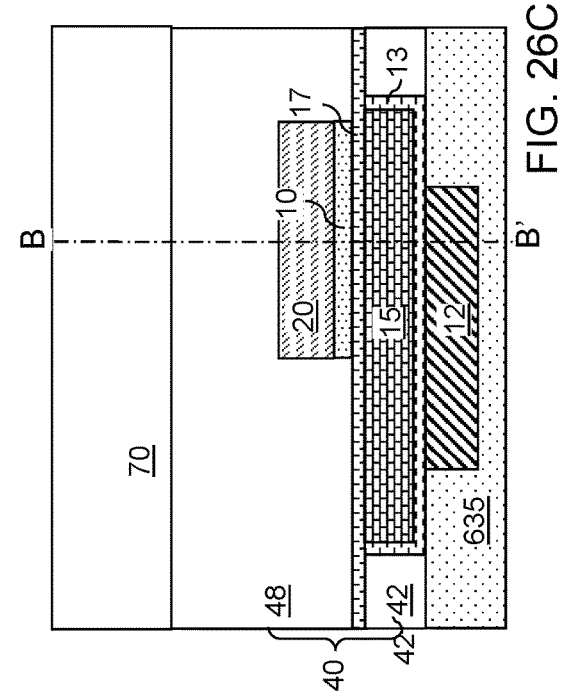
FIG. 26A
FIG. 26B
FIG. 26C

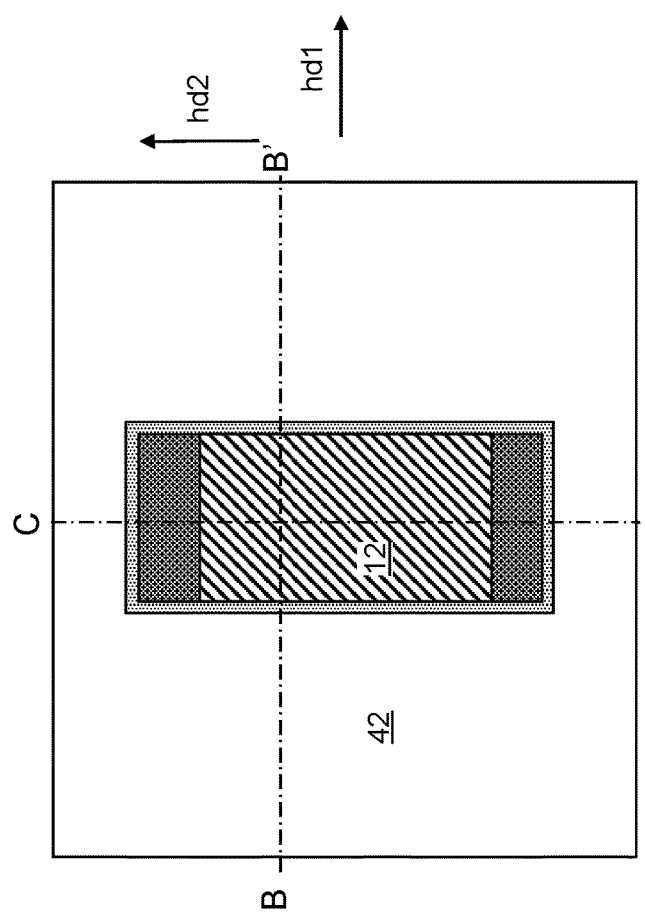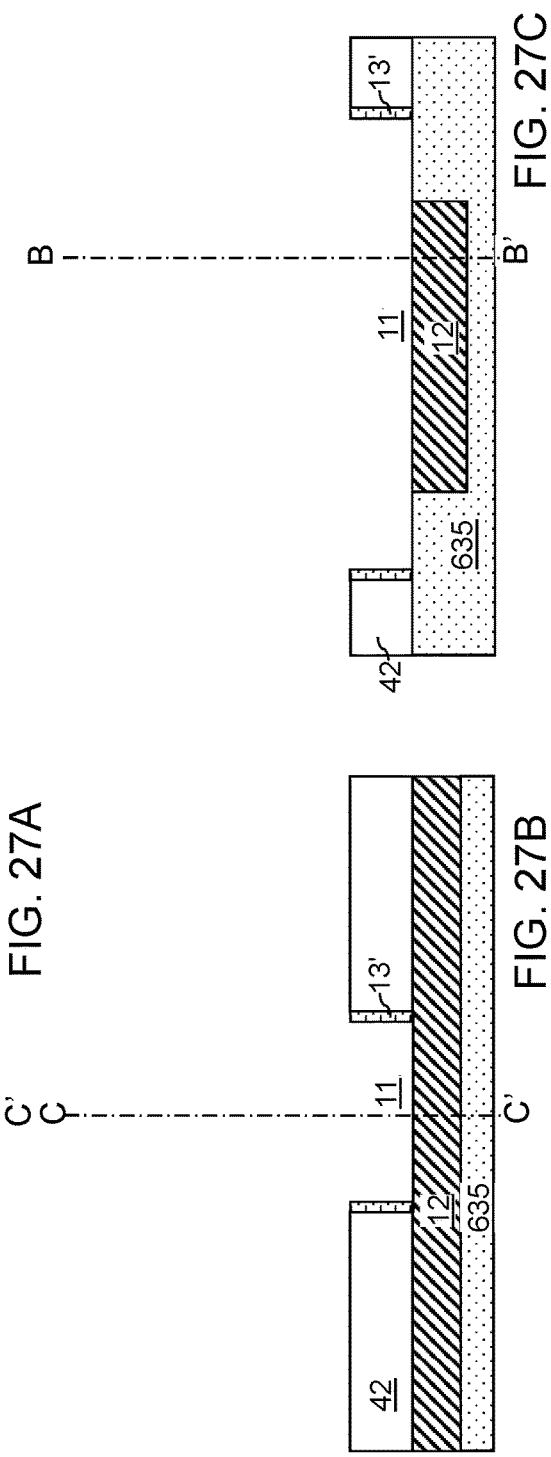

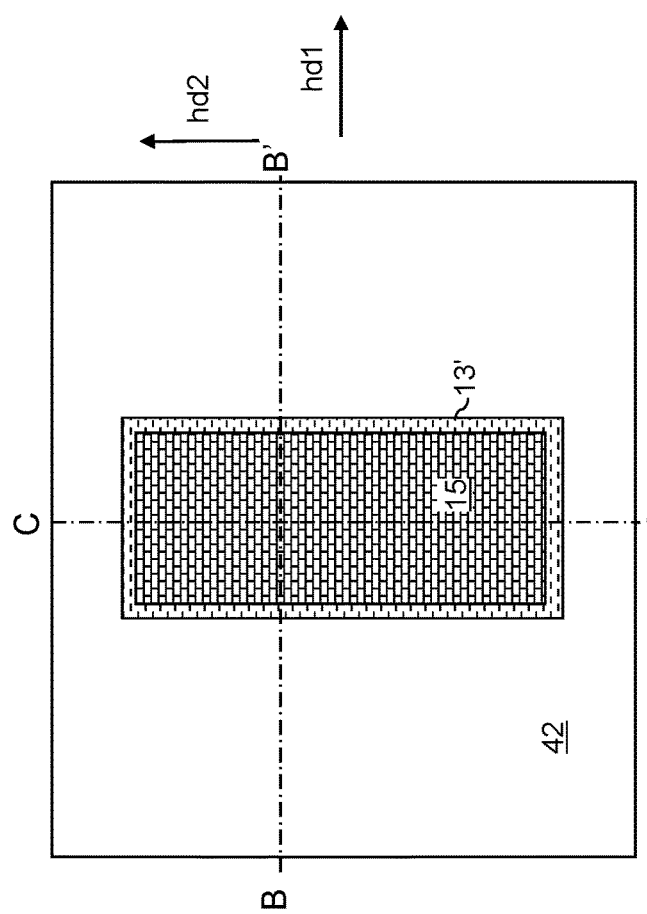
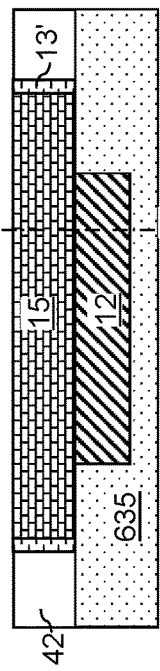
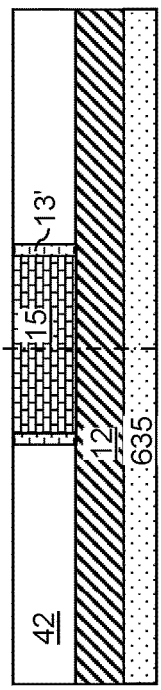
FIG. 28A
FIG. 28B
FIG. 28C

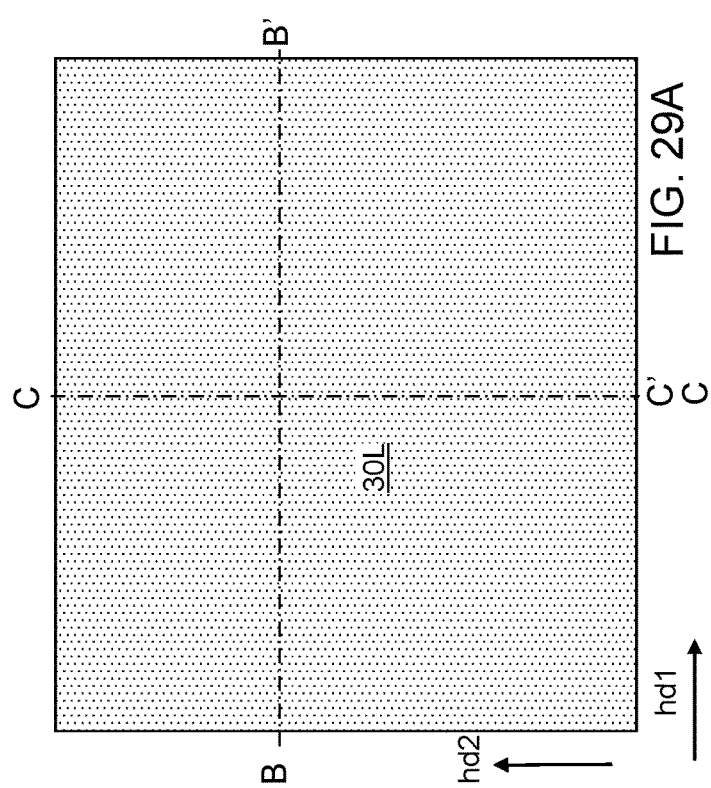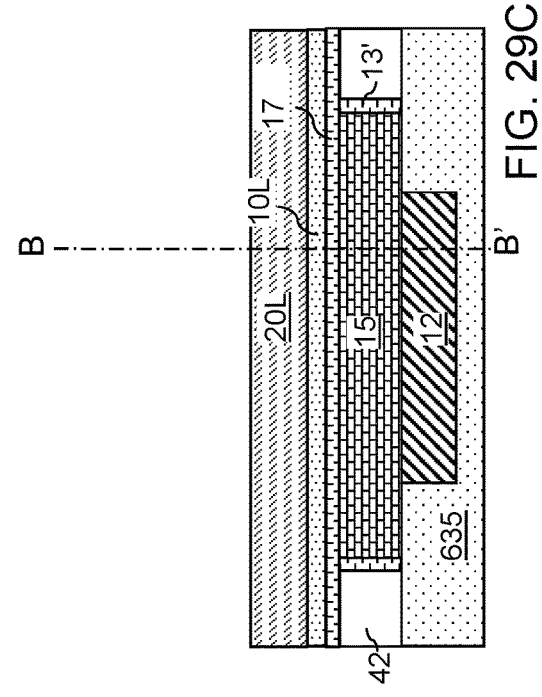

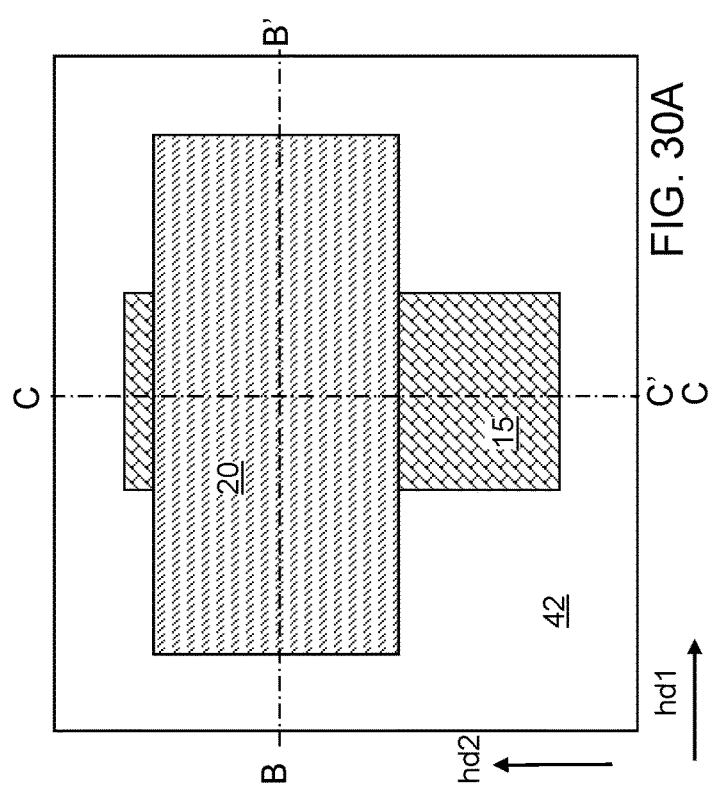
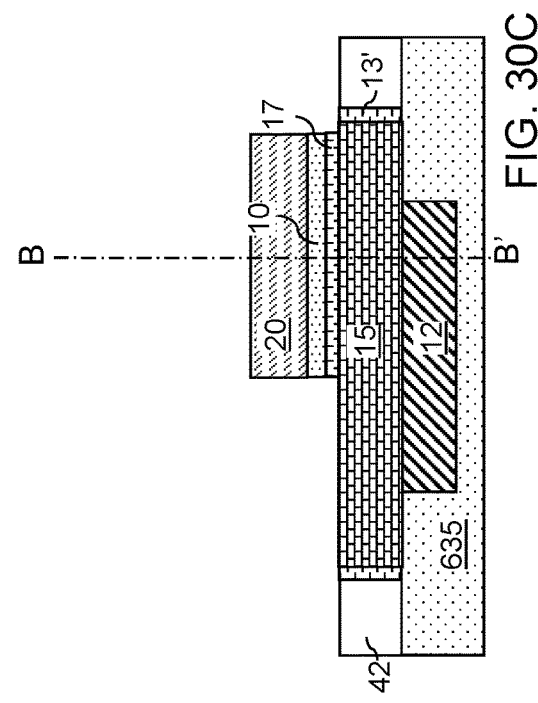
FIG. 30A  FIG. 30B  FIG. 30C

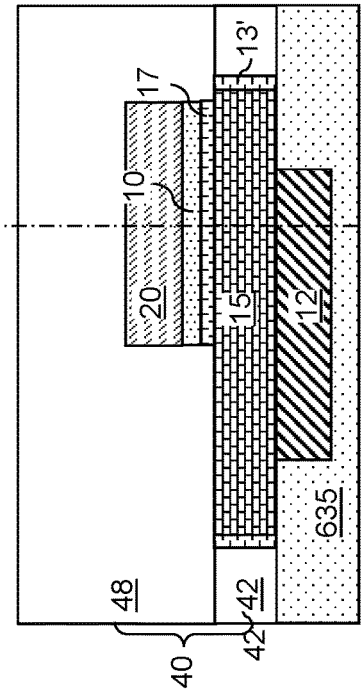
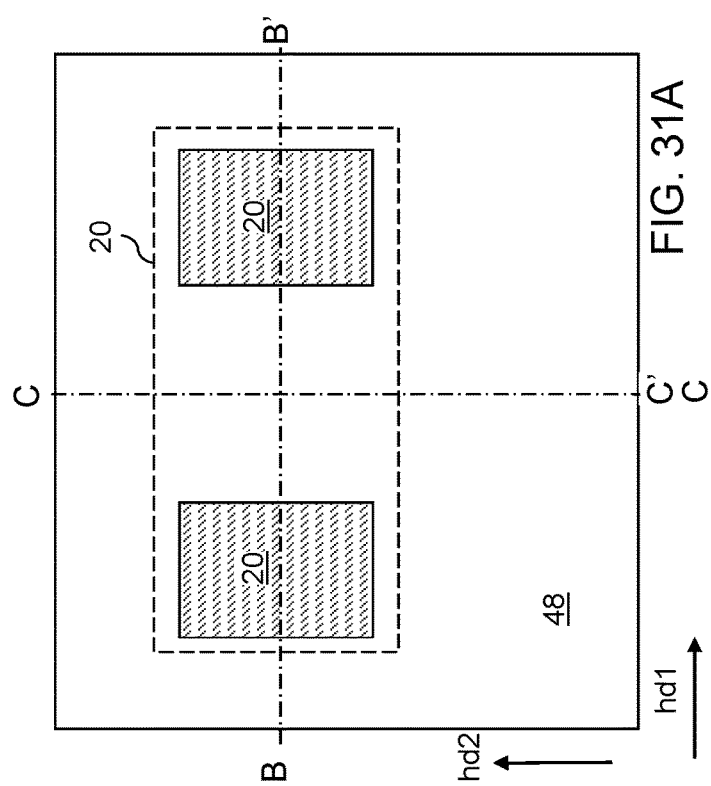
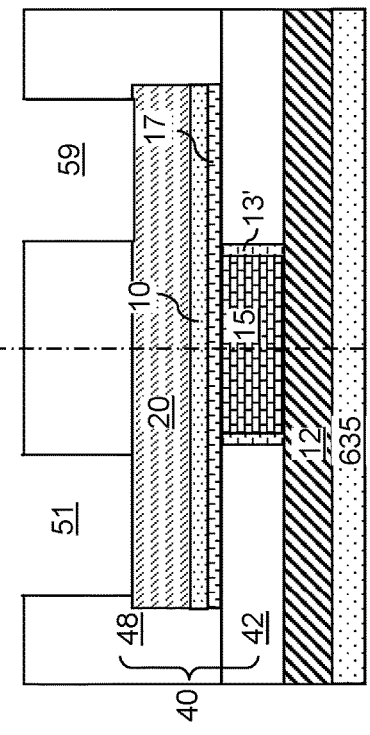

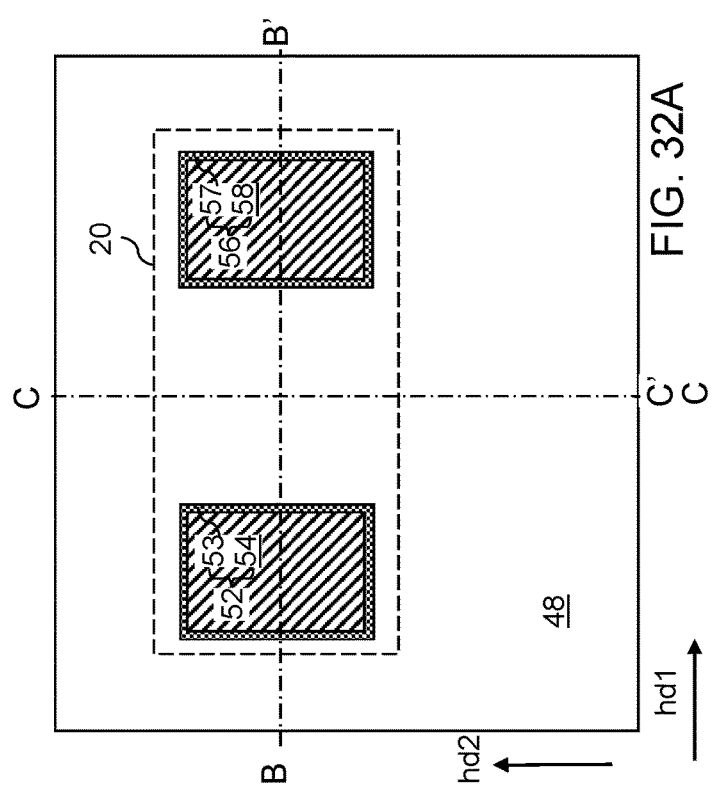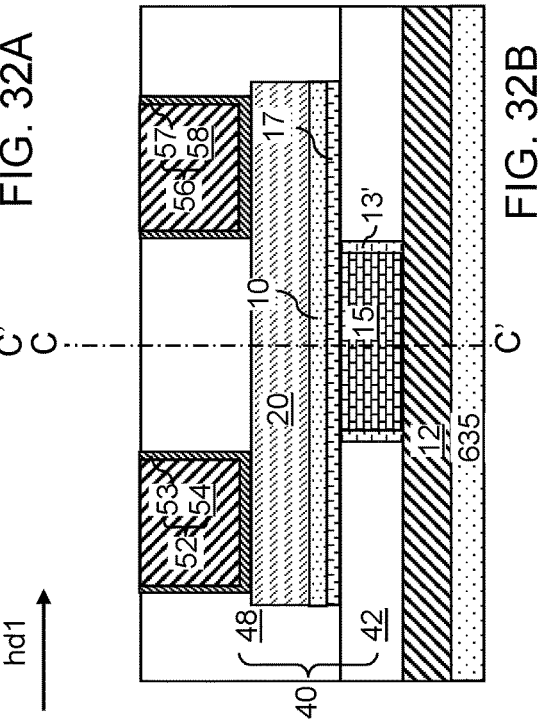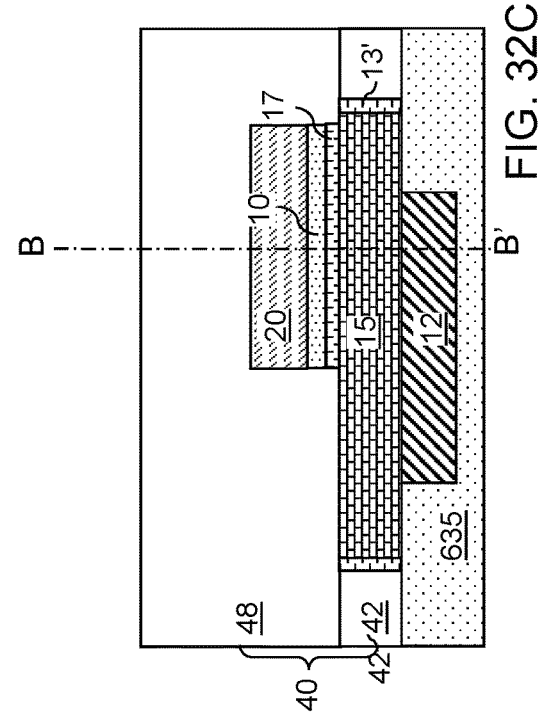
FIG. 32A
FIG. 32B
FIG. 32C

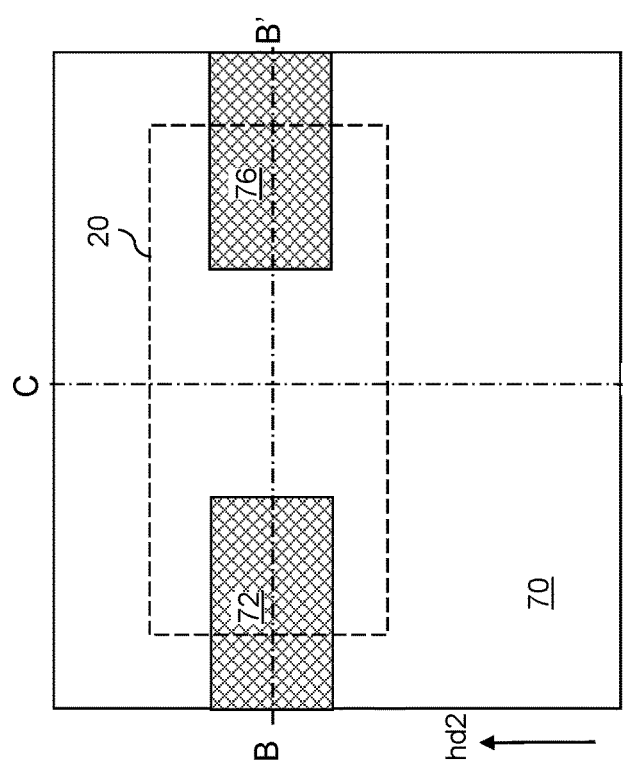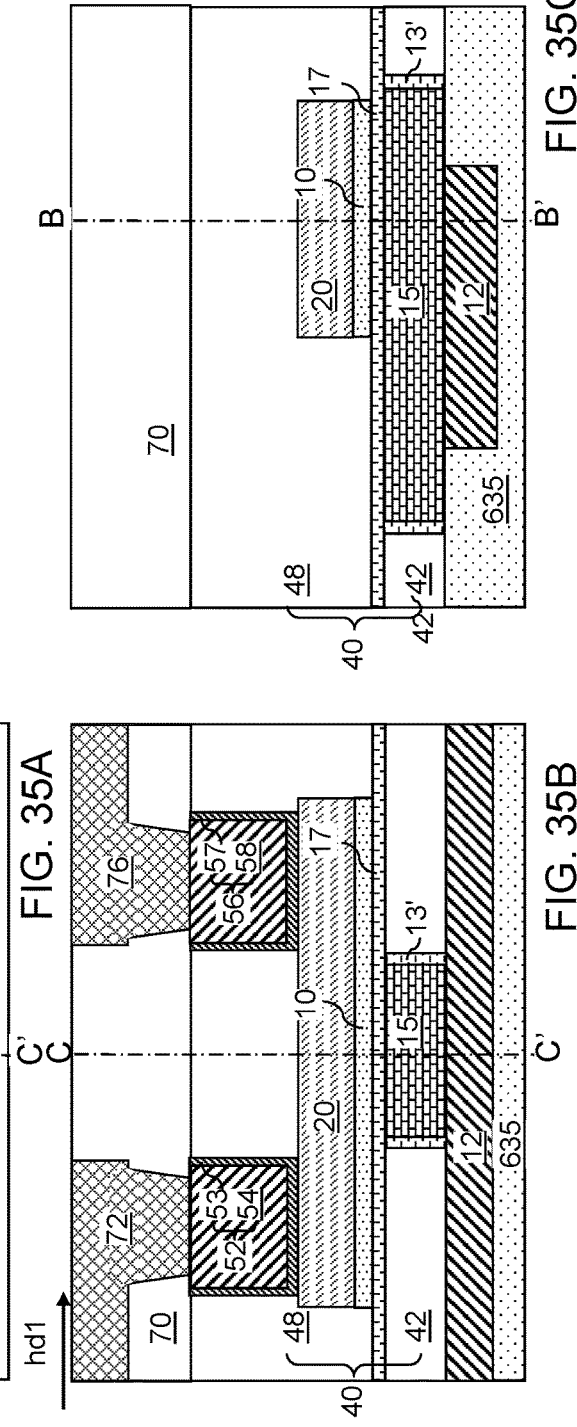
FIG. 35A
FIG. 35B
FIG. 35C

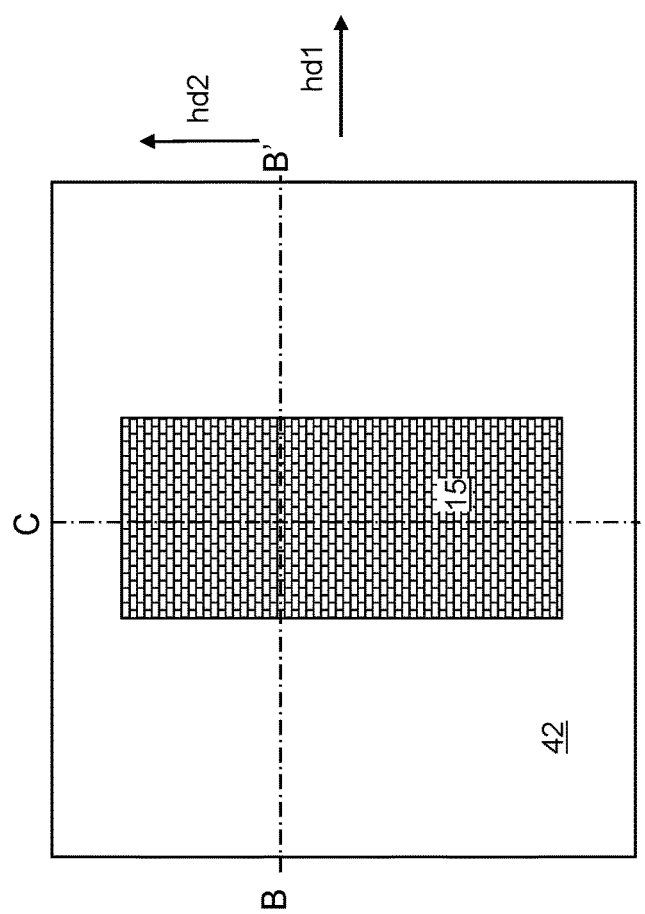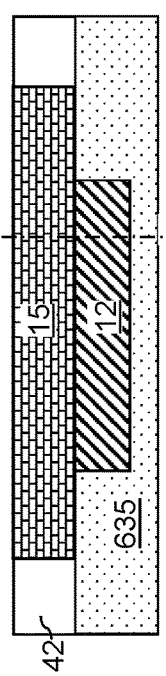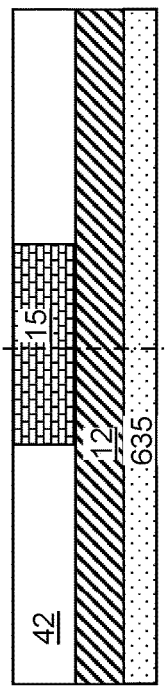
FIG. 36A
FIG. 36B
FIG. 36C

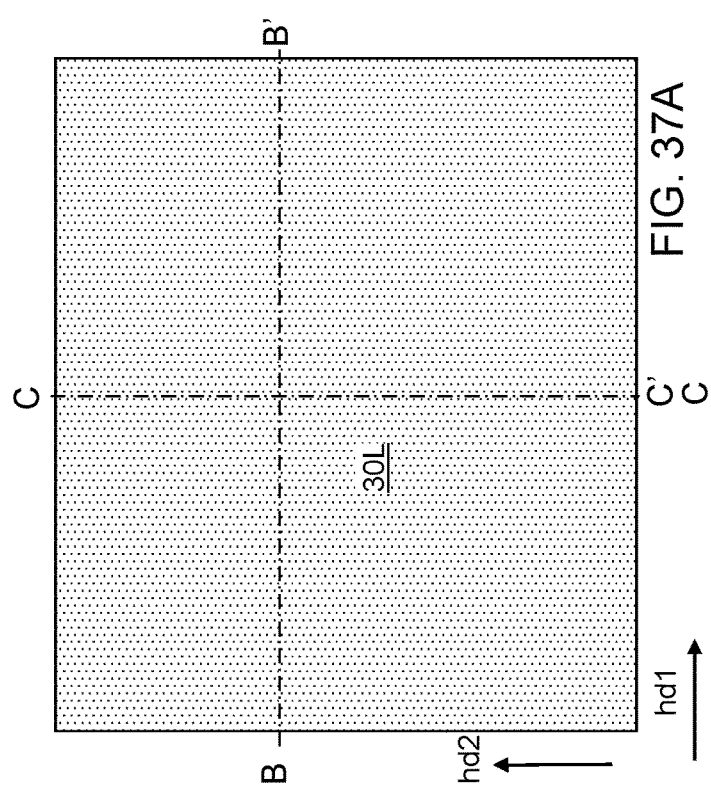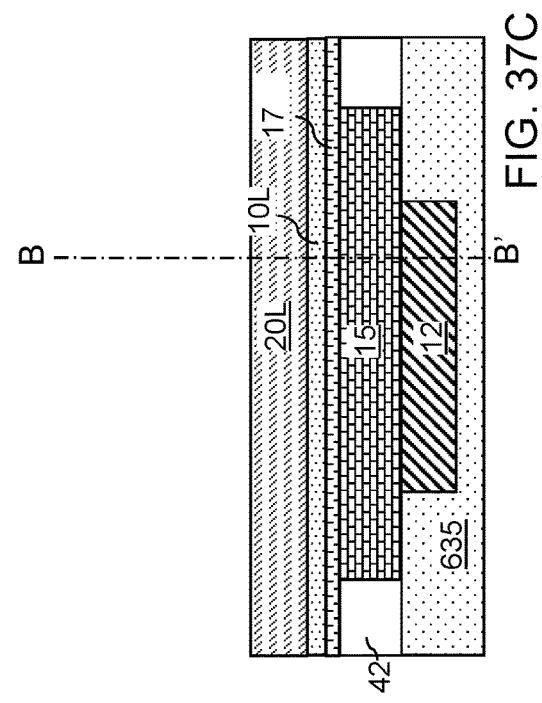
FIG. 37A   FIG. 37B   FIG. 37C

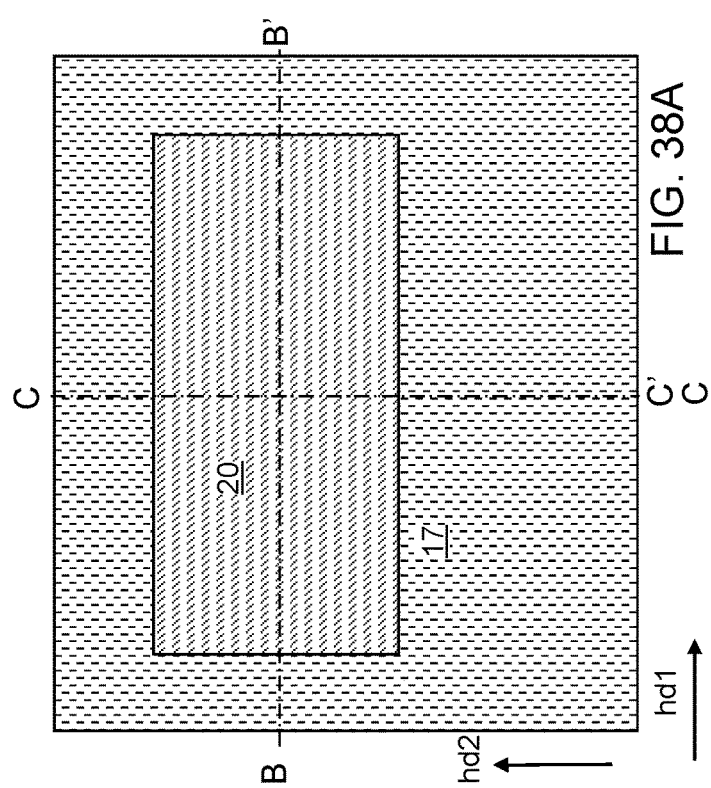
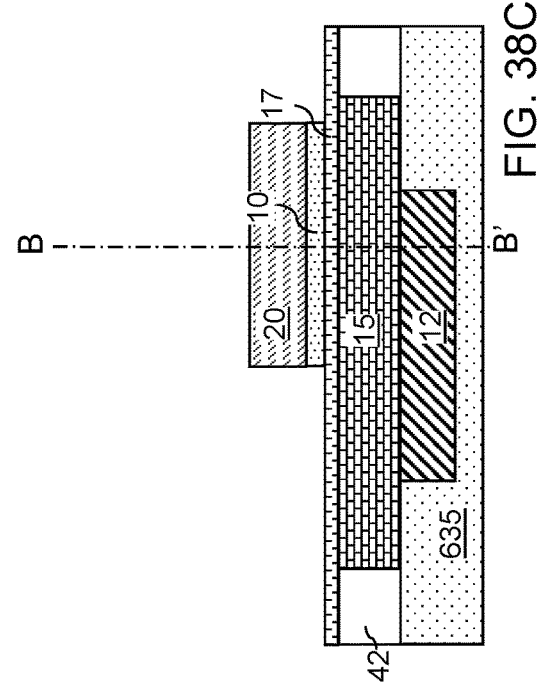
FIG. 38A  FIG. 38B  FIG. 38C

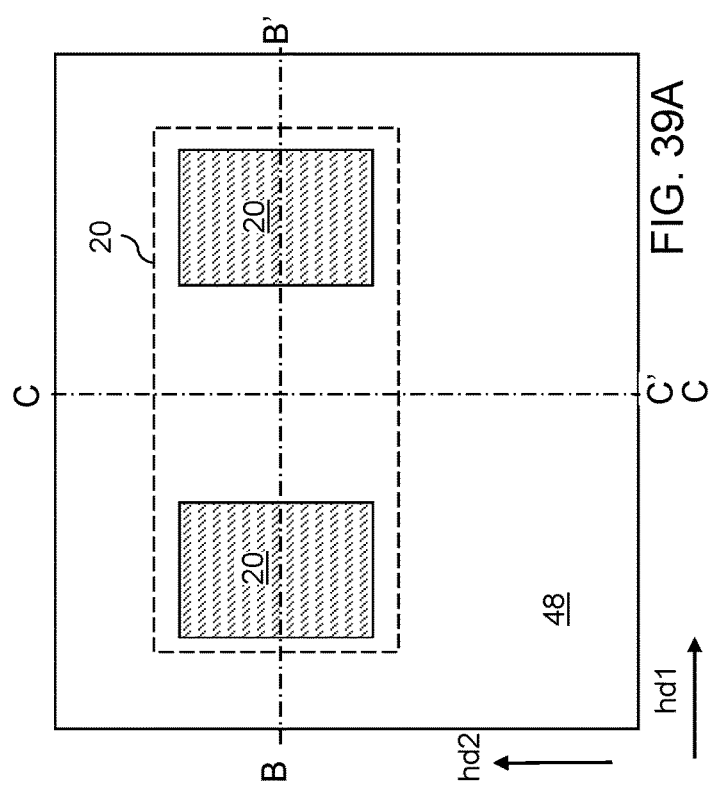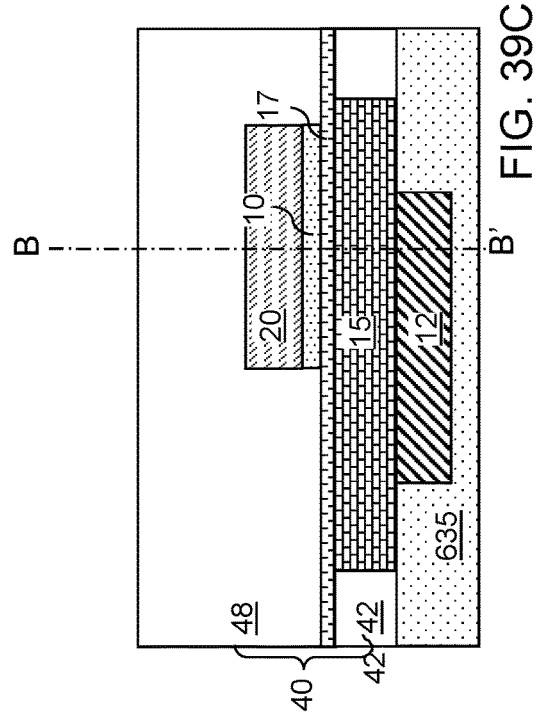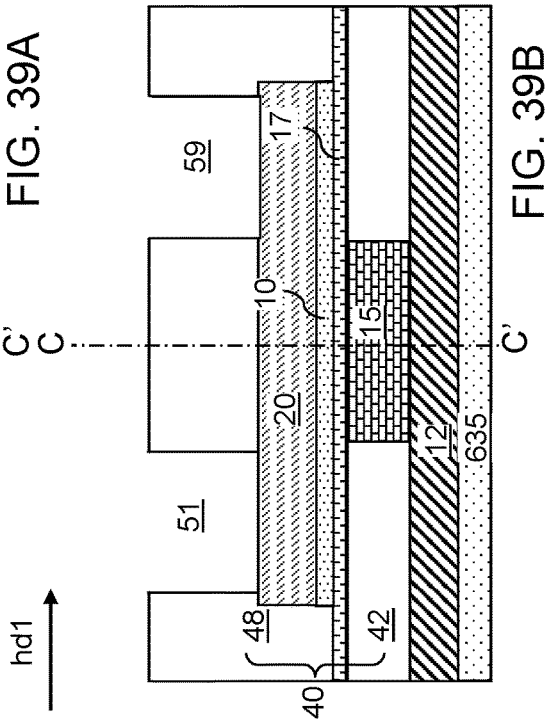

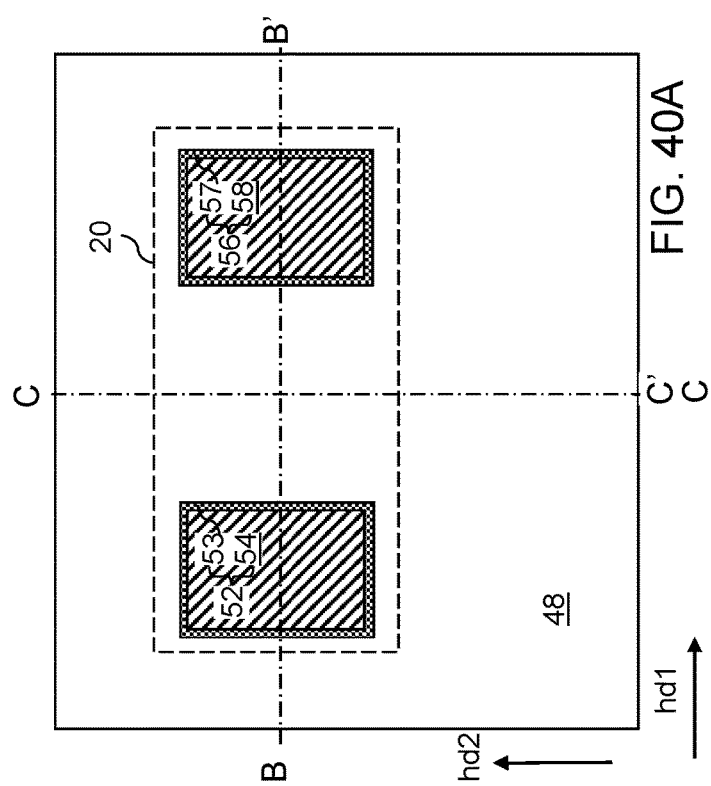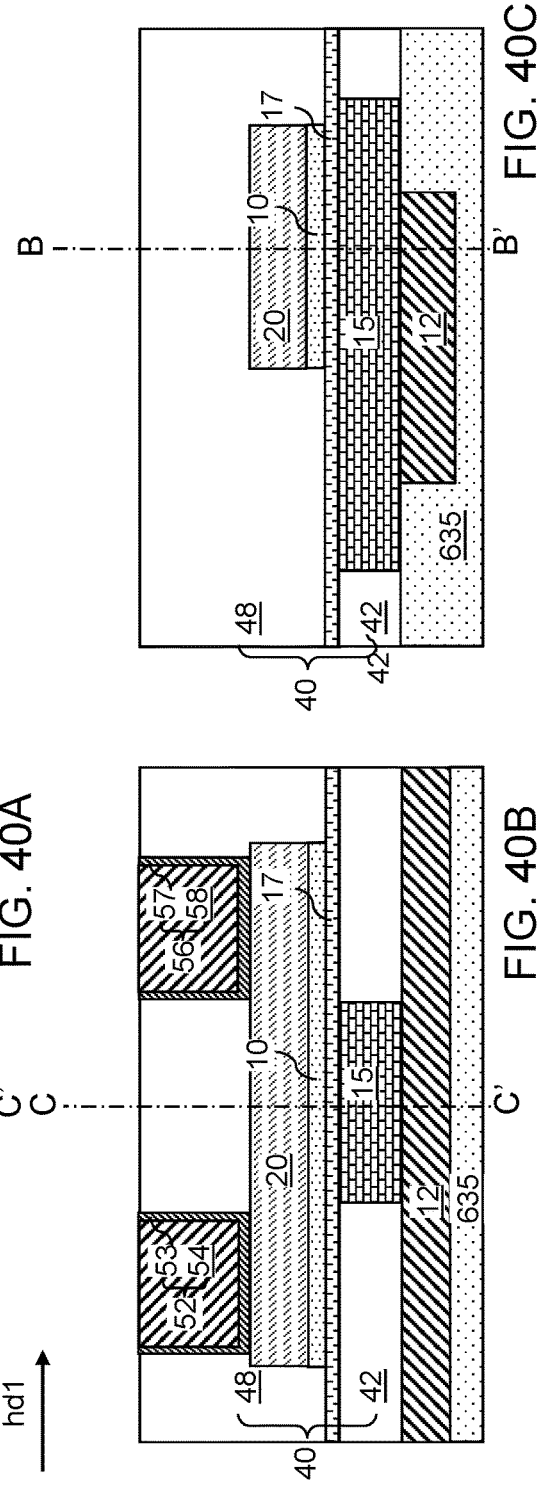

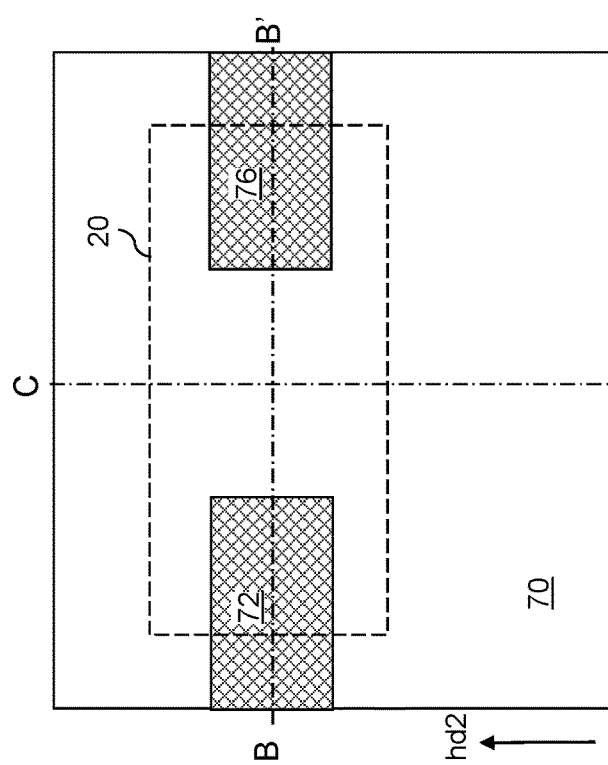
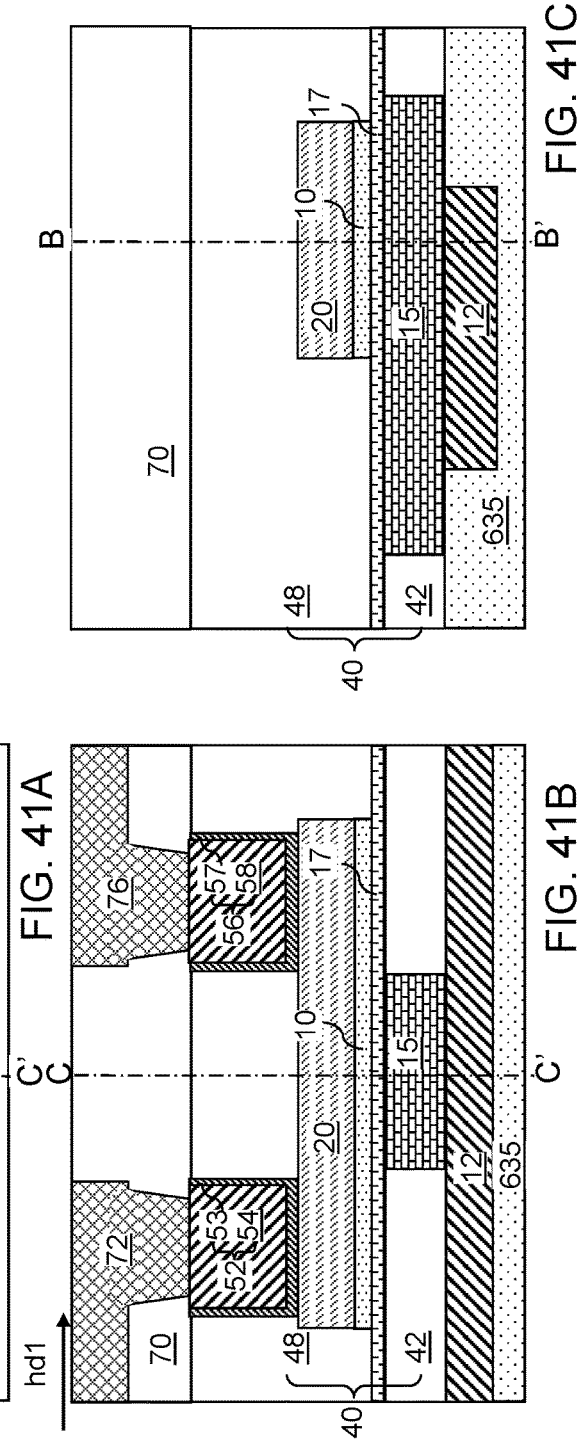
FIG. 41A
FIG. 41B
FIG. 41C

US 12,402,355 B2

ACCESS TRANSISTOR INCLUDING A METAL OXIDE BARRIER LAYER AND METHODS FOR FORMING THE SAME

RELATED APPLICATIONS

This application is a divisional application of U.S. application Ser. No. 17/485,848 entitled "Access Transistor Including a Metal Oxide Barrier Layer and Methods for Forming the Same," filed on Sep. 27, 2021, which claims the benefit of priority from a U.S. provisional application Ser. No. 63/189,945, entitled "Barrier layer for work function engineering in TFTs," filed on May 18, 2021, the entire contents of both of which are incorporated herein by reference for all purposes.

BACKGROUND

A variety of transistor structures have been developed to meet various design criteria. Thin film transistors (TFT) made of oxide semiconductors are an attractive option for back-end-of-line (BEOL) integration since TFTs may be processed at low temperatures and thus, will not damage previously fabricated devices. For example, the fabrication conditions and techniques do not damage previously fabricated front-end-of-line (FEOL) and middle end-of-line (MEOL) devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2A is a top-down view of a region of the first exemplary structure after formation of a body bias line according to a first embodiment of the present disclosure.

FIG. 2B is a vertical cross-sectional view of the first exemplary structure along the vertical plane B-B' of FIG. 2A.

FIG. 2C is a vertical cross-sectional view of the first exemplary structure along the vertical plane C-C' of FIG. 2A.

FIG. 3A is a top-down view of the region of the first exemplary structure after formation of an insulating layer and a body contact cavity according to the first embodiment of the present disclosure.

FIG. 3B is a vertical cross-sectional view of the first exemplary structure along the vertical plane B-B' of FIG. 3A.

FIG. 3C is a vertical cross-sectional view of the first exemplary structure along the vertical plane C-C' of FIG. 3A.

FIG. 4A is a top-down view of the region of the first exemplary structure after formation of a body contact via structure according to the first embodiment of the present disclosure.

FIG. 4B is a vertical cross-sectional view of the first exemplary structure along the vertical plane B-B' of FIG. 4A.

FIG. 4C is a vertical cross-sectional view of the first exemplary structure along the vertical plane C-C' of FIG. 4A.

FIG. 5A is a top-down view of the region of the first exemplary structure after formation of a continuous active layer and a top gate dielectric layer according to the first embodiment of the present disclosure.

FIG. 5B is a vertical cross-sectional view of the first exemplary structure along the vertical plane B-B' of FIG. 5A.

FIG. 5C is a vertical cross-sectional view of the first exemplary structure along the vertical plane C-C' of FIG. 5A.

FIG. 7A is a top-down view of the region of the first exemplary structure after formation of a dielectric layer according to the first embodiment of the present disclosure.

FIG. 7B is a vertical cross-sectional view of the first exemplary structure along the vertical plane B-B' of FIG. 7A.

FIG. 7C is a vertical cross-sectional view of the first exemplary structure along the vertical plane C-C' of FIG. 7A.

FIG. 8A is a top-down view of the region of the first exemplary structure after formation of a source cavity and a drain cavity according to the first embodiment of the present disclosure.

FIG. 8B is a vertical cross-sectional view of the first exemplary structure along the vertical plane B-B' of FIG. 8A.

FIG. 8C is a vertical cross-sectional view of the first exemplary structure along the vertical plane C-C' of FIG. 8A.

FIG. 9A is a top-down view of the region of the first exemplary structure after formation of a source electrode and a drain electrode according to the first embodiment of the present disclosure.

FIG. 9B is a vertical cross-sectional view of the first exemplary structure along the vertical plane B-B' of FIG. 9A.

FIG. 9C is a vertical cross-sectional view of the first exemplary structure along the vertical plane C-C' of FIG. 9A.

FIG. 10A is a top-down view of the region of the first exemplary structure after formation of a gate cavity according to the first embodiment of the present disclosure.

FIG. 10B is a vertical cross-sectional view of the first exemplary structure along the vertical plane B-B' of FIG. 10A.

FIG. 10C is a vertical cross-sectional view of the first exemplary structure along the vertical plane C-C' of FIG. 10A.

FIG. 12A is a top-down view of the region of the first exemplary structure after formation of a conformal metal oxide liner and a gate electrode according to the first embodiment of the present disclosure.

FIG. 12B is a vertical cross-sectional view of the alternative configuration of the first exemplary structure along the vertical plane B-B' of FIG. 12A.

FIG. 12C is a vertical cross-sectional view of the alternative configuration of the first exemplary structure along the vertical plane C-C' of FIG. 12A.

FIG. 13A is a top-down view of the region of the first exemplary structure after formation of an upper dielectric material layer and upper-level metal interconnect structures according to the first embodiment of the present disclosure.

FIG. 13B is a vertical cross-sectional view of the alternative configuration of the first exemplary structure along the vertical plane B-B' of FIG. 13A.

FIG. 13C is a vertical cross-sectional view of the alternative configuration of the first exemplary structure along the vertical plane C-C' of FIG. 13A.

FIG. 15A is a top-down view of a portion of a region of a third exemplary structure after formation of a word line, an insulating layer, a gate cavity, and a continuous metal oxide liner according to a third embodiment of the present disclosure.

FIG. 15B is a vertical cross-sectional view of the third exemplary structure along the vertical plane B-B' of FIG. 15A.

FIG. 15C is a vertical cross-sectional view of the third exemplary structure along the vertical plane C-C' of FIG. 15A.

FIG. 16A is a top-down view of the region of the third exemplary structure after formation of a gate electrode according to the third embodiment of the present disclosure.

FIG. 16B is a vertical cross-sectional view of the third exemplary structure along the vertical plane B-B' of FIG. 16A.

FIG. 16C is a vertical cross-sectional view of the third exemplary structure along the vertical plane C-C' of FIG. 16A.

FIG. 17A is a top-down view of the region of the third exemplary structure after formation of a planar metal oxide liner, a gate dielectric layer, and a continuous active layer according to the third embodiment of the present disclosure.

FIG. 17B is a vertical cross-sectional view of the third exemplary structure along the vertical plane B-B' of FIG. 17A.

FIG. 17C is a vertical cross-sectional view of the third exemplary structure along the vertical plane C-C' of FIG. 17A.

FIG. 18A is a top-down view of the region of the third exemplary structure after formation of a stack of a planar metal oxide liner, a gate dielectric, and an active layer according to the third embodiment of the present disclosure.

FIG. 18B is a vertical cross-sectional view of the third exemplary structure along the vertical plane B-B' of FIG. 18A.

FIG. 18C is a vertical cross-sectional view of the third exemplary structure along the vertical plane C-C' of FIG. 18A.

FIG. 19A is a top-down view of the region of the third exemplary structure after formation of a dielectric layer according to the third embodiment of the present disclosure.

FIG. 19B is a vertical cross-sectional view of the third exemplary structure along the vertical plane B-B' of FIG. 19A.

FIG. 19C is a vertical cross-sectional view of the third exemplary structure along the vertical plane C-C' of FIG. 19A.

FIG. 20A is a top-down view of the region of the third exemplary structure after formation of a source cavity and a drain cavity according to the third embodiment of the present disclosure.

FIG. 20B is a vertical cross-sectional view of the third exemplary structure along the vertical plane B-B' of FIG. 20A.

FIG. 20C is a vertical cross-sectional view of the third exemplary structure along the vertical plane C-C' of FIG. 20A.

FIG. 21A is a top-down view of the region of the third exemplary structure after formation of a source electrode and a drain electrode according to the third embodiment of the present disclosure.

FIG. 21B is a vertical cross-sectional view of the third exemplary structure along the vertical plane B-B' of FIG. 21A.

FIG. 21C is a vertical cross-sectional view of the third exemplary structure along the vertical plane C-C' of FIG. 21A.

FIG. 22A is a top-down view of the region of the third exemplary structure after formation of an upper dielectric material layer and upper-level metal interconnect structures according to the third embodiment of the present disclosure.

FIG. 22B is a vertical cross-sectional view of the third exemplary structure along the vertical plane B-B' of FIG. 22A.

FIG. 22C is a vertical cross-sectional view of the third exemplary structure along the vertical plane C-C' of FIG. 22A.

FIG. 23A is a top-down view of the portion of the region of a fourth exemplary structure after formation of a planar metal oxide liner according to a fourth embodiment of the present disclosure.

FIG. 23B is a vertical cross-sectional view of the fourth exemplary structure along the vertical plane B-B' of FIG. 23A.

FIG. 23C is a vertical cross-sectional view of the fourth exemplary structure along the vertical plane C-C' of FIG. 23A.

FIG. 24A is a top-down view of the region of the fourth exemplary structure after formation of an upper dielectric material layer and upper-level metal interconnect structures according to the fourth embodiment of the present disclosure.

FIG. 24B is a vertical cross-sectional view of the fourth exemplary structure along the vertical plane B-B' of FIG. 24A.

FIG. 24C is a vertical cross-sectional view of the fourth exemplary structure along the vertical plane C-C' of FIG. 24A.

FIG. 25A is a top-down view of a portion of a region of an alternative configuration of the fourth exemplary structure after formation of a stack of a planar metal oxide liner, a gate dielectric, and an active layer according to the fourth embodiment of the present disclosure.

FIG. 25B is a vertical cross-sectional view of the fourth exemplary structure along the vertical plane B-B' of FIG. 25A.

FIG. 25C is a vertical cross-sectional view of the fourth exemplary structure along the vertical plane C-C' of FIG. 25A.

FIG. 26A is a top-down view of the region of the alternative configuration of the fourth exemplary structure after formation of an upper dielectric material layer and upper-level metal interconnect structures according to the fourth embodiment of the present disclosure.

FIG. 26B is a vertical cross-sectional view of the fourth exemplary structure along the vertical plane B-B' of FIG. 26A.

FIG. 26C is a vertical cross-sectional view of the fourth exemplary structure along the vertical plane C-C' of FIG. 26A.

FIG. 27A is a top-down view of the portion of the region of a fifth exemplary structure after formation of a tubular metal oxide liner according to a fifth embodiment of the present disclosure.

FIG. 27B is a vertical cross-sectional view of the fifth exemplary structure along the vertical plane B-B' of FIG. 27A.

FIG. 27C is a vertical cross-sectional view of the fifth exemplary structure along the vertical plane C-C' of FIG. 27A.

FIG. 28A is a top-down view of the region of the fifth exemplary structure after formation of a gate electrode according to the fifth embodiment of the present disclosure.

FIG. 28B is a vertical cross-sectional view of the fifth exemplary structure along the vertical plane B-B' of FIG. 28A.

FIG. 28C is a vertical cross-sectional view of the fifth exemplary structure along the vertical plane C-C' of FIG. 28A.

FIG. 29A is a top-down view of the region of the fifth exemplary structure after formation of a stack of a planar metal oxide liner, a gate dielectric layer, and a continuous active layer according to the fifth embodiment of the present disclosure.

FIG. 29B is a vertical cross-sectional view of the fifth exemplary structure along the vertical plane B-B' of FIG. 29A.

FIG. 29C is a vertical cross-sectional view of the fifth exemplary structure along the vertical plane C-C' of FIG. 29A.

FIG. 30A is a top-down view of the region of the fifth exemplary structure after formation of a stack of a planar metal oxide liner, a gate dielectric, and an active layer according to the fifth embodiment of the present disclosure.

FIG. 30B is a vertical cross-sectional view of the fifth exemplary structure along the vertical plane B-B' of FIG. 30A.

FIG. 30C is a vertical cross-sectional view of the fifth exemplary structure along the vertical plane C-C' of FIG. 30A.

FIG. 31A is a top-down view of the region of the fifth exemplary structure after formation of a dielectric layer, a source cavity, and a drain cavity according to the fifth embodiment of the present disclosure.

FIG. 31B is a vertical cross-sectional view of the fifth exemplary structure along the vertical plane B-B' of FIG. 31A.

FIG. 31C is a vertical cross-sectional view of the fifth exemplary structure along the vertical plane C-C' of FIG. 31A.

FIG. 32A is a top-down view of the region of the fifth exemplary structure after formation of a source electrode and a drain electrode according to the fifth embodiment of the present disclosure.

FIG. 32B is a vertical cross-sectional view of the fifth exemplary structure along the vertical plane B-B' of FIG. 32A.

FIG. 32C is a vertical cross-sectional view of the fifth exemplary structure along the vertical plane C-C' of FIG. 32A.

FIG. 35A is a top-down view of the region of the alternative configuration of the fifth exemplary structure after formation of an upper dielectric material layer and upper-level metal interconnect structures according to the fifth embodiment of the present disclosure.

FIG. 35B is a vertical cross-sectional view of the fifth exemplary structure along the vertical plane B-B' of FIG. 35A.

FIG. 35C is a vertical cross-sectional view of the fifth exemplary structure along the vertical plane C-C' of FIG. 35A.

FIG. 36A is a top-down view of the portion of the region of a sixth exemplary structure after formation of a gate electrode according to a sixth embodiment of the present disclosure.

FIG. 36B is a vertical cross-sectional view of the sixth exemplary structure along the vertical plane B-B' of FIG. 36A.

FIG. 36C is a vertical cross-sectional view of the sixth exemplary structure along the vertical plane C-C' of FIG. 36A.

FIG. 37A is a top-down view of the region of the sixth exemplary structure after formation of a planar metal oxide liner, a gate dielectric layer, and a continuous active layer according to the sixth embodiment of the present disclosure.

FIG. 37B is a vertical cross-sectional view of the sixth exemplary structure along the vertical plane B-B' of FIG. 37A.

FIG. 37C is a vertical cross-sectional view of the sixth exemplary structure along the vertical plane C-C' of FIG. 37A.

FIG. 38A is a top-down view of the region of the sixth exemplary structure after formation of a stack of a planar metal oxide liner, a gate dielectric, and an active layer according to the sixth embodiment of the present disclosure.

FIG. 38B is a vertical cross-sectional view of the sixth exemplary structure along the vertical plane B-B' of FIG. 38A.

FIG. 38C is a vertical cross-sectional view of the sixth exemplary structure along the vertical plane C-C' of FIG. 38A.

FIG. 39A is a top-down view of the region of the sixth exemplary structure after formation of a source cavity and a drain cavity according to the sixth embodiment of the present disclosure.

FIG. 39B is a vertical cross-sectional view of the sixth exemplary structure along the vertical plane B-B' of FIG. 39A.

FIG. 39C is a vertical cross-sectional view of the sixth exemplary structure along the vertical plane C-C' of FIG. 39A.

FIG. 40A is a top-down view of the region of the sixth exemplary structure after formation of a source electrode and a drain electrode according to the sixth embodiment of the present disclosure.

FIG. 40B is a vertical cross-sectional view of the sixth exemplary structure along the vertical plane B-B' of FIG. 40A.

FIG. 40C is a vertical cross-sectional view of the sixth exemplary structure along the vertical plane C-C' of FIG. 40A.

FIG. 41A is a top-down view of the region of the sixth exemplary structure after formation of an upper dielectric material layer and upper-level metal interconnect structures according to the sixth embodiment of the present disclosure.

FIG. 41B is a vertical cross-sectional view of the sixth exemplary structure along the vertical plane B-B' of FIG. 41A.

FIG. 41C is a vertical cross-sectional view of the sixth exemplary structure along the vertical plane C-C' of FIG. 41A.

FIG. 42 is a vertical cross-sectional view of an exemplary structure after formation of memory cells according to an embodiment of the present disclosure.

FIG. 43 is a vertical cross-sectional view of a seventh exemplary structure according to a seventh embodiment of the present disclosure.

FIG. 44 is a vertical cross-sectional view of an eighth exemplary structure according to an eighth embodiment of the present disclosure.

FIG. 45 is a vertical cross-sectional view of a ninth exemplary structure according to a ninth embodiment of the present disclosure.

FIG. 46 is a vertical cross-sectional view of a tenth exemplary structure according to a tenth embodiment of the present disclosure.

FIG. 47 is a vertical cross-sectional view of an eleventh exemplary structure according to an eleventh embodiment of the present disclosure.

FIG. 48 is a vertical cross-sectional view of a twelfth exemplary structure according to a twelfth embodiment of the present disclosure.

FIG. 49 is a vertical cross-sectional view of a thirteenth exemplary structure according to a thirteenth embodiment of the present disclosure.

FIG. 50 is a vertical cross-sectional view of a fourteenth exemplary structure according to a fourteenth embodiment of the present disclosure.

Figure 51:
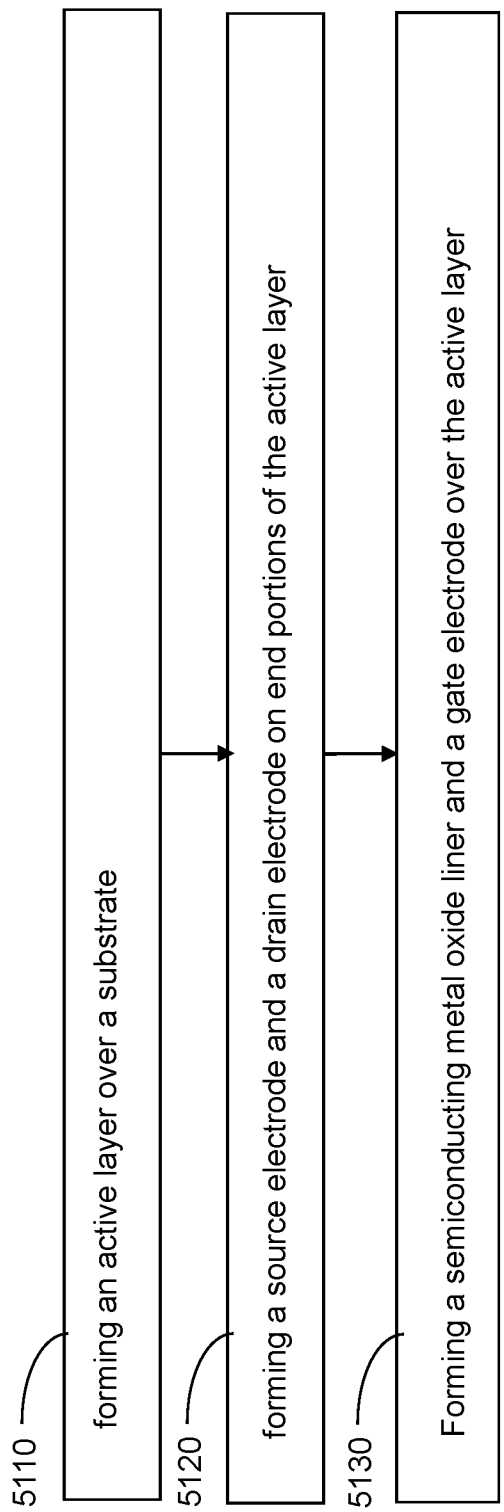

FIG. 51 is a first flowchart that illustrates first exemplary processing steps for manufacturing the semiconductor device of the present disclosure.

Figure 52:
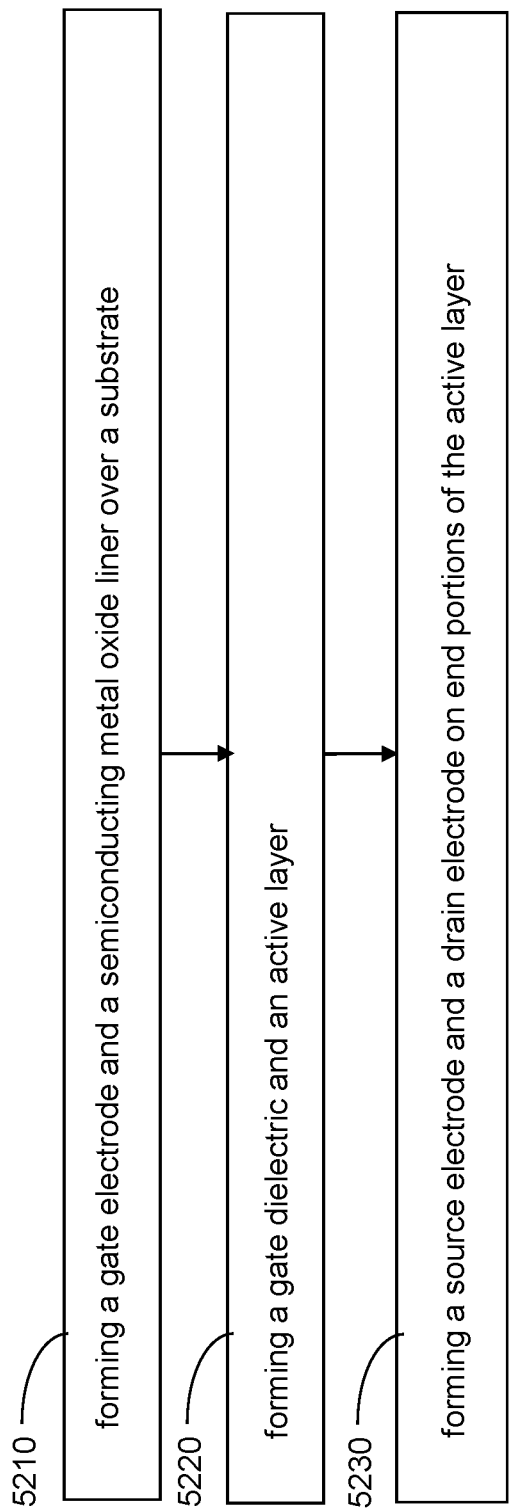

FIG. 52 is a second flowchart that illustrates second exemplary processing steps for manufacturing the semiconductor device of the present disclosure.

Figure 53:
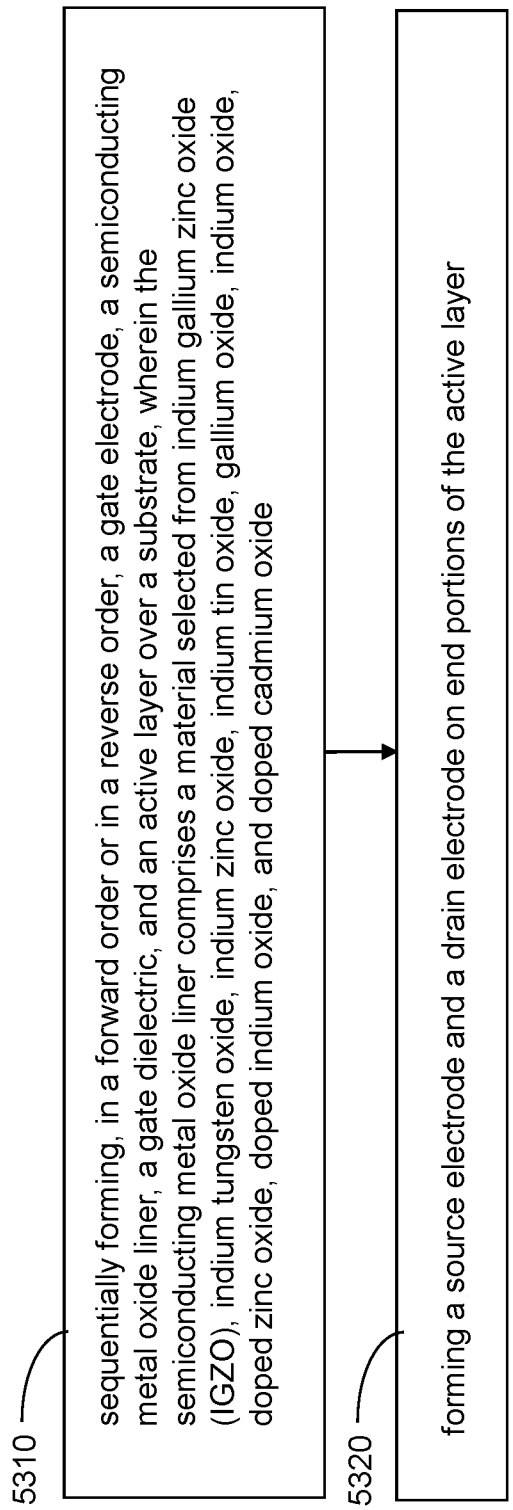

FIG. 53 is a third flowchart that illustrates general processing steps for manufacturing the semiconductor device of the present disclosure.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Elements with the same reference numerals refer to the same element, and are presumed to have the same material composition and the same thickness range unless expressly indicated otherwise.

Generally, the structures and methods of the present disclosure may be used to form a semiconductor structure including a transistor, such as a thin film transistor, that includes a metal oxide liner located between a gate electrode and a gate dielectric. Semiconducting metal oxide materials such as indium gallium zinc oxide are emerging as channel materials for thin-film transistors (TFT's), which may be manufactured, for instance, as back-end of line (BEOL) structures for non-core logic switching functions. Metallic gate materials having a high work function may be used to enhance the electric field in the channel and provide better electrostatic control, thereby increasing the threshold voltage of a thin film transistor. The increase in the threshold voltage due to use of a metallic gate material may be limited to range from 0.1 V to 0.3 V due to intrinsic and extrinsic acting dopants in the channel, which are mainly caused by high hydrogen diffusion in the channel. According to an aspect of the present disclosure, a gate stack using a metal oxide liner as a barrier layer is disclosed, which may be used to reduce hydrogen diffusion from the gate electrode into the channel and to effectively increase the threshold voltage of a transistor.

Figure 1:
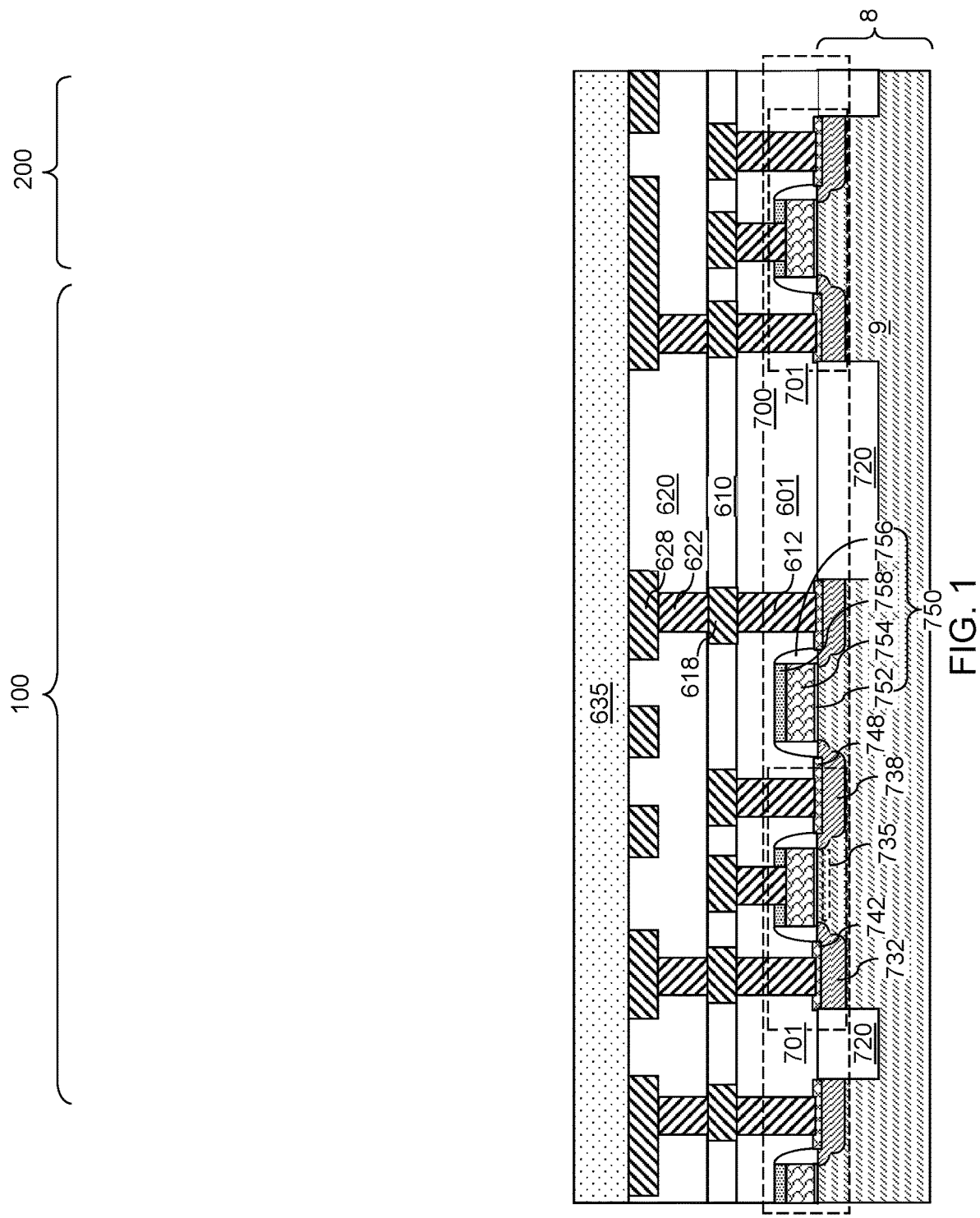
FIG. 1 is a vertical cross-sectional view of a first exemplary structure after formation of complementary metal-oxide-semiconductor (CMOS) transistors, first metal interconnect structures formed in lower-level dielectric material layers, and an isolation dielectric layer according to an embodiment of the present disclosure.

Referring to FIG. 1, a first exemplary structure according to a first embodiment of the present disclosure is illustrated. The first exemplary structure includes a substrate 8, which may be a semiconductor substrate such as a commercially available silicon substrate. The substrate 8 may include a semiconductor material layer 9 at least at an upper portion thereof. The semiconductor material layer 9 may be a surface portion of a bulk semiconductor substrate, or may be a top semiconductor layer of a semiconductor-on-insulator (SOI) substrate. In one embodiment, the semiconductor material layer 9 includes a single crystalline semiconductor material such as single crystalline silicon. In one embodiment, the substrate 8 may include a single crystalline silicon substrate including a single crystalline silicon material.

Shallow trench isolation structures 720 including a dielectric material such as silicon oxide may be formed in an upper portion of the semiconductor material layer 9. Suitable doped semiconductor wells, such as p-type wells and n-type wells, may be formed within each area that is laterally enclosed by a portion of the shallow trench isolation structures 720. Field effect transistors 701 may be formed over the top surface of the semiconductor material layer 9. For example, each field effect transistor 701 may include a source electrode 732, a drain electrode 738, a semiconductor channel 735 that includes a surface portion of the substrate 8 extending between the source electrode 732 and the drain electrode 738, and a gate structure 750. The semiconductor channel 735 may include a single crystalline semiconductor material. Each gate structure 750 may include a gate dielectric layer 752, a gate electrode 754, a gate cap dielectric 758, and a dielectric gate spacer 756. A source-side metal-semiconductor alloy region 742 may be formed on each source electrode 732, and a drain-side metal-semiconductor alloy region 748 may be formed on each drain electrode 738.

The first exemplary structure may include a memory array region 100 in which an array of ferroelectric memory cells may be subsequently formed. The first exemplary structure may further include a peripheral region 200 in which metal wiring for the array of ferroelectric memory devices is provided. Generally, the field effect transistors 701 in the CMOS circuitry 700 may be electrically connected to an electrode of a respective ferroelectric memory cell by a respective set of metal interconnect structures.

Devices (such as field effect transistors 701) in the peripheral region 200 may provide functions that operate the array of ferroelectric memory cells to be subsequently formed. Specifically, devices in the peripheral region may be configured to control the programming operation, the erase operation, and the sensing (read) operation of the array of ferroelectric memory cells. For example, the devices in the peripheral region may include a sensing circuitry and/or a programming circuitry. The devices formed on the top surface of the semiconductor material layer 9 may include complementary metal-oxide-semiconductor (CMOS) transistors and optionally additional semiconductor devices (such as resistors, diodes, capacitors, etc.), and are collectively referred to as CMOS circuitry 700.

One or more of the field effect transistors 701 in the CMOS circuitry 700 may include a semiconductor channel 735 that contains a portion of the semiconductor material layer 9 in the substrate 8. If the semiconductor material layer 9 includes a single crystalline semiconductor material such as single crystalline silicon, the semiconductor channel 735 of each field effect transistor 701 in the CMOS circuitry 700 may include a single crystalline semiconductor channel such as a single crystalline silicon channel. In one embodiment, a plurality of field effect transistors 701 in the CMOS circuitry 700 may include a respective node that is subsequently electrically connected to a node of a respective ferroelectric memory cell to be subsequently formed. For example, a plurality of field effect transistors 701 in the CMOS circuitry 700 may include a respective source electrode 732 or a respective drain electrode 738 that is subsequently electrically connected to a node of a respective ferroelectric memory cell to be subsequently formed.

In one embodiment, the CMOS circuitry 700 may include a programming control circuit configured to control gate voltages of a set of field effect transistors 701 that are used for programming a respective ferroelectric memory cell and to control gate voltages of thin film transistors to be subsequently formed. In this embodiment, the programming control circuit may be configured to provide a first programming pulse that programs a respective ferroelectric dielectric material layer in a selected ferroelectric memory cell into a first polarization state in which electrical polarization in the ferroelectric dielectric material layer points toward a first electrode of the selected ferroelectric memory cell, and to provide a second programming pulse that programs the ferroelectric dielectric material layer in the selected ferroelectric memory cell into a second polarization state in which the electrical polarization in the ferroelectric dielectric material layer points toward a second electrode of the selected ferroelectric memory cell.

In one embodiment, the substrate 8 may include a single crystalline silicon substrate, and the field effect transistors 701 may include a respective portion of the single crystalline silicon substrate as a semiconducting channel. As used herein, a "semiconducting" element refers to an element having electrical conductivity in the range from $1.0 \times 10^{-6}$ S/cm to $1.0 \times 10^{5}$ S/cm. As used herein, a "semiconductor material" refers to a material having electrical conductivity in the range from $1.0 \times 10^{-6}$ S/cm to $1.0 \times 10^{5}$ S/cm in the absence of electrical dopants therein, and is capable of producing a doped material having electrical conductivity in a range from 1.0 S/cm to $1.0 \times 10^{5}$ S/cm upon suitable doping with an electrical dopant.

According to an aspect of the present disclosure, the field effect transistors 701 may be subsequently electrically connected to drain electrodes and gate electrodes of access transistors including semiconducting metal oxide plates to be formed above the field effect transistors 701. In one embodiment, a subset of the field effect transistors 701 may be subsequently electrically connected to at least one of the drain electrodes and the gate electrodes. For example, the field effect transistors 701 may comprise first word line drivers configured to apply a first gate voltage to first word lines through a first subset of lower-level metal interconnect structures to be subsequently formed, and second word line drivers configured to apply a second gate voltage to second word lines through a second subset of the lower-level metal interconnect structures. Further, the field effect transistors 701 may comprise bit line drivers configured to apply a bit line bias voltage to bit lines to be subsequently formed, and sense amplifiers configured to detect electrical current that flows through the bit lines during a read operation.

Various metal interconnect structures formed within dielectric material layers may be subsequently formed over the substrate 8 and the semiconductor devices thereupon (such as field effect transistors 701). In an illustrative example, the dielectric material layers may include, for example, a first dielectric material layer 601 that may be a layer that surrounds the contact structure connected to the source and drains (sometimes referred to as a contact-level dielectric material layer 601), a first interconnect-level dielectric material layer 610, and a second interconnect-level dielectric material layer 620. The metal interconnect structures may include device contact via structures 612 formed in the first dielectric material layer 601 and contacting a respective component of the CMOS circuitry 700, first metal line structures 618 formed in the first interconnect-level dielectric material layer 610, first metal via structures 622 formed in a lower portion of the second interconnect-level dielectric material layer 620, and second metal line structures 628 formed in an upper portion of the second interconnect-level dielectric material layer 620.

Each of the dielectric material layers (601, 610, 620) may include a dielectric material such as undoped silicate glass, a doped silicate glass, organosilicate glass, amorphous fluorinated carbon, porous variants thereof, or combinations thereof. Each of the metal interconnect structures (612, 618, 622, 628) may include at least one conductive material, which may be a combination of a metallic liner (such as a metallic nitride or a metallic carbide) and a metallic fill material. Each metallic liner may include TiN, TaN, WN, TiC, TaC, and WC, and each metallic fill material portion may include W, Cu, Al, Co, Ru, Mo, Ta, Ti, alloys thereof, and/or combinations thereof. Other suitable metallic liner and metallic fill materials within the contemplated scope of disclosure may also be used. In one embodiment, the first metal via structures 622 and the second metal line structures 628 may be formed as integrated line and via structures by a dual damascene process. The dielectric material layers (601, 610, 620) are herein referred to as lower-level dielectric material layers. The metal interconnect structures (612, 618, 622, 628) formed within in the lower-level dielectric material layers are herein referred to as lower-level metal interconnect structures.

While the present disclosure is described using an embodiment in which an array of memory cells may be formed over the second line-and-via-level dielectric material layer 620, embodiments are expressly contemplated herein in which the array of memory cells may be formed at a different metal interconnect level.

An array of transistors (e.g., thin-film transistors) and an array of ferroelectric memory cells may be subsequently deposited over the dielectric material layers (601, 610, 620) that have formed therein the metal interconnect structures (612, 618, 622, 628). The set of all dielectric material layer that are formed prior to formation of an array of transistors or an array of ferroelectric memory cells is collectively referred to as lower-level dielectric material layers (601, 610, 620). The set of all metal interconnect structures that is formed within the lower-level dielectric material layers (601, 610, 620) is herein referred to as first metal interconnect structures (612, 618, 622, 628). Generally, first metal interconnect structures (612, 618, 622, 628) formed within at least one lower-level dielectric material layer (601, 610, 620) may be formed over the semiconductor material layer 9 that is located in the substrate 8.

According to an aspect of the present disclosure, transistors (e.g., thin film transistors (TFTs)) may be subsequently formed in a metal interconnect level that overlies that metal interconnect levels that contain the lower-level dielectric material layers (601, 610, 620) and the first metal interconnect structures (612, 618, 622, 628). In one embodiment, a planar dielectric material layer having a uniform thickness may be formed over the lower-level dielectric material layers (601, 610, 620). The planar dielectric material layer is herein referred to as an insulating matrix layer 635. The insulating matrix layer 635 includes a dielectric material such as undoped silicate glass, a doped silicate glass, organosilicate glass, or a porous dielectric material, and may be deposited by chemical vapor deposition. The thickness of the insulating matrix layer 635 may be in a range from 20 nm to 300 nm, although lesser and greater thicknesses may also be used.

Generally, interconnect-level dielectric layers (such as the lower-level dielectric material layer (601, 610, 620)) containing therein the metal interconnect structures (such as the first metal interconnect structures (612, 618, 622, 628)) may be formed over semiconductor devices. The insulating matrix layer 635 may be formed over the interconnect-level dielectric layers.

Referring to FIGS. 2A-2C, a unit device area within the region of the first exemplary structure is illustrated. The unit device area corresponds to an area in which a transistor is subsequently formed. Optionally, body bias lines 112 may be formed in each unit device area. In this embodiment, line trenches may be formed in an upper portion of the insulating matrix layer 635, and may be filled with at least one metallic material to form the body bias lines 112. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the insulating matrix layer 635. Each remaining portion of the at least one metallic material comprises a body bias line 112, which may be subsequently used to electrically bias the body, i.e., the channel, of a thin film transistor. The body bias lines 112 may laterally extend along the first horizontal direction hd1 or along the second horizontal direction hd2. The height of the body bias lines 112 may be in a range from 10 nm to 300 nm, such as from 30 nm to 100 nm, although lesser and greater heights may also be used.

Referring to FIGS. 3A-3C, an insulating layer 42 may be deposited over the insulating matrix layer 635. The insulating layer 42 includes an insulating material such as undoped silicate glass, a doped silicate glass, silicon oxynitride, silicon nitride, silicon carbide nitride, organosilicate glass, or a combination or a stack thereof. The thickness of the insulating layer 42 may be in a range from 10 nm to 300 nm, such as from 30 nm to 100 nm, although lesser and greater thicknesses may also be used.

A body contact cavity 111 may be optionally formed within each unit device area, for example, by applying and patterning a photoresist layer over the insulating layer 42 to form an opening in the photoresist layer, and by transferring the pattern of the opening through the insulating layer 42 by performing an anisotropic etch process in which the patterned photoresist layer is used as an etch mask. A top surface of body bias line 112 may be physically exposed at the bottom of each body contact cavity 111. The photoresist layer may be subsequently removed, for example, by ashing.

Referring to FIGS. 4A-4C, each body contact cavity 111 may be filled with at least one metallic material to form a body contact via structure 115 therein. In one embodiment, the at least one metallic fill material may comprise a combination of a metallic liner layer including a metallic barrier material and a metallic fill material layer including a metallic fill material. The metallic liner layer may comprise a metallic barrier material such as TiN, TaN, WN, TiC, TaC, WC, or a stack thereof, and may be deposited by physical vapor deposition or chemical vapor deposition. The thickness of the metallic liner layer may be in a range from 1 nm to 30 nm, although lesser and greater thicknesses may also be used. The metallic fill material layer may comprise W, Cu, Al, Co, Ru, Mo, Ta, Ti, alloys thereof, and/or combinations thereof. A planarization process, such as a chemical mechanical polishing (CMP) process, may be performed to remove portions of the metallic liner layer and the metallic fill material layer that overlie the horizontal plane including the top surface of the insulating layer 42. Each remaining portion of the at least one metallic material comprises a body contact via structure 115, which may be subsequently used to electrically bias the body, i.e., the channel, of a transistor. The top surface of each body contact via structure 115 may be within the same plane as the top surface of the insulating layer 42.

Referring to FIGS. 5A-5C, a continuous active layer 20L and a gate dielectric layer 30L may be sequentially deposited over the body contact via structures 115 and the insulating layer 42. In one embodiment, the semiconducting material includes a material providing electrical conductivity in a range from 1.0 S/cm to $1.0 \times 10^5$ S/cm upon suitable doping with electrical dopants (which may be p-type dopants or n-type dopants). Exemplary semiconducting materials that may be used for the continuous active layer 20L include, but are not limited to, indium gallium zinc oxide (IGZO), indium tungsten oxide, indium zinc oxide, indium tin oxide, gallium oxide, indium oxide, doped zinc oxide, doped indium oxide (such as tungsten-doped indium oxide), doped cadmium oxide, and various other doped variants derived therefrom. Other suitable semiconducting materials are within the contemplated scope of disclosure. In one embodiment, the semiconducting material of the continuous active layer 20L may include indium gallium zinc oxide.

The continuous active layer 20L may include a polycrystalline semiconducting material, or an amorphous semiconducting material that may be subsequently annealed into a polycrystalline semiconducting material having a greater average grain size. The continuous active layer 20L may be deposited by physical vapor deposition although other suitable deposition processes may be used. The thickness of the continuous active layer 20L may be in a range from 1 nm to 100 nm, such as from 2 nm to 50 nm and/or from 3 nm to 20 nm, although lesser and greater thicknesses may also be used.

The gate dielectric layer 30L may be formed over the continuous active layer 20L by deposition of at least one gate dielectric material. The gate dielectric material may include, but is not limited to, silicon oxide, silicon oxynitride, a high-k dielectric metal oxide (such as hafnium oxide, zirconium oxide, hafnium zirconium oxide, titanium oxide, tantalum oxide, yttrium oxide, lanthanum oxide, aluminum oxide, etc.), or a stack thereof. Other suitable dielectric materials are within the contemplated scope of disclosure.

The gate dielectric material may be deposited by atomic layer deposition or chemical vapor deposition although other suitable deposition processes may be used. The thickness of the gate dielectric layer 30L may be in a range from 1 nm to 15 nm, such as from 2 nm to 6 nm, although lesser and greater thicknesses may also be used.

Figure 6A:
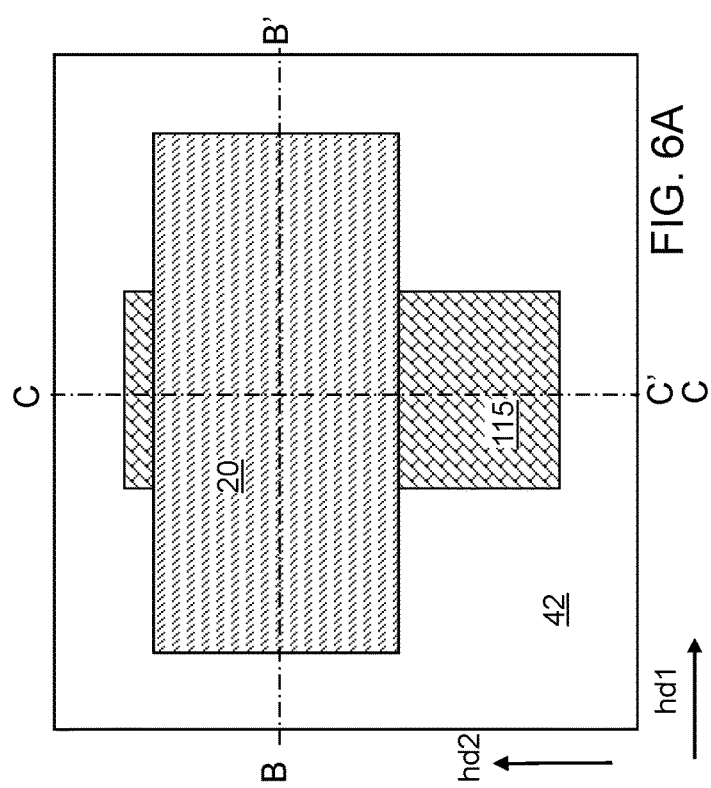
FIG. 6A is a top-down view of the region of the first exemplary structure after formation of a stack of a top gate dielectric and an active layer according to the first embodiment of the present disclosure.
Figure 6C:
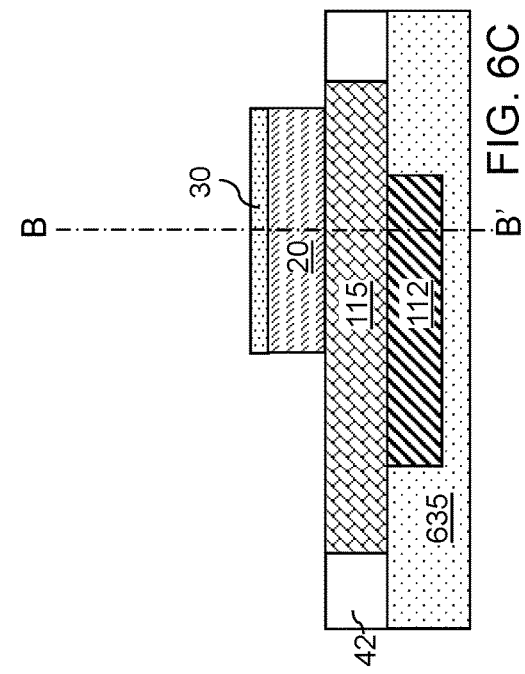
FIG. 6C is a vertical cross-sectional view of the first exemplary structure along the vertical plane C-C' of FIG. 6A.
Figure 6B:
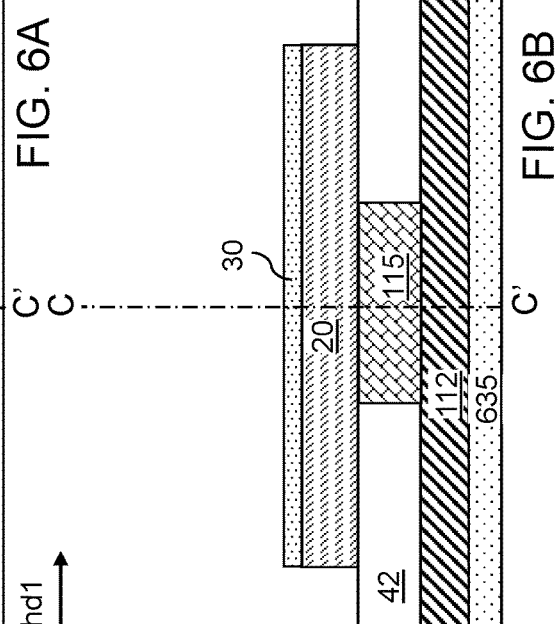
FIG. 6B is a vertical cross-sectional view of the first exemplary structure along the vertical plane B-B' of FIG. 6A.

Referring to FIGS. 6A-6C, a photoresist layer (not shown) may be applied over the gate dielectric layer 30L, and may be lithographically patterned to form discrete patterned photoresist material portion. Each patterned portion of the photoresist layer may be located within the area of a respective one of the unit device areas. The area of each patterned portion of the photoresist layer may define the area of a semiconducting metal oxide portion to be subsequently patterned from the continuous active layer 20L. In one embodiment, each patterned portion of the photoresist layer may have a horizontal cross-sectional shape of a rectangle or a rounded rectangle.

The pattern in the photoresist layer may be transferred through the gate dielectric layer 30L and the continuous active layer 20L by performing an anisotropic etch process. Patterned portions of the gate dielectric layer 30L comprise gate dielectrics 30. Patterned portion of the continuous active layer 20L comprise active layers 20, which may comprise semiconducting metal oxide plates having a uniform thickness throughout. Sidewalls of the active layer 20 and the gate dielectric 30 within each layer stack (20, 30) may be vertically coincident, i.e., may be located within a same vertical plane. The photoresist layer may be subsequently removed, for example, by ashing.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used.

According to various embodiments of the present disclosure, a gate electrode, a metal oxide liner, a gate dielectric 30, and an active layer 20 may be sequentially formed (for example, in a spatial order along a vertical direction) over a substrate 8 in a forward order or in a reverse order. In the first exemplary structure illustrated in FIGS. 6A-6C, an active layer 20 and a gate dielectric 30 may be formed from bottom to top, and the metal oxide liner and the gate electrode may be formed in subsequent processing steps. A body contact via structure 115 may contact a surface of the active layer 20.

Referring to FIGS. 7A-7C, a dielectric layer 48 may be deposited over the gate dielectric 30. The dielectric layer 48 is also referred to as an electrode-level dielectric layer. The dielectric layer 48 includes a dielectric material such as undoped silicate glass, a doped silicate glass, organosilicate glass, silicon oxynitride, or a stack thereof. Optionally, the dielectric layer 48 may be planarized to provide a flat top surface. The set of the insulating layer 42 and the dielectric layer 48 is herein referred to as a thin-film-transistor-level (TFT-level) dielectric layer 40, i.e., a dielectric layer that is located at the level of thin film transistors. The dielectric layer 48 may comprise the same dielectric material as, or may comprise a different dielectric material from, the dielectric material of the insulating layer 42. The thickness of the dielectric layer 48 as measured from above the gate dielectric 30 may be in a range from 1 nm to 1,000 nm, such as from 10 nm to 500 nm, and/or from 100 nm to 300 nm, although lesser and greater thicknesses may also be used.

Referring to FIGS. 8A-8C, a photoresist layer (not shown) may be applied over the TFT-level dielectric layer 40, and may be lithographically patterned to form discrete openings therein. The pattern of the openings in the photoresist layer include a pair of openings overlying end portions of the active layer 20. The pattern of the discrete openings in the photoresist layer may be transferred through the dielectric layer 48 and the gate dielectric 30 by an anisotropic etch process to form a source cavity 51 and a drain cavity 59. The lateral spacing between the source cavity 51 and the drain cavity 59 may be greater than the width of the body contact via structure 115 along the first horizontal direction hd1. The anisotropic etch process may be selective to the material of the active layer 20. However, due to finite selectivity of the anisotropic etch process used to form the source cavity 51 and the drain cavity 59, surfaces of the active layer 20 may be vertically recessed underneath the source cavity 51 and the drain cavity 59. The vertical recess distance may be in a range from 0.1 nm to 6 nm, such as from 0.3 nm to 3 nm, although lesser and greater vertical recess distances may also be used. The photoresist layer may be subsequently removed, for example, by ashing.

Referring to FIGS. 9A-9C, at least one conductive material may be deposited in the cavities (51, 59) and over the TFT-level dielectric layer 40. The at least one conductive material may include a metallic liner material and a metallic fill material. The metallic liner material may include a conductive metallic nitride or a conductive metallic carbide such as TiN, TaN, WN, TiC, TaC, and/or WC. The thickness of the metallic liner may be in a range from 1 nm to 100 nm, such as from 3 nm to 30 nm, although lesser and greater thicknesses may also be used. The metallic fill material may include W, Cu, Al, Co, Ru, Mo, Ta, Ti, alloys thereof, and/or combinations thereof. Other suitable materials within the contemplated scope of disclosure may also be used.

Excess portions of the at least one conductive material may be removed from above the horizontal plane including the top surface of the TFT-level dielectric layer 40 by a planarization process, which may use a CMP process and/or a recess etch process. Other suitable planarization processes may be used. Each remaining portion of the at least one conductive material filling a source cavity 51 constitutes a source electrode 52. Each remaining portion of the at least one conductive material filling a drain cavity 59 constitutes a drain electrode 56.

In one embodiment, each source electrode 52 may include a source metallic liner 53 that is a remaining portion of the metallic liner material, and a source metallic fill material portion 54 that is a remaining portion of the metallic fill material. Each drain electrode 56 may include a drain metallic liner 57 that is a remaining portion of the metallic liner material, and a drain metallic fill material portion 58 that is a remaining portion of the metallic fill material. The height of the source metallic fill material portion 54 and the drain metallic fill material portion 58 may be in a range from 1 nm to 1,000 nm, such as from 10 nm to 300 nm, and/or from 30 nm to 100 nm, although lesser and greater heights may also be used.

Generally, the source electrode 52 and the drain electrode 56 may be formed through the gate dielectric 30 on a respective surface segment of the active layer 20. The source electrode 52 and the drain electrode 56 may be formed on peripheral portions of the active layer 20, and are laterally spaced from each other by the gate electrode 15. The source electrode 52 contacts a first end portion of the active layer 20, and the drain electrode 56 contacts a second end portion of the active layer 20.

In one embodiment, the gate dielectric 30 laterally extends between, and contacts sidewalls of, the source electrode 52 and the drain electrode 56. The dielectric layer 48 laterally surrounds the active layer 20, the source electrode 52, the drain electrode 56, and contacts the entirety of a top surface of the gate dielectric 30. In one embodiment, the top surfaces of the source electrode 52 and the drain electrode 56 are located within a same horizontal plane as a top surface of the dielectric layer.

Referring to FIGS. 10A-10C, a gate cavity 39 may be formed by recessing a portion of the dielectric layer 48 that overlie a middle portion of the active layer 20 within each unit device area. For example, a photoresist layer (not shown) may be applied over the dielectric layer 48, and may be lithographically patterned to form an opening that overlies a portion of the active layer 20 located between the source electrode 52 and the drain electrode 56 within each unit device area. An anisotropic etch process may be performed to etch portions of the dielectric layer 48 that underlie the openings in the photoresist layer. For example, if the dielectric layer 48 comprises silicon oxide and if the gate dielectric 30 comprises a dielectric metal oxide material, the anisotropic etch process may etch silicon oxide selective to the dielectric metal oxide material of the gate dielectric 30. A gate cavity 39 may be formed underneath each opening in the photoresist layer. A top surface of a gate dielectric 30 is physically exposed at the bottom of each gate cavity 39. The photoresist layer may be subsequently removed, for example, by ashing.

Figure 11A:
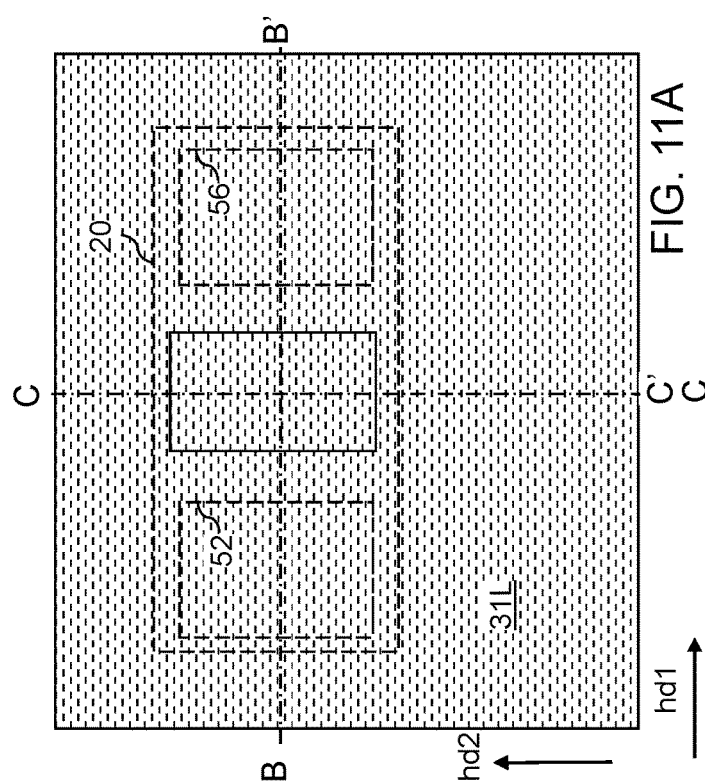
FIG. 11A is a top-down view of the region of the first exemplary structure after formation of a continuous metal oxide liner according to the first embodiment of the present disclosure.
Figure 11C:
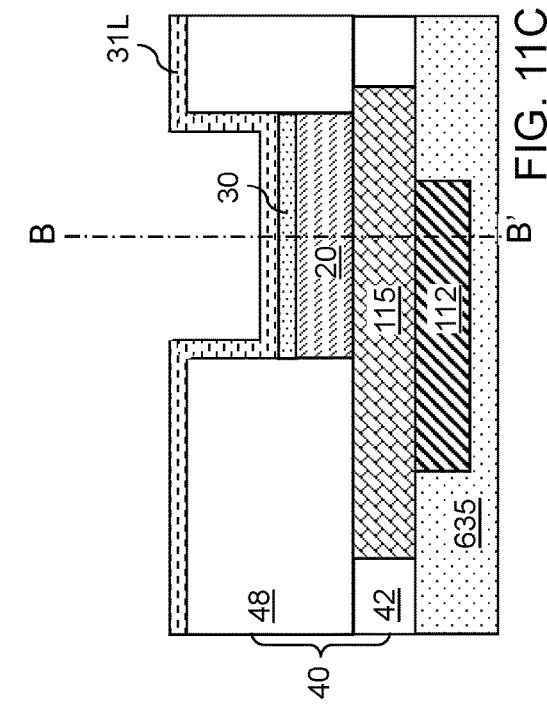
FIG. 11C is a vertical cross-sectional view of the first exemplary structure along the vertical plane C-C' of FIG. 11A.
Figure 11B:
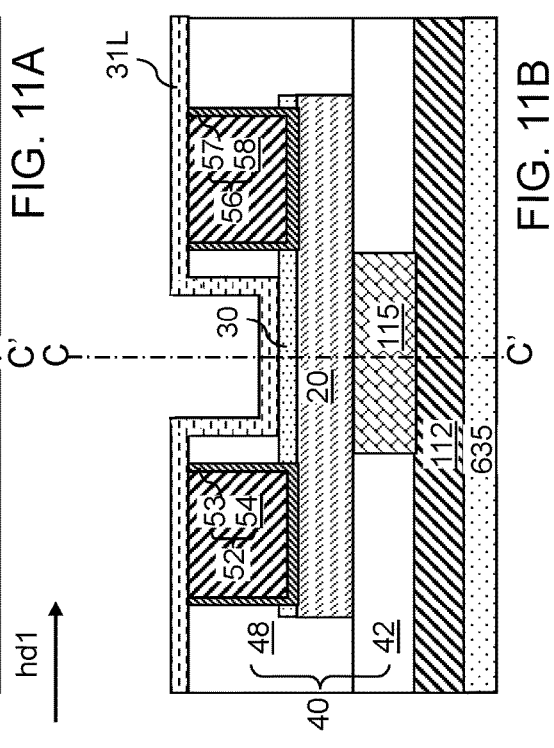
FIG. 11B is a vertical cross-sectional view of the first exemplary structure along the vertical plane B-B' of FIG. 11A.

Referring to FIGS. 11A-11C, a continuous metal oxide liner 31L may be deposited in each of the gate cavities 39 and over the top surface of the dielectric layer 48 by conformal deposition of a semiconducting metal oxide material. The semiconducting metal oxide material of the continuous metal oxide liner 31L may use any material that may be used for the active layer 20. In one embodiment, the semiconducting metal oxide material of the continuous metal oxide liner 31L may comprise, and/or may consist essentially of, a material selected from indium gallium zinc oxide (IGZO), indium tungsten oxide, indium zinc oxide, indium tin oxide, gallium oxide, indium oxide, doped zinc oxide, doped indium oxide (such as tungsten-doped indium oxide), and doped cadmium oxide. The continuous metal oxide liner 31L may be deposited, for example, by atomic layer deposition.

The continuous metal oxide liner 31L may have a thickness in a range from 0.1 nm to 3 nm, such as from 0.2 nm to 2 nm, and/or from 0.3 nm to 1 nm. Generally, the continuous metal oxide liner 31L may be thin enough so that the entirety of a portion of the continuous metal oxide liner 31L that is proximal to a gate electrode absorbs sufficient amount of hydrogen atoms and becomes highly conductive, and may be thick enough so that the continuous metal oxide liner 31L may effectively block hydrogen diffusion. It is believed that a thickness of at least 0.1 nm, and preferably at least 0.3 nm is necessary for the semiconducting metal oxide material of the continuous metal oxide liner 31L to effectively function as a hydrogen barrier structure. Also, it is believed that a thickness that does not exceed 3 nm, and preferably does not exceed 2 nm and/or 1 nm, is conductive to absorption of a sufficient quantity of hydrogen atoms from surrounding dielectric material portions (such as silicon oxide) to ensure that the continuous metal oxide liner 31L becomes highly conductive.

Generally, the active layer 20 may be thicker than the continuous metal oxide liner 31L. In one embodiment, the active layer 20 has a thickness that is at least three times, such as at least six time and preferably at least ten times, the thickness of the continuous metal oxide liner 31L. A thickness of the active layer 20 that is at least three times the thickness of the continuous metal oxide liner 31L ensures that the electrical conductivity of the semiconducting metal oxide material of the active layer 20 is in an optimal semiconducting regime, while the electrical conductivity of the continuous metal oxide liner 31L is more conductive than the material of the active layer 20. Further, in embodiments in which the material of the continuous metal oxide liner 31L has high conductivity, an increase in the effective dielectric thickness between the active layer 20 and a gate electrode to be subsequently formed may be avoided.

Referring to FIGS. 12A-12C, at least one conductive material may be deposited in remaining volumes of the gate cavities 39 and over the dielectric layer 48. The at least one conductive material may include an optional metallic liner material and a metallic fill material. The optional metallic liner material, if present, may include a conductive metallic nitride or a conductive metallic carbide such as TiN, TaN, WN, TiC, TaC, and/or WC. The thickness of the metallic liner may be in a range from 1 nm to 100 nm, such as from 3 nm to 10 nm, although lesser and greater thicknesses may also be used. The metallic fill material may include W, Cu, Al, Co, Ru, Mo, Ta, Ti, TiAl, Pt, other high work function metals known in the art, alloys thereof, and/or combinations thereof. Other suitable materials within the contemplated scope of disclosure may also be used.

Portions of the at least one conductive material and portions of the continuous metal oxide liner 31L that overlie a horizontal plane including the top surface of the dielectric layer 48 may be removed by a planarization process, which may use a CMP process and/or a recess etch process. Other suitable planarization processes may be used. Each remaining portion of the at least one conductive material filling a gate cavity 39 constitutes a gate electrode 35. Each remaining portion of the continuous metal oxide liner 31L constitutes a metal oxide liner that may be conformally formed on sidewalls of a gate cavity 39, and is herein referred to as a conformal metal oxide liner 31.

The conformal metal oxide liner 31 comprises a planar portion contacting a planar top surface of the gate dielectric 30, and a tubular portion adjoined to a periphery of the planar portion and contacting surfaces (i.e., sidewalls) of the dielectric layer 48. The tubular portion has a set of vertical outer sidewalls that are adjoined to one another, and a set of inner sidewalls that are adjoined to one another and are laterally offset inward from the set of vertical outer sidewalls by a uniform lateral offset distance, which may be the same as the thickness of the conformal metal oxide liner 31. The gate electrode 35 may be formed over the conformal metal oxide liner 31.

In one embodiment, the dielectric layer 48 may be located on the gate dielectric 30 and the active layer 20. A source electrode 52 and a drain electrode 56 may be located on end portions of the active layer 20 and may be embedded in the dielectric layer 48. The conformal metal oxide liner 31 contacts the gate dielectric 30, and is embedded in the dielectric layer 48.

Referring to FIGS. 13A-13C, an upper dielectric material layer 70 may be deposited over the dielectric layer 48. The upper dielectric material layer 70 includes a dielectric material such as undoped silicate glass, a doped silicate glass, organosilicate glass, silicon nitride, silicon carbide nitride, silicon oxynitride, or combinations thereof, and may have a thickness in a range from 50 nm to 600 nm, such as from 100 nm to 300 nm, although lesser and greater thicknesses may also be used. Upper-level metal interconnect structures (72, 75, 76) may be formed in the upper dielectric material layer 70. The upper-level metal interconnect structures (72, 75, 76) may comprise metal via structures and metal line structures that are sequentially formed, for example, by performing two single damascene metal patterning sequences, or may comprise integrated metal line and via structures that may be formed by performing a dual damascene metal patterning sequence. In one embodiment, the upper-level metal interconnect structures (72, 75, 76) may comprise a source contact via structure 72 contacting the source electrode 52, a drain contact via structure 76 contacting the drain electrode 56, and a gate contact via structure 75 contacting the gate electrode 35.

Figure 14C:
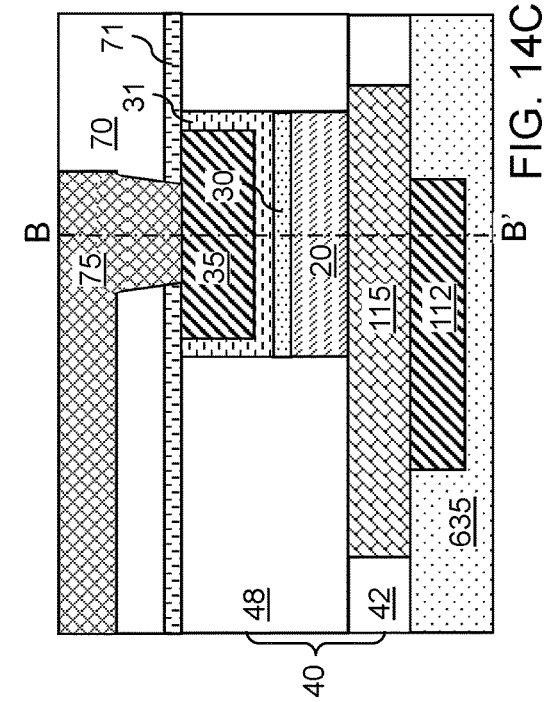
FIG. 14C is a vertical cross-sectional view of the second exemplary structure along the vertical plane C-C' of FIG. 14A.
Figure 14A:
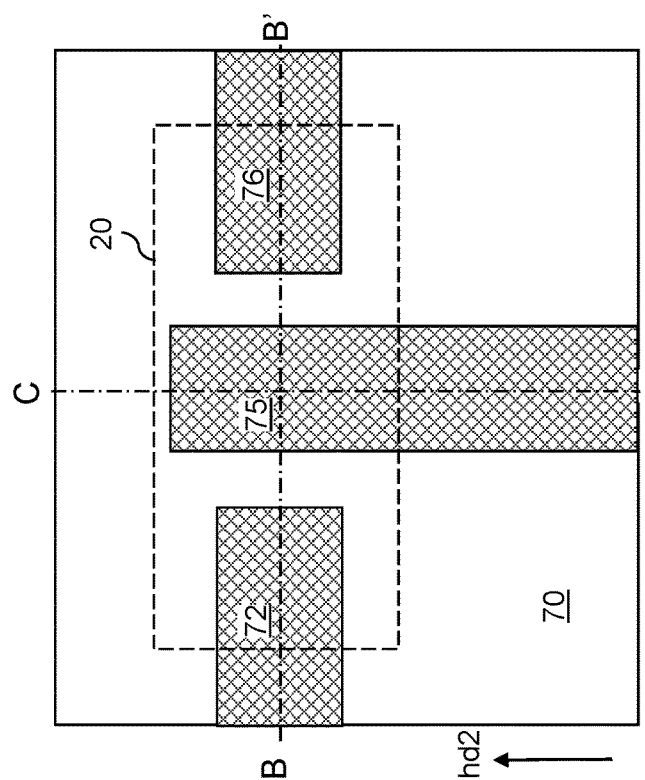
FIG. 14A is a top-down view of a portion of a region of a second exemplary structure according to a second embodiment of the present disclosure.
Figure 14B:
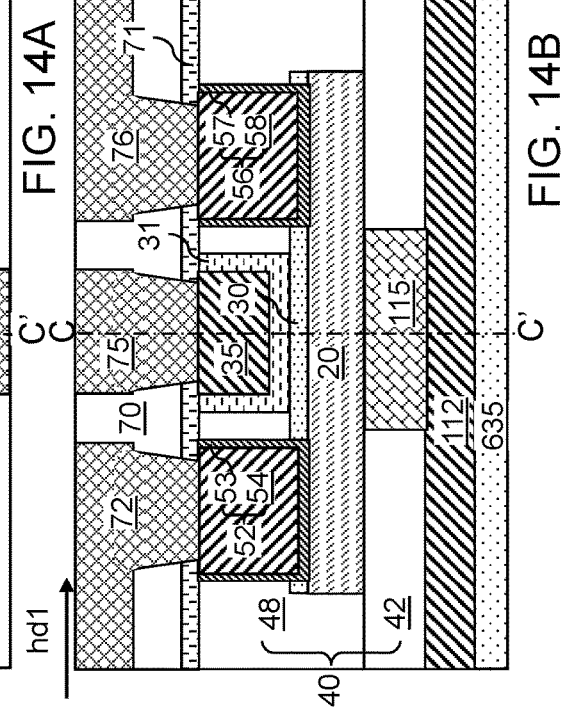
FIG. 14B is a vertical cross-sectional view of the second exemplary structure along the vertical plane B-B' of FIG. 14A.

Referring to FIGS. 14A-14C, a second exemplary structure according to a second embodiment of the present disclosure may be derived from the first exemplary structure of FIGS. 13A-13C by forming an additional metal oxide liner directly on a top surface of the dielectric layer 48 and on top surfaces of the source electrode 52, the drain electrode 56, the gate electrode 35, and the conformal metal oxide liner 31 prior to deposition of the upper dielectric material layer 70. The additional metal oxide liner is planar (i.e., comprises a planar top surface located entirely within a horizontal plane and a planar bottom surface located entirely within another horizontal plane), and is herein referred to as a planar metal oxide liner 71.

The planar metal oxide liner 71 may comprise any material that may be used for the conformal metal oxide liner 31. The material of the planar metal oxide liner 71 may be the same as, or may be different from, the material of the conformal metal oxide liner 31. The thickness of the planar metal oxide liner 71 may be in a range from 0.1 nm to 3 nm, such as from 0.2 nm to 2 nm, and/or from 0.3 nm to 1 nm. The same considerations for the thickness of the continuous metal oxide liner 31L apply to the thickness of the planar metal oxide liner 71. Optionally, the planar metal oxide liner 71 may be patterned prior to deposition of the upper dielectric material layer 70 so that each patterned portion of the planar metal oxide liner 71 covers the entire area of an underlying conformal metal oxide liner 31.

In one embodiment, the planar metal oxide liner 71 extends horizontally parallel to an interface between the active layer 20 and the gate dielectric 30, and contacts a planar surface of the gate electrode 35 that is not in contact with the conformal metal oxide liner 31. All sidewalls and a bottom surface of the gate electrode 35 may be in contact with the conformal metal oxide liner 31.

In one embodiment, the planar metal oxide liner 71 comprises, and/or consists essentially of, a material selected from indium gallium zinc oxide (IGZO), indium tungsten oxide, indium zinc oxide, indium tin oxide, gallium oxide, indium oxide, doped zinc oxide, doped indium oxide, and doped cadmium oxide. In one embodiment, the planar metal oxide liner 71 has a thickness in a range from 0.1 nm to 3 nm, and the active layer 20 has a thickness that is at least three times the thickness of the planar metal oxide liner 71. A top surface of vertically-extending portions (i.e., a tubular portion) of the conformal metal oxide liner 31 contacts a bottom surface of the planar metal oxide liner 71.

In one embodiment, the gate electrode 35 may be embedded in a dielectric material portion such as the dielectric layer 48, the planar metal oxide liner 17 may contact first surfaces of the dielectric material portion (such as the dielectric layer 48), and the gate dielectric 30 contacts second surfaces of the dielectric material portion (such as sidewalls of the dielectric layer 48).

Referring to FIGS. 15A-15C, a third exemplary structure according to a third embodiment of the present disclosure is illustrated after formation of a word line 12, an insulating layer 42, a gate cavity 11, and a continuous metal oxide liner 13L. The word line 12 may be formed in the same manner as the body bias line 112 described above. However, whereas the body bias line 112 may be used to electrically bias a channel region of the active layer 20 independently, the word line 12 may be subsequently used to electrically bias a gate electrode to be subsequently formed. The word line 12 may laterally extend along any horizontal direction such as the first horizontal direction hd1 and the second horizontal direction hd2. The gate cavity 11 may be formed in the same manner as the body contact cavity 111 (see FIGS. 3A-3C above). However, the lateral dimensions of the gate cavity 11 may be selected such that the gate cavity 11 laterally extends across an active region to be subsequently formed along a direction that is perpendicular to the channel direction (i.e., the direction of current flow in the active region to be subsequently formed).

The continuous metal oxide liner 13L may have the same material composition and the same thickness as the continuous metal oxide liner 31L described above, and may be formed by a conformal deposition process such as an atomic layer deposition process. The considerations for the thickness range for the continuous metal oxide liner 13L are the same as the considerations for the thickness range for the continuous metal oxide liner 31L.

Referring to FIGS. 16A-16C, at least one conductive material may be deposited in remaining volumes of the gate cavities 11 and over the insulating layer 42. The at least one conductive material may include an optional metallic liner material and a metallic fill material. The optional metallic liner material, if present, may include a conductive metallic nitride or a conductive metallic carbide such as TiN, TaN, WN, TiC, TaC, and/or WC. The thickness of the metallic liner may be in a range from 1 nm to 100 nm, such as from 3 nm to 10 nm, although lesser and greater thicknesses may also be used. The metallic fill material may include W, Cu, Al, Co, Ru, Mo, Ta, Ti, TiAl, Pt, other high work function metals known in the art, alloys thereof, and/or combinations thereof. Other suitable materials within the contemplated scope of disclosure may also be used.

Portions of the at least one conductive material and portions of the continuous metal oxide liner 13L that overlie a horizontal plane including the top surface of the insulating layer 42 may be removed by a planarization process, which may use a CMP process and/or a recess etch process. Other suitable planarization processes may be used. Each remaining portion of the at least one conductive material filling a gate cavity 11 constitutes a gate electrode 15. Each remaining portion of the continuous metal oxide liner 13L constitutes a metal oxide liner that is conformally formed on sidewalls of a gate cavity 11, and is herein referred to as a conformal metal oxide liner 13.

The conformal metal oxide liner 13 comprises a planar portion contacting a planar top surface of the word line 12, and a tubular portion adjoined to a periphery of the planar portion and contacting surfaces (i.e., sidewalls) of the insulating layer 42. The tubular portion has a set of vertical outer sidewalls that are adjoined to one another, and a set of inner sidewalls that are adjoined to one another any laterally offset inward from the set of vertical outer sidewalls by a uniform lateral offset distance, which may be the same as the thickness of the conformal metal oxide liner 13. The gate electrode 15 is formed over the conformal metal oxide liner 13.

In one embodiment, the conformal metal oxide liner 13 may be formed on a bottom surface and sidewalls of the gate cavity 11, and the gate electrode 15 may be formed on the conformal metal oxide liner 13 within the insulating layer 42. Top surfaces of the conformal metal oxide liner 13, the gate electrode 15, and the insulating layer 42 may be located within a same horizontal plane. All sidewalls and a bottom surface of the gate electrode 15 may be in contact with the conformal metal oxide liner 13.

Referring to FIGS. 17A-17C, a planar metal oxide liner 17 may be subsequently deposited on the top surfaces of the conformal metal oxide liner 13, the gate electrode 15, and the insulating layer 42. The planar metal oxide liner 17 may comprise any material that may be used for the conformal metal oxide liner 13. The material of the planar metal oxide liner 17 may be the same as, or may be different from, the material of the conformal metal oxide liner 13. The thickness of the planar metal oxide liner 17 may be in a range from 0.1 nm to 3 nm, such as from 0.2 nm to 2 nm, and/or from 0.3 nm to 1 nm. The same considerations for the thickness of the continuous metal oxide liner 13L apply to the thickness of the planar metal oxide liner 17. Optionally, the planar metal oxide liner 17 may be patterned so that each patterned portion of the planar metal oxide liner 17 covers the entire area of an underlying conformal metal oxide liner 13.

In one embodiment, the planar metal oxide liner 17 comprises, and/or consists essentially of, a material selected from indium gallium zinc oxide (IGZO), indium tungsten oxide, indium zinc oxide, indium tin oxide, gallium oxide, indium oxide, doped zinc oxide, doped indium oxide, and doped cadmium oxide. In one embodiment, the planar metal oxide liner 17 has a thickness in a range from 0.1 nm to 3 nm. A top surface of vertically-extending portions (i.e., a tubular portion) of the conformal metal oxide liner 13 contacts a bottom surface of the planar metal oxide liner 17.

A gate dielectric layer 10L may be deposited directly on the top surface of the planar metal oxide liner 17. The gate dielectric layer 10L may have the same material composition and the same thickness as the gate dielectric layer 30L described above.

A continuous active layer 20L may be subsequently deposited over the planar metal oxide liner 17. The continuous active layer 20L may have the same material composition and the same thickness as described above. The continuous active layer 20L has a thickness that is at least three times the thickness of the planar metal oxide liner 17. The continuous active layer 20L may have a thickness that is at least three times the thickness of the conformal metal oxide liner 13.

Referring to FIGS. 18A-18C, a photoresist layer (not shown) may be applied over the continuous active layer 20L, and may be lithographically patterned to form discrete patterned photoresist material portion. Each patterned portion of the photoresist layer may be located within the area of a respective one of the unit device areas. The area of each patterned portion of the photoresist layer may define the area of a semiconducting metal oxide portion to be subsequently patterned from the continuous active layer 20L. In one embodiment, each patterned portion of the photoresist layer may have a horizontal cross-sectional shape of a rectangle or a rounded rectangle.

The pattern in the photoresist layer may be transferred through the continuous active layer 20L, the gate dielectric layer 10L and optionally the planar metal oxide liner 17 by performing an anisotropic etch process. Patterned portion of the continuous active layer 20L comprise active layers 20, which may comprise semiconducting metal oxide plates having a uniform thickness throughout. Patterned portions of the gate dielectric layer 10L comprise gate dielectrics 10. The planar metal oxide liner 17 may, or may not, be patterned by the anisotropic etch process. Sidewalls of the active layer 20 and the gate dielectric 10 within each layer stack (20, 10, 17) may be vertically coincident, i.e., may be located within a same vertical plane. In embodiments in which the planar metal oxide liner 17 is patterned, sidewalls of the planar metal oxide liner 17 may be vertically coincident with sidewalls of the active layer 20 and the gate dielectric 10. The photoresist layer may be subsequently removed, for example, by ashing.

In one embodiment, each active layer 20 may have a horizontal cross-sectional shape of a rectangle or a rounded rectangle. In one embodiment, each active layer 20 may have a lateral dimension along the first horizontal direction hd1 in a range from 60 nm to 1,000 nm, such as from 100 nm to 300 nm, although lesser and greater lateral dimensions may also be used. In one embodiment, each active layer 20 may have a lateral dimension along the second horizontal direction hd2 in a range from 20 nm to 500 nm, such as from 40 nm to 250 nm, although lesser and greater lateral dimensions may also be used. The ratio of the lateral dimension along the first horizontal direction hd1 to the lateral dimension along the second horizontal direction hd2 in each active layer 20 may be in a range from 0.5 to 4, such as from 1 to 2, although lesser and greater ratios may also be used.

According to various embodiments of the present disclosure, a gate electrode 15, a metal oxide liner such as the planar metal oxide liner 17, a gate dielectric 10, and an active layer 20 may be formed (for example, in a spatial order along a vertical direction) over a substrate 8 in a forward order or in a reverse order. In the third exemplary structure, the order is a forward order.

In one embodiment, the planar metal oxide liner 17 comprises a horizontal surface that contacts an entirety of a horizontal surface (such as the top surface) of the gate dielectric 10. In one embodiment, a word line 12 may contact a bottom surface of the gate electrode 15 and may have a lateral extent along a lengthwise direction that is greater than a lateral extent of the active layer 20 along the lengthwise direction (such as the channel direction) of the active layer 20 in a plan view.

Referring to FIGS. 19A-19C, the processing steps of FIGS. 7A-7C may be performed to form a dielectric layer 48.

Referring to FIGS. 20A-20C, the processing steps of FIGS. 8A-8C may be performed to form a source cavity 51 and a drain cavity 59 within each unit device area.

Referring to FIGS. 21A-21C, the processing steps of FIGS. 9A-9C may be performed to form a source electrode 52 and a drain electrode 56 within each unit device area.

Referring to FIGS. 22A-22C, the processing steps of FIGS. 13A-13C may be performed to form an upper dielectric material layer 70 and upper-level metal interconnect structures (72, 76). The upper-level metal interconnect structures (72, 76) may comprise metal via structures and metal line structures that are sequentially formed, for example, by performing two single damascene metal patterning sequences, or may comprise integrated metal line and via structures that may be formed by performing a dual damascene metal patterning sequence. In one embodiment, the upper-level metal interconnect structures (72, 76) may comprise a source contact via structure 72 contacting the source electrode 52 and a drain contact via structure 76 contacting the drain electrode 56.

Referring to FIGS. 23A-23C, a fourth exemplary structure according to a fourth embodiment of the present disclosure may be derived from the third exemplary structure of FIGS. 16A-16C by forming the planar metal oxide liner 17 over the gate electrode 15 by performing a subset of the processing steps of FIGS. 17A-17C, and subsequently patterning the planar metal oxide liner 17 such that the patterned planar metal oxide liner 17 covers the entire area of the gate electrode 15 and the conformal metal oxide liner 13.

Referring to FIGS. 24A-24C, a gate dielectric layer 10L and a continuous active layer 20L may be formed by performing a remaining set of processing steps of FIGS. 17A-17C. The processing steps of FIGS. 18A-18C, 19A-19C, 20A-20C, 21A-21C, and 22A-22C may be subsequently performed to provide the fourth exemplary structure illustrated in FIGS. 24A-24C.

Referring to FIGS. 25A-25C, an alternative configuration of the fourth exemplary structure according to the fourth embodiment of the present disclosure may be derived from the third exemplary structure illustrated in FIGS. 18A-18C by modifying the anisotropic etch process to avoid patterning of the planar metal oxide liner 17. In this embodiment, the chemistry of the step of the anisotropic etch process that etches the gate dielectric layer 10L may be modified to be selective to the material of the planar metal oxide liner 17, and the anisotropic etch process may be terminated after patterning the gate dielectric layer 10L and without patterning the planar metal oxide liner 17.

Referring to FIGS. 26A-26C, the processing steps of FIGS. 19A-19C, 20A 20C, 21A-21C, and 22A-22C may be subsequently performed to provide the alternative configuration of the illustrated fourth exemplary structure. In this configuration, the planar metal oxide liner 17 may comprise a region that laterally extends outside a periphery of the active layer in a plan view (i.e., a view along a direction that is perpendicular to the top surface of the substrate 8). Generally, the planar metal oxide liner 17 comprises a horizontal surface (such as a top surface) that contacts an entirety of a horizontal surface (such as a bottom surface) of the gate dielectric 10. In one embodiment, the gate electrode 15 is embedded in a dielectric material portion (such as the insulating layer 42), and the planar metal oxide liner 17 contacts surfaces of the dielectric material portion (such as the top surface of the insulating layer 42). The gate dielectric 10 may be vertically spaced from the dielectric material portion (such as the insulating layer 42) by the planar metal oxide liner 17.

Referring to FIGS. 27A-27C, a fifth exemplary structure according to a fifth embodiment of the present disclosure may be derived from the third exemplary structure illustrated in FIGS. 15A-15C by performing an anisotropic etch process that etches horizontally-extending portions of the continuous metal oxide liner 13L. A tubular vertically-extending portion of the continuous metal oxide liner 13L remains on sidewalls of each gate cavity 11. The tubular vertically-extending portion of the continuous metal oxide liner 13L is herein referred to as a tubular metal oxide liner 13'. Generally, the gate cavity 11 may be formed in an upper portion of the insulating layer 42, and the tubular metal oxide liner 13' may be formed on sidewalls of the gate cavity 11 by depositing and anisotropically etching the continuous metal oxide liner 13L.

Referring to FIGS. 28A-28C, the processing steps of FIGS. 16A-16C may be performed to form a gate electrode 15 in the remaining volume of the gate cavity 11. The bottom surface of the gate electrode 15 may contact a top surface of an underlying word line 12. Top surfaces of the insulating layer 42, the tubular metal oxide liner 13', and the gate electrode 15 may be formed within a same horizontal plane.

Referring to FIGS. 29A-29C, the processing steps of FIGS. 17A-17C may be performed to sequentially form a planar metal oxide liner 17, a gate dielectric layer 10L, and a continuous active layer 20L. The planar metal oxide liner 17 may be formed directly on a top surface of the tubular metal oxide liner 13'. In one embodiment, the tubular metal oxide liner 13' laterally surrounds the gate electrode 15. An inner periphery of a bottom surface of the tubular metal oxide liner 13' coincides with a periphery of a bottom surface of the gate electrode 15, and a top surface of the tubular metal oxide liner 13' contacts a bottom surface of the planar metal oxide liner 17.

Referring to FIGS. 30A-30C, the processing steps of FIGS. 18A-18C may be performed to form a stack of a planar metal oxide liner 17, a gate dielectric 10, and an active layer 20. Generally, the planar metal oxide liner 17 may, or may not, be patterned as described above. Further, the planar metal oxide liner 17 may be patterned to cover the area of the gate electrode 15 and the tubular metal oxide liner 13' prior to deposition of the gate dielectric layer 10L.

Referring to FIGS. 31A-31C, the processing steps of FIGS. 19A-19C may be performed to form a dielectric layer 48, and the processing steps of FIGS. 20A-20C may be performed to form a source cavity 51 and a drain cavity 59.

Referring to FIGS. 32A-32C, the processing steps of FIGS. 21A-21C may be performed to form a source electrode 52 and a drain electrode 56.

Figure 33A:
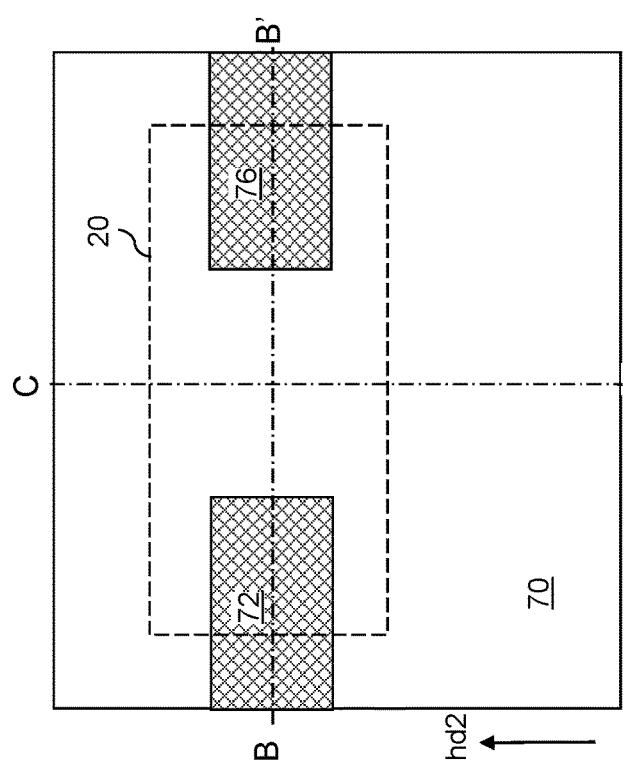
FIG. 33A is a top-down view of the region of the fifth exemplary structure after formation of an upper dielectric material layer and upper-level metal interconnect structures according to the fifth embodiment of the present disclosure.
Figure 33B:
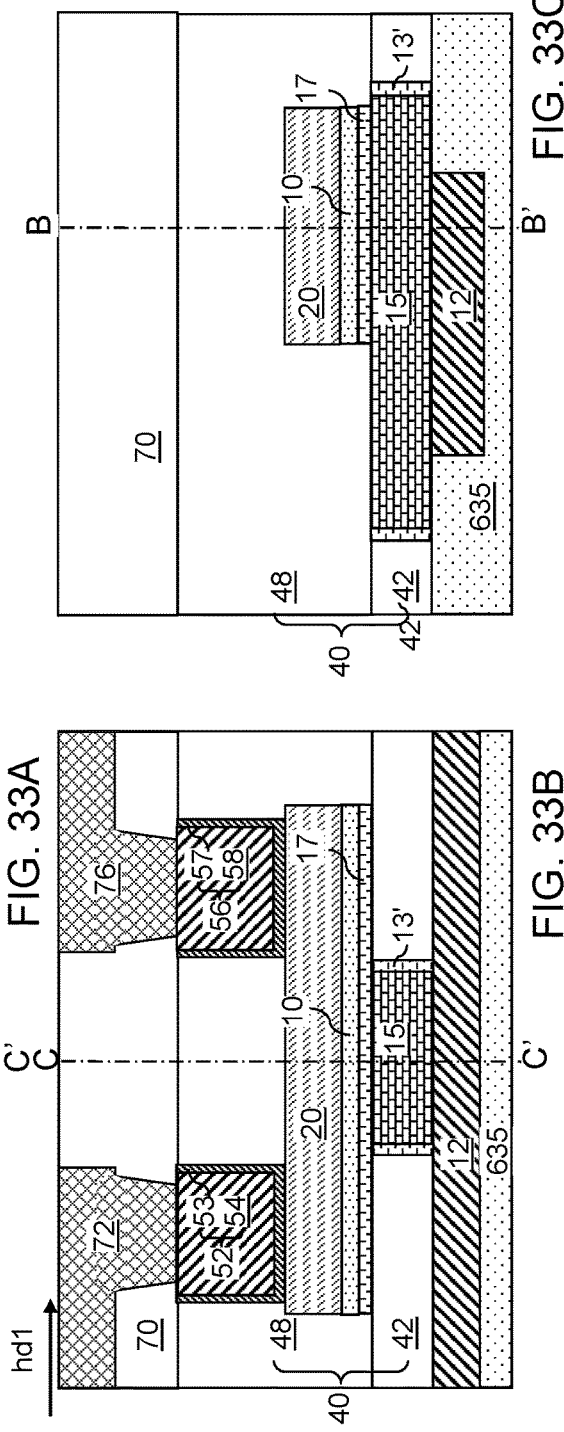
FIG. 33B is a vertical cross-sectional view of the fifth exemplary structure along the vertical plane B-B' of FIG. 33A.
Figure 33C:
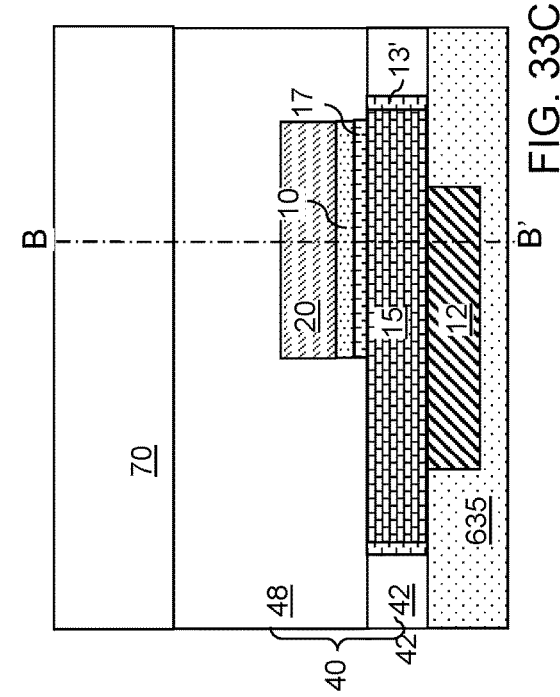
FIG. 33C is a vertical cross-sectional view of the fifth exemplary structure along the vertical plane C-C' of FIG. 33A.

Referring to FIGS. 33A-33C, the processing steps of FIGS. 22A-22C may be performed to form an upper dielectric material layer 70 and upper-level metal interconnect structures (72, 76).

Figure 34A:
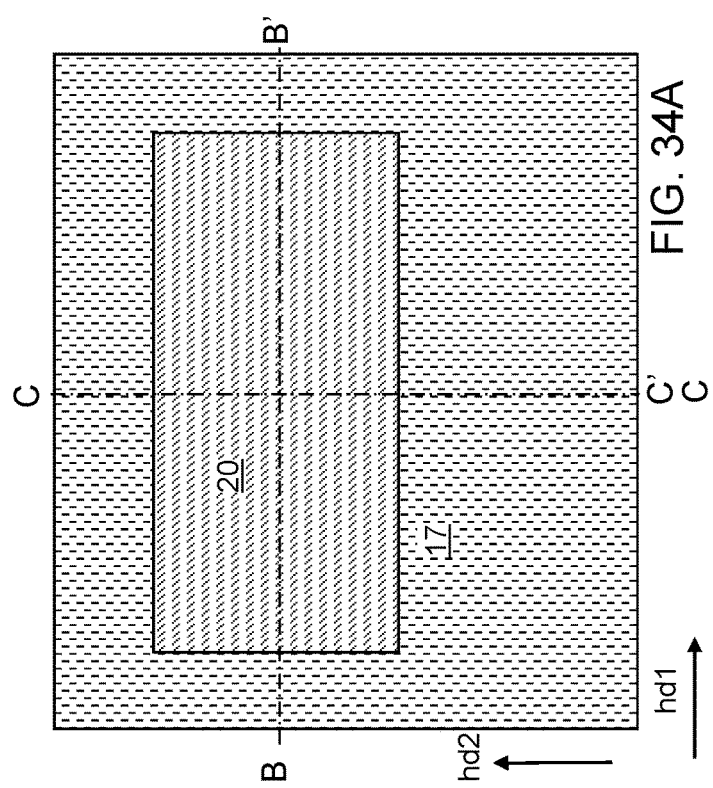
FIG. 34A is a top-down view of a portion of a region of an alternative configuration of the fifth exemplary structure after formation of a stack of a planar metal oxide liner, a gate dielectric, and an active layer according to the fifth embodiment of the present disclosure.
Figure 34C:
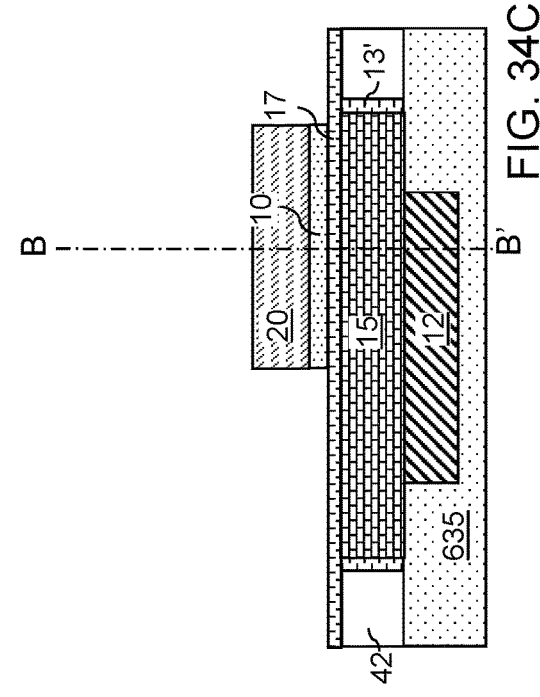
FIG. 34C is a vertical cross-sectional view of the fifth exemplary structure along the vertical plane C-C' of FIG. 34A.
Figure 34B:
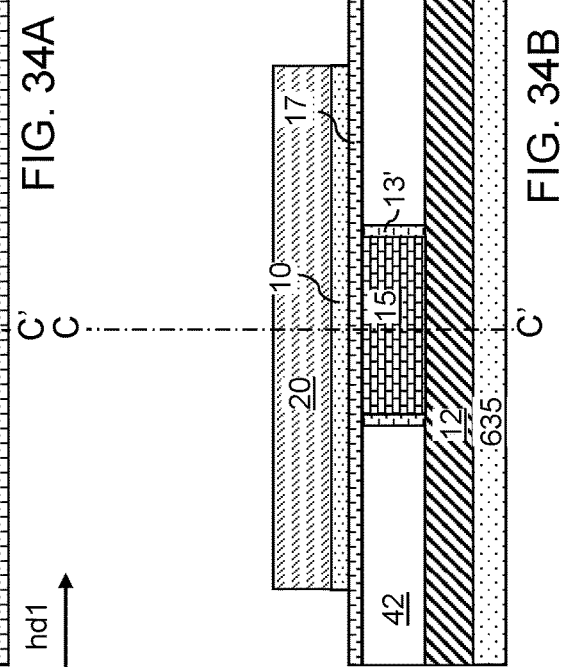
FIG. 34B is a vertical cross-sectional view of the fifth exemplary structure along the vertical plane B-B' of FIG. 34A.

Referring to FIGS. 34A-34C, an alternative configuration of the fifth exemplary structure according to the fifth embodiment of the present disclosure may be derived from the fifth exemplary structure of FIGS. 30A-30C by modifying the anisotropic etch process to avoid patterning of the planar metal oxide liner 17. In this embodiment, the chemistry of the step of the anisotropic etch process that etches the gate dielectric layer 10L may be modified to be selective to the material of the planar metal oxide liner 17, and the anisotropic etch process may be terminated after patterning the gate dielectric layer 10L and without patterning the planar metal oxide liner 17.

Referring to FIGS. 35A-35C, the processing steps of FIGS. 19A-19C, 20A-20C, 21A-21C, and 22A-22C may be subsequently performed to provide the alternative configuration of the illustrated fifth exemplary structure. In this configuration, the planar metal oxide liner 17 may comprise a region that laterally extends outside a periphery of the active layer in a plan view (i.e., a view along a direction that is perpendicular to the top surface of the substrate 8). Generally, the planar metal oxide liner 17 comprises a horizontal surface (such as a top surface) that contacts an entirety of a horizontal surface (such as a bottom surface) of the gate dielectric 10. In one embodiment, the gate electrode 15 is embedded in a dielectric material portion (such as the insulating layer 42), and the planar metal oxide liner 17 contacts surfaces of the dielectric material portion (such as the top surface of the insulating layer 42). The gate dielectric 10 may be vertically spaced from the dielectric material portion (such as the insulating layer 42) by the planar metal oxide liner 17.

Referring to FIGS. 36A-36C, a sixth exemplary structure according to a sixth embodiment of the present disclosure may be derived from the third exemplary structure illustrated in FIGS. 16A-16C by omitting formation of the continuous metal oxide liner 13L at the processing steps of FIGS. 15A-15C. Consequently, the conformal metal oxide liner 13 illustrated in FIGS. 16A-16C is not formed in the sixth exemplary structure illustrated in FIGS. 36A-36C. The gate electrode 15 may be formed directly on a top surface of a word line 12 and directly on sidewalls of the insulating layer 42.

Referring to FIGS. 37A-37C, the processing steps of FIGS. 17A-17C may be performed to sequentially deposit a planar metal oxide liner 17, a gate dielectric layer 10L, and a continuous active layer 20L.

Referring to FIGS. 38A-38C, the processing steps of FIGS. 18A-18C may be performed to form a stack of a planar metal oxide liner 17, a gate dielectric 10, and an active layer 20 within each unit device area. The planar metal oxide liner 17 may, or may not, be patterned with the same pattern as the active layer 20. Alternatively, the planar metal oxide liner 17 may be patterned prior to deposition of the gate dielectric layer 10L into a pattern that covers the entire area of the gate electrode 15.

Referring to FIGS. 39A-39C, the processing steps of FIGS. 19A-19C may be performed to form a dielectric layer 48, and the processing steps of FIGS. 20A-20C may be performed to form a source cavity 51 and a drain cavity 59.

Referring to FIGS. 40A-40C, the processing steps of FIGS. 21A-21C may be performed to form a source electrode 52 and a drain electrode 56 within each unit device area.

Referring to FIGS. 41A-41C, the processing steps of FIGS. 22A-22C may be performed to form an upper dielectric material layer 70 and upper-level metal interconnect structures (72, 76).

Figure 42:
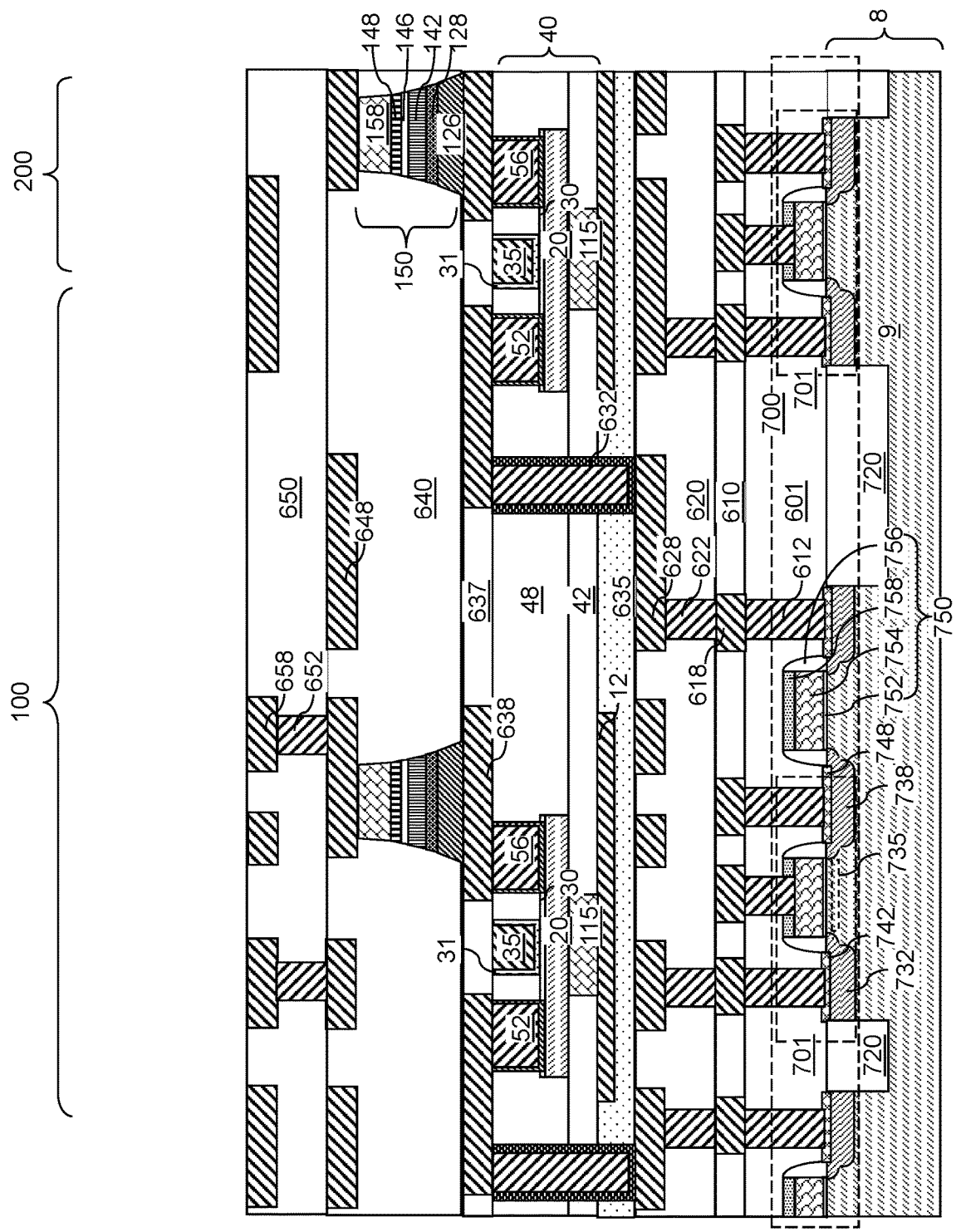

Referring to FIG. 42, an exemplary structure is illustrated, which may be derived from any of the previously described exemplary structures by subsequently forming additional structures thereupon. For example, second metal via structures 632 may be formed through the TFT-level dielectric layer 40 and the insulating spacer layer 635 on a respective one of the second metal line structures 628 concurrent with, before, or after, formation of the source electrodes 52 and the drain electrodes 56.

A dielectric layer, which is herein referred to as a third line-level dielectric layer 637, may be deposited over the TFT-level dielectric layer 40. Third metal line structures 638 may be formed in the third line-level dielectric layer 637 on a respective one of the metallic structures (52, 56, 35, 15) embedded within the TFT-level dielectric layer 40.

Additional metal interconnect structures embedded in additional dielectric layers may be subsequently formed over the thin film transistors and the third line-level dielectric layer 637. In an illustrative example, the dielectric layers may include, for example, a fourth interconnect-level dielectric layer 640, a fifth interconnect-level dielectric layer 650, etc. The additional metal interconnect structures may include third metal via structures (not illustrated) and fourth metal lines 648 embedded in the fourth interconnect-level dielectric layer 640, fourth metal via structures 652 and fifth metal line structures 658 embedded in the fifth interconnect-level dielectric layer 650, etc.

Optionally, memory cells 150 may be formed below, above, or at the same level as, the thin film transistors. In embodiments in which the transistors are formed as a two-dimensional periodic array, the memory cells 150 may be formed as a two-dimensional periodic array of memory cells 150. Each memory cell 150 may include a magnetic tunnel junction, a ferroelectric tunnel junction, a phase change memory material, or a vacancy-modulated conductive oxide material portion. Further, each memory cell 150 may include a first electrode 126 including a metallic material, and a second electrode 158 including a metallic material and protecting an underlying data-storing portion of the memory cell 150. A memory element is provided between the first electrode 126 (i.e., the bottom electrode) and the second electrode 158 (i.e., the top electrode).

In an illustrative example, in embodiments in which the memory cell 150 includes a magnetic tunnel junction, the memory cell 150 may include a layer stack including, from bottom to top, a first electrode 126, a metallic seed layer 128 that facilitates crystalline growth of overlying material layers, a synthetic antiferromagnet (SAF) structure 142, a tunneling barrier layer 146, a free magnetization layer 148, and a second electrode 158. While the present disclosure is described using an embodiment in which the thin film transistors are used as access transistors for memory cells 150, embodiments are expressly contemplated herein in which the thin film transistors are used as logic devices, as components of a peripheral circuit for a memory array, or for any other semiconductor circuitry.

In one embodiment, the substrate 8 may include a single crystalline silicon substrate. Lower-level dielectric layers (601, 610, 620) embedding lower-level metal interconnect structures (612, 618, 622, 628) may be located between the single crystalline silicon substrate and the insulating layer 42. Field effect transistors 701 including a respective portion of the single crystalline silicon substrate as a channel may be embedded within the lower-level dielectric layers (601, 610, 620), and may be electrically connected to at least one of the gate electrodes (15, 35), the source electrodes 52, and the drain electrodes 56.

While an embodiment is described in which the thin film transistors of the present disclosure are used as access transistors for memory cells 150, embodiments are expressly contemplated herein in which the thin film transistors of the present disclosure are used as logic devices in a logic circuit.

Generally, various embodiments of the present disclosure may be used to form, in a forward spatial order or in a reverse spatial order, i.e., bottom up or top down or from one side to another, a gate electrode (15 or 35), a metal oxide liner (17 or 31), a gate dielectric (10 or 30), and an active layer 20 over a substrate 8. The metal oxide liner (17 or 31) comprises a material selected from indium gallium zinc oxide (IGZO), indium tungsten oxide, indium zinc oxide, indium tin oxide, gallium oxide, indium oxide, doped zinc oxide, doped indium oxide, and doped cadmium oxide, and has the properties described above.

Figure 43:
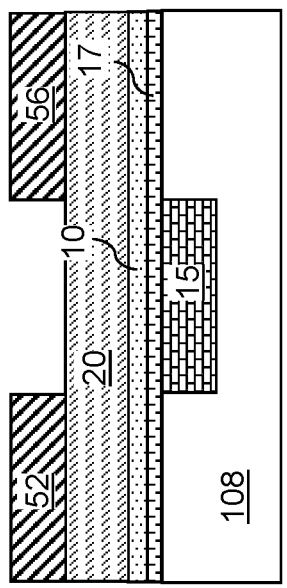

FIG. 43 is a vertical cross-sectional view of a seventh exemplary structure according to a seventh embodiment of the present disclosure. In the seventh exemplary structure, the gate electrode 15 may be located within an insulating layer 108, which may be located within a substrate 8, or over a substrate 8. The source electrode 52 and the drain electrode 56 may be formed by deposition and patterning of at least one metallic material over the active layer 20.

Figure 44:
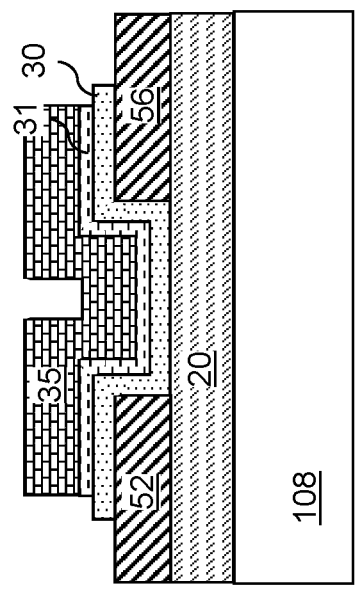

FIG. 44 is a vertical cross-sectional view of an eighth exemplary structure according to an eighth embodiment of the present disclosure. In the eighth exemplary structure, the gate dielectric 30, the conformal metal oxide liner 31, and the gate electrode 35 may be formed by depositing a layer stack including a gate dielectric layer (such as a gate dielectric layer 30L described above), a continuous metal oxide liner (such as the continuous metal oxide liner 31L described above), and at least one metallic gate electrode material, and by patterning the layer stack.

Figure 45:
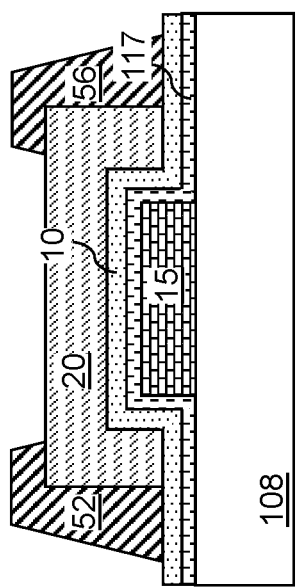

FIG. 45 is a vertical cross-sectional view of a ninth exemplary structure according to a ninth embodiment of the present disclosure. In the ninth exemplary structure, a conformal metal oxide liner 117 having a same material composition and a same thickness range as the planar metal oxide liner 17 described above may be formed over a gate electrode 15. A gate dielectric 10 may be formed above the conformal metal oxide liner 117, and an active layer 20 may be formed by conformally depositing and patterning a compound semiconductor material (such as a semiconducting metal oxide material). A source electrode 52 and a drain electrode 56 may be formed by depositing and patterning at least one metallic material on end portions of the active layer 20.

Figure 46:
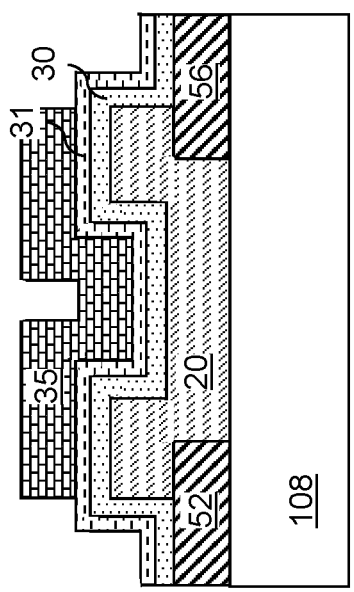

FIG. 46 is a vertical cross-sectional view of a tenth exemplary structure according to a tenth embodiment of the present disclosure. In the tenth exemplary structure, a source electrode 52 and a drain electrode 56 are formed on a top surface of an insulating layer 108, which may be located within a substrate 8, or over a substrate 8. An active layer 20 may be formed over, and across, the source electrode 52 and the drain electrode 56, and a gate dielectric 30, a conformal metal oxide liner 31, and a gate electrode 35 may be subsequently formed.

Figure 47:
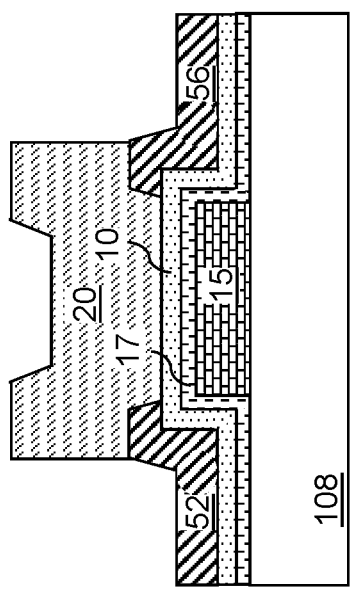

FIG. 47 is a vertical cross-sectional view of an eleventh exemplary structure according to an eleventh embodiment of the present disclosure. The eleventh exemplary structure may be derived from the ninth exemplary structure by reversing the order of formation between the active layer 20 and the combination of the source electrode 52 and the drain electrode 56.

Figure 48:
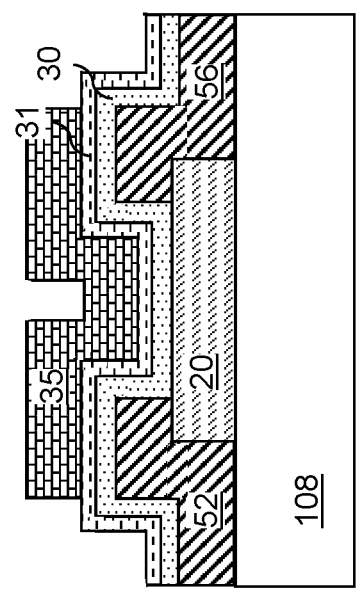

FIG. 48 is a vertical cross-sectional view of a twelfth exemplary structure according to a twelfth embodiment of the present disclosure. The twelfth exemplary structure may be derived from the ninth exemplary structure by reversing the order of formation between the active layer 20 and the combination of the source electrode 52 and the drain electrode 56.

Figure 49:
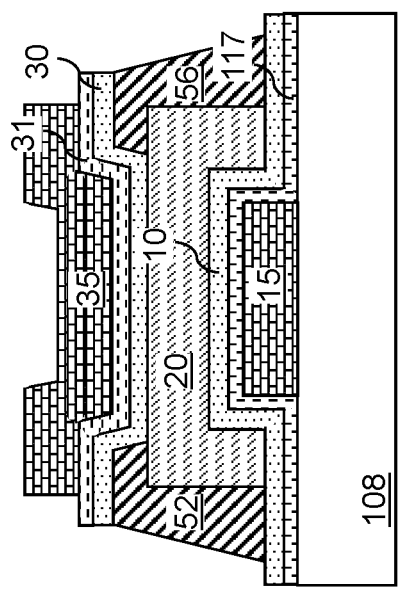

FIG. 49 is a vertical cross-sectional view of a thirteenth exemplary structure according to a thirteenth embodiment of the present disclosure. The thirteenth exemplary structure may be derived from the ninth exemplary structure by forming a gate dielectric 30 (which is also referred to as a top gate dielectric), a conformal metal oxide liner 31 (which is also referred to as a top conformal metal oxide liner), and a gate electrode 35 (which is also referred to as a top gate electrode). The gate electrode 15 is referred to as a bottom gate electrode, the conformal metal oxide liner 117 is referred to as a bottom conformal metal oxide liner. The gate dielectric 10 is referred to as a bottom gate dielectric. The thirteenth exemplary structure comprises a thin film transistor in a dual gate configuration.

Figure 50:
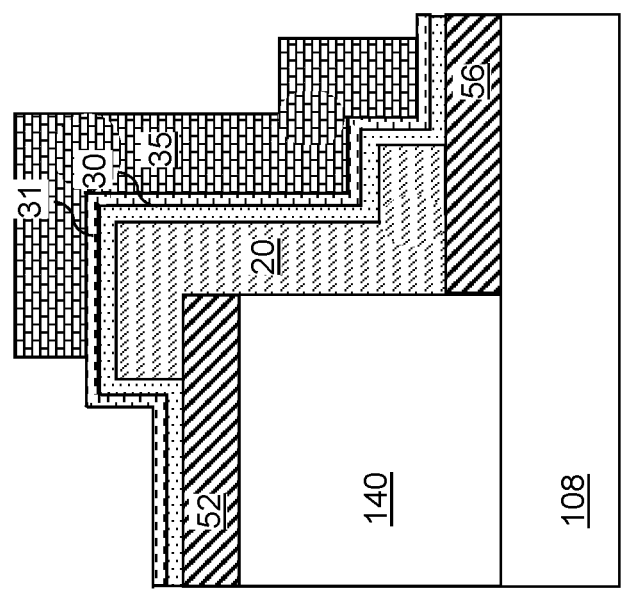

FIG. 50 is a vertical cross-sectional view of a fourteenth exemplary structure according to a fourteenth embodiment of the present disclosure. The fourteenth exemplary structure may be formed by forming an insulating layer 108, which may be located within a substrate 8, or over a substrate 8. A dielectric layer 140 may be deposited and patterned such that a sidewall of the dielectric layer 140 overlies the insulating layer 108. At least one metallic material may be anisotropically deposited and patterned to form a source electrode 52 and a drain electrode 56. One of the source electrode 52 and the drain electrode 56 is formed on a horizontal top surface of the dielectric layer 140, and another of the source electrode 52 and the drain electrode 56 is formed on a horizontal top surface of the insulating layer 108. A vertical sidewall of the dielectric layer 140 extends between the source electrode 52 and the drain electrode 56. An active layer 20 may be formed on the vertical sidewall of the dielectric layer 140 between the source electrode 52 and the drain electrode 56. A gate dielectric 30, a conformal metal oxide liner 31, and a gate electrode 35 are sequentially formed over vertically-extending portions of the active layer 20.

Referring to FIG. 51, a first flowchart illustrates first exemplary processing steps for manufacturing the semiconductor device of the present disclosure. Referring to step 5110 and FIGS. 1-6C, 44, 46, and 48-50, an active layer 20 may be formed over a substrate (8 or 108). Referring to step 5120 and FIGS. 7A-9C, 44, 46, and 48-50, a source electrode 52 and a drain electrode 56 may be formed on end portions of the active layer 20. Referring to step 5130 and FIGS. 10A-14C, 44, 46, and 48-50, a metal oxide liner (31 and/or 71) and a gate electrode 35 may be formed over the active layer 20.

Referring to FIG. 52, a second flowchart illustrates second exemplary processing steps for manufacturing the semiconductor device of the present disclosure. Referring to step 5210 and FIGS. 1, 15A-17C, 23A-23C, 25A-25C, 27A-30C, 34A-34C, 36A-38C, 43, 45, 47, and 49, a gate electrode 15 and a metal oxide liner (13, 13', 17, and/or 117) may be formed over a substrate (8 or 108). Referring to step 5220 and FIGS. 17A-17C, 24A-24C, 25A-25C, 30A-30C, 34A-34C, 38A-38C, 43, 45, 47, and 49, a gate dielectric 10 and an active layer 20 may be formed. Referring to step 5230 and FIGS. 18A-22C, 24A-24C, 26A-26C, 31A-33C, 35A-35C, 39A-41C, 43, 45, 47, and 49, a source electrode 52 and a drain electrode 56 may be formed on end portions of the active layer 20.

Referring to FIG. 53, a third flowchart illustrates general processing steps for manufacturing the semiconductor device of the present disclosure. Referring to step 5310 and FIGS. 1-6C, 15A-17C, 23A-25C, 27A-30C, 34A-34C, 36A-38C, and 43-50, a gate electrode (15 or 35), a metal oxide liner (13, 13', 17, 117, 31, and/or 71), a gate dielectric (10 and/or 30), and an active layer 20 may be formed over a substrate (8 or 108) in a forward order or in a reverse order, such as bottom up, top down, from one side to another, or generally from one spatial region to another spatial region in order. The metal oxide liner (13, 13', 17, 117, 31, and/or 71) comprises a material selected from indium gallium zinc oxide (IGZO), indium tungsten oxide, indium zinc oxide, indium tin oxide, gallium oxide, indium oxide, doped zinc oxide, doped indium oxide, and doped cadmium oxide. Referring to step 5320 and FIGS. 10A-14C, 18A-22C, 24A-24C, 26A-26C, 31A-33C, 35A-35C, 39A-41C, and 43-50, a source electrode 52 and a drain electrode 56 may be formed on end portions of the active layer 20.

Referring to all drawings and according to various embodiments of the present disclosure, a transistor, for example a thin film transistor, is provided, which may include: a gate electrode (15 or 35) located over a substrate (8 or 108); a planar metal oxide liner (17 or 71) contacting a surface of the gate electrode (15 or 35); a gate dielectric (10 or 30) contacting a surface of the planar metal oxide liner (17 or 71); an active layer 20 contacting the gate dielectric (10 or 30); and a source electrode 52 and a drain electrode 56 located on end portions of the active layer 20.

In one embodiment, the planar metal oxide liner (17 or 71) includes a material selected from indium gallium zinc oxide (IGZO), indium tungsten oxide, indium zinc oxide, indium tin oxide, gallium oxide, indium oxide, doped zinc oxide, doped indium oxide, and doped cadmium oxide. In one embodiment, the planar metal oxide liner (17 or 71) has a thickness in a range from 0.1 nm to 3 nm; and the active layer 20 has a thickness that is at least three times the thickness of the planar metal oxide liner (17 or 71).

In one embodiment, the planar metal oxide liner (17 or 71) includes a horizontal surface that contacts an entirety of a horizontal surface of the gate dielectric (10 or 30). In one embodiment, the planar metal oxide liner (17 or 71) includes a region that laterally extends outside a periphery of the active layer 20 in a plan view (such as a top down view along a direction perpendicular to a top surface of the substrate (8 or 108)).

In one embodiment, the planar metal oxide liner (17 or 71) includes sidewalls that are vertically coincident with sidewalls of the active layer 20. In one embodiment, the gate electrode (15 or 25) is embedded in a dielectric material portion (such as the insulating layer 42 or the dielectric layer 48), and the planar metal oxide liner (17 or 71) contacts a first surface of the dielectric material portion. In one embodiment, the gate dielectric 30 may contact a second surface of the dielectric material portion (including the dielectric layer 48).

In one embodiment, the transistor may include a conformal metal oxide liner (13 or 31) laterally surrounding, and contacting a bottom surface of, the gate electrode (15 or 35). A top surface of vertically-extending portions of the conformal metal oxide liner (13 or 31) contacts a bottom surface of the planar metal oxide liner (17 or 71).

In one embodiment, the transistor may include a tubular metal oxide liner 13' laterally surrounding the gate electrode 15. An inner periphery of a bottom surface of the tubular metal oxide liner 13' coincides with a periphery of a bottom surface of the gate electrode 15, and a top surface of the tubular metal oxide liner 13' contacts a bottom surface of the planar metal oxide liner 17.

In one embodiment, the transistor may include a word line 12 underlying, and electrically connected to, the gate electrode 15 and having a lateral extent along a lengthwise direction that is greater than a lateral extent of the active layer 20 along a lengthwise direction (such as a channel direction, e.g., the first horizontal direction hd1) of the active layer 20 in a plan view.

According to another aspect of the present disclosure and various embodiments of the present disclosure, a transistor, for example a thin film transistor, is provided, which may include: an active layer 20 located over a substrate (8 or 108); a gate dielectric (10 or 30) contacting a surface of the active layer 20; a source electrode 52 and a drain electrode 56 located on end portions of the active layer 20; a conformal metal oxide liner (13, 117, 31) contacting the gate dielectric (10 or 30); and a gate electrode (15 or 35) embedded in the conformal metal oxide liner (13, 117, 31). The source electrode 52 and the drain electrode 56 may be embedded in a dielectric layer 48. The conformal metal oxide liner (13, 117, 31) may be embedded in a dielectric material portion, which may be a portion of the dielectric layer 48 or a portion of an insulating layer 42 that underlies the dielectric layer 48.

In one embodiment, the conformal metal oxide liner 31 may include: a planar portion contacting a bottom surface of the gate electrode (15 or 35); and a tubular portion adjoined to a periphery of the planar portion and contacting sidewalls of the gate electrode (15 or 35).

In one embodiment, the transistor may include a planar metal oxide liner (17 or 71) extending parallel to an interface between the active layer 20 and the gate dielectric (10 or 30) and contacting a planar surface of the gate electrode (15 or 35) that is not in contact with the conformal metal oxide liner (13, 117, 31).

In one embodiment, the conformal metal oxide liner (13, 117, 31) may include a material selected from indium gallium zinc oxide (IGZO), indium tungsten oxide, indium zinc oxide, indium tin oxide, gallium oxide, indium oxide, doped zinc oxide, doped indium oxide, and doped cadmium oxide.

In one embodiment, the transistor may include: a dielectric layer 48 laterally surrounding the active layer 20, the source electrode 52, and the drain electrode 56; a source contact via structure 72 contacting the source electrode 52; and a drain contact via structure 76 contacting the drain electrode 56.

According to an aspect of the present disclosure, the metal oxide liners of the present disclosure may be used in various types of back-end-of-line thin film transistors such as planar bottom gate thin film transistors, planar top gate thin film transistors, fin thin film transistors, and nanosheet thin film transistors. The semiconducting metal oxide material of the metal oxide liners may be the same as, or may be different from the semiconducting metal oxide material of the active layer. The metal oxide liners of the present disclosure absorb hydrogen atoms (which may be generated from the deposition process used to deposit the metallic material of the gate electrodes), and impede diffusion of hydrogen atoms to adjacent layers such as the active layer.

Generally, the metal oxide liners of the present disclosure function as diffusion barriers, and may have a spacer shape, a frame shape, a flat shape, a U-shape, or various other shapes that may be formed by combinations of deposition and patterning of underlying materials and the material of the metal oxide liners. The metal oxide liners may be formed on, or around, a metallic gate material of a gate electrode, and may, or may not, encapsulate the gate electrode. The metal oxide liners may contact a gate dielectric, which may include a high-k dielectric metal oxide material. The metal oxide liners of the present disclosure may allow control of diffusion of gaseous species (including hydrogen) from a metallic gate electrode into a channel of an active layer, and provide enhanced channel control. Further, performance of a thin film transistor may be enhanced by higher work function provided by the metal oxide liners of the present disclosure. The metal oxide liners may be ultrathin, and may have a thickness in a range from 0.1 nm to 3 nm. The processes used to form the metal oxide liners of the present disclosure are compatible with back-end-of-line processing steps, and may be used to form a two-dimensional array of thin film transistors or a three-dimensional array of thin film transistors.

In an illustrative example, indium oxide ($In_2O_3$) used as a metal oxide liner may provide a high work function of about 5.0 eV when used within an insulating material portion using silicon oxide. When indium zinc oxide is used as a metal oxide liner in combination of a gate electrode composed of molybdenum, a work function of about 5.23 eV may be achieved. Thus, the metal oxide liners of the present disclosure may be used to provide a stabilized high work function for thin film transistors by trapping hydrogen, and by blocking diffusion of hydrogen.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a transistor, comprising:
   forming a gave cavity in an upper portion of an insulating layer that overlies a substrate;
   depositing and patterning a continuous semiconducting metal oxide layer such that portions of the continuous semiconducting metal oxide layer are removed entirely from above a horizontal plane including a top surface of the insulating layer and remaining portions of the continuous semiconducting metal oxide layer are located entirely within a fraction of a volume of the gate cavity;
   forming, in a forward order or in a reverse order, a gate electrode, a hydrogen-containing conductive metal oxide liner, a gate dielectric, and an active layer over a substrate, wherein the hydrogen-containing conductive metal oxide liner comprises a material selected from indium gallium zinc oxide (IGZO), indium tungsten oxide, indium zinc oxide, indium tin oxide, gallium oxide, indium oxide, doped zinc oxide, doped indium oxide, and doped cadmium oxide, wherein the gate electrode is formed within a fraction of the volume of the gate cavity and a top surface of the gate electrode is formed within the horizontal plane including the top surface of the insulating layer; and
   forming a source electrode and a drain electrode prior to, or after, formation of the active layer such that the source electrode and the drain electrode contact end portions of the active layer.

2. The method of claim 1, wherein
   the hydrogen-containing conductive metal oxide liner is formed on a top surface of the gate electrode and on a top surface of the insulating layer.

3. The method of claim 1,
   wherein the continuous semiconducting metal oxide layer is deposited as a conformal hydrogen-containing conductive metal oxide liner.

4. The method of claim 3, further comprising:
   forming a tubular hydrogen-containing conductive metal oxide liner on sidewalls of the gate cavity by anisotropically etching the continuous semiconducting metal oxide layer.

5. The method of claim 4, wherein the hydrogen-containing conductive metal oxide liner comprises a planar hydrogen-containing conductive metal oxide liner that is formed directly on a top surface of the tubular hydrogen-containing conductive metal oxide liner.

6. The method of claim 4, wherein:
   the gate electrode is formed on the tubular conformal hydrogen-containing conductive metal oxide liner in the gate cavity; and the hydrogen-containing conductive metal oxide liner comprises a planar hydrogen-containing conductive metal oxide liner that is formed directly on a top surface of the tubular hydrogen-containing conductive metal oxide liner.

7. The method of claim 1, wherein:
the insulating layer is deposited over the active layer prior to formation of the gate electrode; and
the gate cavity is formed by recessing a portion of the insulating layer that overlie a middle portion of the active layer.

8. The method of claim 7, wherein
the remaining portions of the continuous semiconducting metal oxide layer comprise a conformal metal oxide liner that contacts an entirety of sidewalls of the gate cavity and an entirety of a bottom surface of the gate cavity.

9. A method of forming a transistor, the method comprising:
forming a gave cavity in an upper portion of an insulating layer that overlies a substrate;
depositing and patterning a continuous semiconducting metal oxide layer such that portions of the continuous semiconducting metal oxide layer are removed entirely from above a horizontal plane including a top surface of the insulating layer and remaining portions of the continuous semiconducting metal oxide layer are located entirely within a fraction of a volume of the gate cavity;
forming, in a forward order or in a reverse order, a gate electrode, a hydrogen-containing conductive metal oxide liner, a gate dielectric, and an active layer over a substrate, wherein the gate dielectric is spaced from the gate electrode by the hydrogen-containing conductive metal oxide liner, wherein the gate electrode is formed within a fraction of the volume of the gate cavity and a top surface of the gate electrode is formed within the horizontal plane including the top surface of the insulating layer; and
forming a source electrode and a drain electrode prior to, or after, formation of the active layer such that the source electrode and the drain electrode contact end portions of the active layer.

10. The method of claim 9, wherein the continuous semiconducting metal oxide layer is formed as a hydrogen-containing conductive metal oxide liner by a conformal deposition process.

11. The method of claim 10, wherein the hydrogen-containing conductive metal oxide liner is formed directly on a top surface of the insulating layer and directly on a top surface of the gate electrode.

12. The method of claim 10, further comprising:
forming a gate dielectric layer and a continuous active layer over the hydrogen-containing conductive metal oxide liner; and
patterning the continuous active layer and the gate dielectric layer into the active layer and the gate dielectric by performing an anisotropic etch process without etching through the hydrogen-containing conductive metal oxide layer, wherein the hydrogen-containing conductive metal oxide layer has a greater lateral extent than the active layer.

13. The method of claim 10, wherein the hydrogen-containing conductive metal oxide liner is formed with sidewalls that are vertically coincident with sidewalls of the active layer and the gate dielectric.

14. The method of claim 10,
wherein the gate electrode is formed in the gate cavity after formation of the conformal metal oxide liner.

15. The method of claim 14, wherein patterning the continuous semiconducting metal oxide layer comprises anisotropically etching a horizontally- extending portion of the conformal metal oxide liner, wherein a remaining portion of the conformal metal oxide liner comprise a tubular metal oxide liner.

16. The method of claim 9, wherein:
the insulating layer is deposited over the active layer prior to formation of the gate electrode; and
the gate cavity is formed by recessing a portion of the insulating layer that overlie a middle portion of the active layer.

17. A method of forming a transistor, the method comprising:
forming, in a forward order or in a reverse order, a gate electrode, a hydrogen-containing conductive metal oxide liner, a gate dielectric, and an active layer over a substrate, wherein the gate electrode is formed within a fraction of the volume of a gate cavity located in an insulating layer, and wherein a conformal metal oxide liner is formed at a periphery of the gate cavity prior to formation of the gate electrode, and wherein the hydrogen-containing metal oxide liner comprises a ternary compound that is selected from indium gallium zinc oxide (IGZO), indium tungsten oxide, indium zinc oxide, indium tin oxide; and
forming a source electrode and a drain electrode prior to, or after, formation of the active layer such that the source electrode and the drain electrode contact end portions of the active layer.

18. The method of claim 17, wherein the hydrogen-containing conductive metal oxide liner is formed as a planar metal oxide liner over the insulating layer and the gate electrode.

19. The method of claim 18, further comprising
depositing and patterning a conformal metal oxide liner such that portions of the continuous semiconducting metal oxide layer are removed entirely from above a horizontal plane including a top surface of the insulating layer and remaining portions of the continuous semiconducting metal oxide layer are located entirely within another fraction of the volume of the gate cavity, wherein the gate electrode is formed after deposition and patterning of the conformal metal oxide liner, and a top surface of the gate electrode is formed within the horizontal plane including the top surface of the insulating layer.

20. The method of claim 17, wherein the source electrode and the drain electrode are formed directly on top surface segments the active layer.

* * * * *